US012757786B2

(12) United States Patent
Liu et al.

(10) Patent No.: US 12,757,786 B2
(45) Date of Patent: Oct. 6, 2026

(54) LED LIGHTING STRIP

(71) Applicant: GUANGDONG OPSCO TECHNOLOGY CO., LTD, Dongguan (CN)

(72) Inventors: Mingjian Liu, Dongguan (CN); Gengsheng Zhu, Dongguan (CN); Zhenlei Wu, Dongguan (CN); Kai Zhou, Dongguan (CN)

(73) Assignee: GUANGDONG OPSCO TECHNOLOGY CO., LTD, Dongguan (CN)

( * ) Notice: Subject to any disclaimer, the term of this patent is extended or adjusted under 35 U.S.C. 154(b) by 777 days.

(21) Appl. No.: 18/119,782

(22) Filed: Mar. 9, 2023

(65) Prior Publication Data

US 2023/0420421 A1 Dec. 28, 2023

Related U.S. Application Data

(63) Continuation of application No. PCT/CN2022/100852, filed on Jun. 23, 2022.

(51) Int. Cl.
*H10W 90/00* (2026.01)
*H05B 45/20* (2020.01)
(Continued)

(52) U.S. Cl.
CPC ............ *H10W 90/00* (2026.01); *H05B 45/20* (2020.01); *H10H 20/01* (2025.01); *H10H 20/813* (2025.01); *H10H 20/857* (2025.01)

(58) Field of Classification Search
CPC ....... H10W 90/00; H05B 45/20; H10H 20/01; H10H 20/813; H10H 20/857; H10H 20/8506
See application file for complete search history.

(56) References Cited

U.S. PATENT DOCUMENTS

2018/0320839 A1* 11/2018 Briscoe ................. F21V 31/005
2019/0331311 A1* 10/2019 Crompvoets ........... F21S 43/15
2021/0071850 A1 3/2021 Shan

FOREIGN PATENT DOCUMENTS

CN 103591492 A 2/2014
CN 112902042 A 6/2021
CN 114458976 A 5/2022

OTHER PUBLICATIONS

International Search Report of PCT Patent Application No. PCT/CN2022/100852 issued on Jan. 3, 2023.

* cited by examiner

*Primary Examiner* — Ratisha Mehta
(74) *Attorney, Agent, or Firm* — Andrew C. Cheng

(57) ABSTRACT

A light-emitting diode (LED) lighting strip includes conductive lines and LED modules. The LED module includes LED lighting beads electrically connected with the conductive lines and arranged orderly on the conductive lines to form a strip. One of the conductive lines is a communication conductive line, and the remaining three are power-supplying conductive lines. On the communication conductive line, the LED lighting beads are connected in series. On the power-supplying conductive lines, the LED modules are connected in parallel, and the LED lighting beads of each LED module are connected in series. The LED lighting strip adopts an arrangement of serial-parallel connection for power and serial connection for signal to achieve various application solutions for different power supply voltages, and as a consequence, a serial communication protocol is adopted to control each of the LED lighting beads of the LED lighting strip, in order to realize diversification of lighting effect.

54 Claims, 24 Drawing Sheets

14

(51) Int. Cl.

| | |
|---|---|
| ***H10H 20/01*** | (2025.01) |
| ***H10H 20/813*** | (2025.01) |
| ***H10H 20/857*** | (2025.01) |

LED LIGHTING STRIP

FIELD OF THE INVENTION

The present invention relates to the field of light-emitting diode (LED) technology, and more particularly to an LED lighting strip.

DESCRIPTION OF THE RELATED ART

Light-emitting diodes (LEDs) have advantages of saving energy, saving power, high efficiency, quick response time, long life cycle, being free of mercury, and environmental friendliness and have been widely used in the industry of lighting, such as, specifically, being manufactured into an LED lighting strip for atmospheric decoration. The LED lighting strip is also referred to as an LED light string. The LED lighting strips that are currently available in the market generally use through-hole LEDs or surface-mounted LEDs to provide single-color or multiple-color LED lighting strips by means of serial connection, yet it is not possible to individually control a single one of the LEDs, and the effect of lighting is monotonous. Of course, power carrier solutions have been adopted, yet they are limited by data loss resulting from fluctuation of electrical voltage supplied thereto and stages of cascade connection, making the LED lighting strips not feasible for down cascade connection at multiple stages for a long distance, and consequently, the length of the LED lighting strip is limited. Thus, there is a need for a novel LED lighting strip to overcome the above problem.

SUMMARY OF THE INVENTION

The application aims to provide an LED lighting strip that is easy to manufacture and easy to install, and features easy power source matching, easy control and easy matching with a color tone of a surrounding scenario, so as to improve a user's experience of use to use it as an atmospheric light for lighting decoration to improve the effect of atmosphere of holidays.

An embodiment of the application provides an LED lighting strip, and the LED lighting strip comprises:

at least four conductive lines;

plural LED modules, the LED modules comprising at least two LED lighting beads, the at least two LED lighting beads being electrically connected with the four conductive lines, the plural LED beads being orderly arranged on the four conductive lines to form a strip;

wherein one conductive line of the four conductive lines is a communication conductive line, and remaining three conducive lines are power-supplying conductive lines; on the communication conductive line, the LED lighting beads on the strip are all connected in series; on the power-supplying conductive lines, multiple of the LED modules are connected in parallel to each other, and the at least two LED lighting beads of each of the LED modules are connected in series.

The LED lighting strip provided in the embodiment of the application comprises at least four conductive lines and plural LED modules. Each of the LED modules comprises at least two LED lighting beads. The at least two LED lighting beads are electrically connected to the four conductive lines. One conductive line of the four conductive lines is a communication conductive line, and the remaining three conductive lines are power-supplying conductive lines. The plural LED lighting beads of each of the LED modules are arranged, in sequence, on the four conductive lines to form a strip. Namely, when viewed from an outside appearance, all the LED lighting beads are soldered on the four conductive lines, yet on the power-supplying conductive lines, the plural LED modules are connected to each other in parallel, and the at least two LED lighting beads of each of the LED modules are connected in series, while in the communication conductive line, the LED lighting beads of the strip are all connected in series. The LED lighting strip adopts an arrangement of serial-parallel connection for power and serial connection for signal in order to achieve various application solutions for different power supply voltages, and as a consequence thereof, a serial communication protocol is adopted to control each of the LED lighting beads on the LED lighting strip, and thus, diversified and arbitrary regulation of the lighting effect can be realized and it is possible to eliminate constraints in respect of cascade connection stages and distance. The LED lighting strip can effectively resolve the drawbacks and shortcomings of the existing LED lighting strips, namely it is possible to realize long distance cascade connection, diversification of the lighting effect, easy control, and arbitrary regulation of voltage of supplied power as desired. Further, the LED lighting strip may adopt the same manufacturing technology of the existing line lights, so that the manufacturing is easy and the manufacturing efficiency of the LED lighting strip can be enhanced.

It is appreciated that general description provided above, and a detailed description provided below are only illustrative and explanatory and are not limiting the application.

BRIEF DESCRIPTION OF THE DRAWINGS

To more clearly expound the technical solution of embodiments of the application, a brief description will be provided below for the drawings that are necessary for illustrating the embodiments. Obviously, the drawings described below are provided for some of the embodiments of the application, and based on such drawings, those having ordinary skill in the art may envisage other drawings without creative endeavor.

LIST OF MAIN COMPONENTS AND REFERENCE SIGNS

Figure 1:
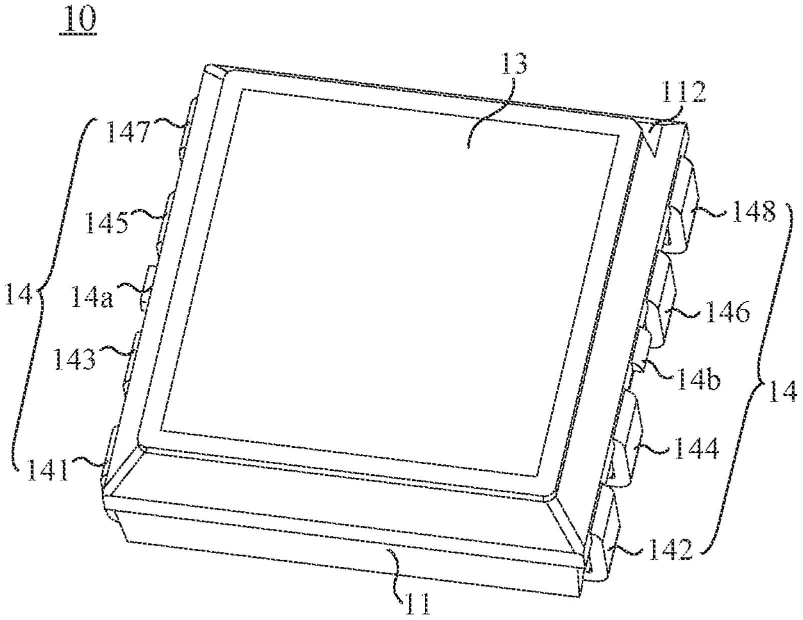
FIG. 1 is a schematic perspective view showing a structure of a light-emitting diode (LED) lighting bead provided in embodiments of the application.

100: LED lighting strip; 10: LED lighting bead; 101: bonding line; 11: insulation housing; 110: filler resin; 111: recessed compartment; 112: marking piece; 12: light-emitting assembly; 121: driving chip; 122: die;

1221: green light chip; 1222: red light chip; 1223: blue light chip; 13: encapsulation resin; 14: lead; 1401: connecting portion; 1402: chip-fixing portion; 14021: die disposition portion; 14022: bonding line connection point disposition portion; 1403: chip mounting trough; 1404: conductive electrode; 141: first lead; 1411: first connecting portion; 1412: first chip-fixing portion; 142: second lead; 1421: second connecting portion; 1422: second chip-fixing portion; 14221: first arrangement portion; 14222: second arrangement portion; 143: third lead; 1431: third connecting portion; 1432: third chip-fixing portion; 144: fourth lead; 1441: fourth connecting portion; 1442: fourth chip-fixing portion; 145: fifth lead; 1451: fifth connecting portion; 1452: fifth chip-fixing portion; 14521: third arrangement portion; 14522: fourth arrangement portion; 146: sixth lead; 1461: sixth connecting portion; 1462: sixth chip-fixing portion; 14621: first disposition portion; 14622: second disposition portion; 147: seventh lead; 1471: seventh connecting portion; 1472: seventh chip-fixing portion; 148: eighth lead; 1481: eighth connecting portion; 1482: eighth chip-fixing portion; 14821: third disposition portion; 14822: fourth disposition portion; **14*a*: first transition lead; 14*a*1: chip-fixing portion of first transition lead; 14*a*11: fixing terminal part; 14*a*12: connecting terminal part; 14*b*: second transition lead; 15**: isolation board;

20: conductive line; 201: conductive line core; 202: insulation layer; 21: first conductive line; 22: second conductive line; 23: third conductive line; 24: fourth conductive line; 30: power controller.

DETAILED DESCRIPTION OF EMBODIMENTS

A clear and complete description of the technical solution provided in embodiments of the application is provided below with reference to the drawings of the embodiments of the application. Of course, the described embodiments are just some of the embodiments of the application, and are not all the embodiments thereof. Based on the embodiments of the application, those having ordinary skill in the art may, without paying creative endeavor, contemplate all the remaining embodiments, which all belong to the scope of protection of the application.

It is appreciated that the terminology used in the specification of the application is for the purposes of illustrating of specific embodiments, and is not intended to limit the application. As used in the specification and claims of the application, unless being clearly indicating other situations in the context, otherwise the singular form, "a", "one", and "the" means including plural forms.

It is further appreciated that the term "and/or", as sued in the specification and claims of the application, means a single one or any combination and all possible combinations of multiple ones of related items in a list, and including such combinations.

Light-emitting diodes (LEDs) have advantages of saving energy, saving power, high efficiency, quick response time, long life cycle, and environmental friendliness and have been widely used in the industry of lighting, such as, specifically, being manufactured into an LED lighting strip for atmospheric decoration. The LED lighting strip is also referred to as an LED light string or line light. The LED lighting strips that are currently available in the market generally use through-hole LEDs or surface-mounted LEDs to provide single-color or multiple-color LED lighting strips by means of serial connection, yet it is not possible to individually control a single one of the LEDs, and the effect of lighting is monotonous.

Of course, currently, power carrier solutions have been adopted for the control of LED, yet they are limited by data loss resulting from fluctuation of electrical voltage supplied thereto and stages of cascade connection, making the LED lighting strips not feasible for down cascade connection at multiple stages for a long distance, and consequently, the length of the LED lighting strip is limited. Further, the existing ways of connecting LED light strings also result in voltage loss in long distance LED light string, making the lighting effect of the LEDs at the tail of the LED light string and thus making the LEDs on the entire LED lighting strip show nonuniform lighting so as to deteriorate the effect of atmospheric lighting.

For example, the LED lighting strip can be used as a Christmas light. Christmas light is an atmospheric decoration light used in holidays. When a holiday comes, LED light strips are widely hung on malls, streets, schools, parks, Christmas trees, bushes, trees to enhance the atmosphere of holiday. Thus, it is important to make the application solution of the LED lighting strips easy to set up, easy to combine with power supply, easy to control, consistent with the surrounding field tone, and feasible for high voltage transmission.

The LED lighting strip products that are currently available in the market generally include two categories, which are respectively through-hole LED light strip and surface-mounted LED light strips, and both have defects as follows:

For the through-hole LED light strings, it is not possible to achieve miniaturization, and product color is monotonous, or multiple lighting products are mixed and serial connection is adopted to achieve high voltage applications, lighting effect being poor, allowing just a single effect, and being incapable of lighting effects like running light and revolving lantern.

For the surface-mounted LED light strings, although it is possible to achieve miniaturization, yet multiple groups multiple-color LEDs may be used and necessary serial connection or parallel connection must be involved for patched on line light, in combination with an external power controller, making it hard to realize high voltage line light string. The lighting effect of such an LED lighting strip is also limited and can only provide a single lighting effect and cannot achieve the lighting effects of running light and revolving lantern. It is of course possible to adopt power carrier communication solution to achieve the lighting effects of a running light or revolving lantern to make diversified styles of lighting. However, due to the own problems of the carrier communication, it is not possible to achieve long distance cascade connection. Each cascade stage may correspond to one LED or multiple LEDs, yet due to the large number of cascade stages, it is easily affected by line loss (such as long distance electrical resistance and power fluctuation) and interference (such as waveform interference of the power supply itself), so that it is not possible to achieve long distance multiple stage cascade connection.

In view of the above, embodiments of the application provide multiple types LED lighting beads and LED lighting strips made up of multiple types of LED lighting beads. The LED lighting strip is easy to manufacture and set up, easy to match power supplies, easy to control, and easy to match surrounding scenic tones, and also being capable of achieving high voltage transmission.

The LED lighting strip provided in the embodiments of the application comprises at least four conductive lines and multiple LED modules, in which the LED module comprises at least two LED lighting beads, and the at least two LED lighting beads are in electrical connection with the four conductive lines, and the plural LED lighting beads are arranged, in sequence, on the four conductive lines and form a strip, so that in an outside appearance, the plural LED lighting beads of the plural LED modules form an elongate string, in which one conductive line of the four conductive lines is a communication conductive line, while remaining three conductive lines are power-supplying conductive lines; on the communication conductive line, the LED lighting beads of the strip are all connected in series; and on power-supplying conductive lines, the plural LED modules are connected in parallel to each other and the at least two LED lighting beads of each of the LED modules are connected in series.

The LED lighting strip provided in the application adopts serial-parallel connection for power and serial connection for signal in order to achieve various application solutions for different power supply voltages, and as a consequence thereof, a serial communication protocol is adopted to control each of the LED lighting beads of the LED lighting strip, and consequently, diversification and arbitrary regulation of the lighting effect can be realized and constraint of cascade stages and distance is eliminated. The LED lighting strip can effectively resolve the shortcomings and drawbacks of the existing LED lighting strips, and allows long distance cascade connection and diversification of the lighting effect, easy control, and arbitrary regulation of power supply voltage as desired. Further, the LED lighting strip may adopt the same manufacturing art as that for the existing line lights, and the manufacture is easy and the production yield of the LED lighting strip can be enhanced.

It is noted that in the embodiments of the application, the LED lighting bead may each comprises a single or multiple light-emitting chips and a driving chip that drives the light-emitting chip(s) to emit light. The light-emitting chip is an LED, which specifically has a PN structure. The light-emitting chip can be for example a red light chip, a green light chip, or a blue light chip, which will also be referred to as a red LED, a green LED, and a blue LED. The LED lighting bead will also be referred to as an LED light. The LED module may comprise a single one or multiple ones of the LED lighting bead provided in the embodiments of the application.

For easy understanding, an introduction to various LED lighting beads provided in the embodiments of the application will be made first, and then, an LED lighting strip made up of the various lighting beads will be described. The various LED lighting beads provided in the embodiments of the application are classified as three categories of LED lighting bead, which are respectively A-category lighting bead, B-category lighting bead, and C-category lighting bead. The A-category lighting bead, B-category lighting bead, and C-category lighting bead each comprises two types, which are respectively a Top type and a Chip type. Specifically, the A-category lighting bead includes a Top-A bead and a Chip-A bead; the B-category lighting bead includes a Top-B bead and a Chip-B bead; the C-category includes a Top-C bead and a Chip-C bead, wherein the Top-type and Chip-type lighting beads are manufactured by adopting different manufacturing operations.

It is noted that, each of Top-A bead and Chip-A bead, Top-B bead and Chip-B bead, Top-C bead and Chip-C bead includes multiple embodiments.

Figure 2:
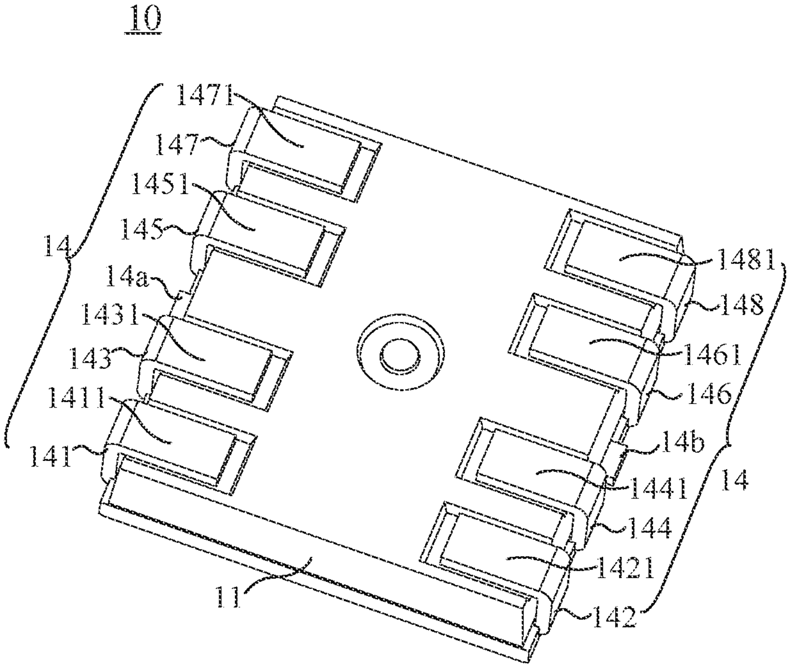
FIG. 2 is a schematic perspective view, taken from a different viewing angle, showing an LED lighting bead provided in the embodiments of the application.
Figure 3:
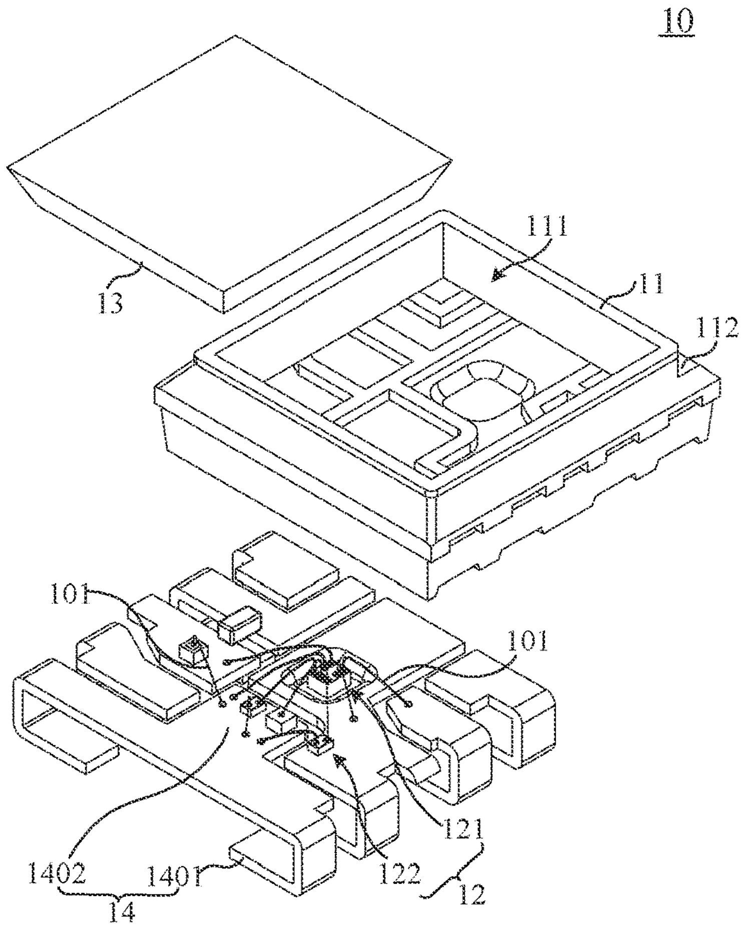
FIG. 3 is a schematic exploded view showing an LED lighting bead provided in the embodiments of the application.

For Top-A bead, referring to FIGS. 1-3, FIGS. 1-3 provide schematic views showing an LED lighting bead provided in the embodiments of the application. As shown in FIG. 1-3, the LED lighting bead 10 comprises an insulation housing 11, a light-emitting assembly 12, an encapsulation resin 13, and at least four pairs of leads 14.

The light-emitting assembly 12 comprises a driving chip 121 and a die 122, and the driving chip 121 and the die 122 are connected by bonding lines 101. The driving chip 121 drives the die 122 to give off light. In the instant embodiment, the die 122 can be a multiple-color light-emitting chip, and may specifically comprise a green light chip 1221, a red light chip 1222, and a blue light chip 1223, and the green light chip 1221, the red light chip 1222, and the blue light chip 1223 form a full-color light.

In some embodiments, the die 122 may comprise a single-color light-emitting chip or a combination of multiple single-color light-emitting chips, such as a blue light chip, a red light chip, or a green light chip, or a full-color light made up of a blue light chip, a red light chip, and a green light chip, or may be combined with a white light-emitting chip, the white light-emitting chip being combinable with one light-emitting chip or multiple light-emitting chips among a blue light chip, a red light chip, and a green light chip to form a multi-color light.

The encapsulation resin 13 covers the light-emitting assembly 12, and is specifically set on and covers the driving chip 121 and the die 122, wherein the encapsulation resin 13 specifically comprises a light-transmitting glue, specifically for example a transparent glue or a translucent glue, so that light emitting from the die may transmit through the encapsulation resin 13 to spread to the outside. Further, the encapsulation resin 13 also functions to protect the light-emitting assembly 12 and connection lines in the light-emitting assembly 12. The connection lines can specifically be bonding lines, and the bonding lines can be for example one of a gold line, a silver line, a copper line, an aluminum line, or an alloy line.

In some embodiments, as shown in FIG. 3, the insulation housing 11 is recessed to form a recessed compartment 111 for receiving the light-emitting assembly 12, and the encapsulation resin 13 is filled in an interior of the recessed compartment 111, in order to enhance securing of the encapsulation resin 13. Further, the recessed compartment 111 may also serve as a reflection cup to reflect light emitting from the die 122 so as to make the light emitting from the dies 122 to transmit in a direction toward an opening of the recessed compartment 111.

The at least four pairs of leads 14 are fixed to the insulation housing 11, such as the four pairs of leads 14 and the insulation housing 11 being integrally formed, specifically, by means of injection molding. The lead 14 includes a connecting portion 1401 and a chip-fixing portion 1402. The light-emitting assembly 12 is arranged on the chip-fixing portion 1402. The connecting portion 1401 is provided for electrical connection with conductive lines. Specifically, the connecting portion 1401 and the chip-fixing portion 1402 are electrically connected, such as, specifically, the connecting portion 1401 and the chip-fixing portion 1402 being integrally formed together. The conductive lines are external conductor wires, and specifically comprise a conductive line core and an insulation layer enclosing the conductive line core, and in view of the functionality of the conductive lines, the conductive lines are classified as power-supplying conductive lines and a communication conductive line.

Specifically, illustratively, as shown in FIG. 2, the connecting portions of the four pairs of leads 14 are all located on a bottom of the insulation housing 11 and are arranged at intervals. For each pair of leads 14, the connecting portions are respectively located on two sides of the bottom of the insulation housing 11 and are opposite to each other; and correspondingly, the chip-fixing portions of the leads 14 are arranged, at intervals, on a top of the insulation housing 11.

For the insulation housing 11 that is recessed to form the recessed compartment 111 for receiving therein the light-emitting assembly 12, the chip-fixing portions 1402 of a portion of the leads 14 or a part of the chip-fixing portions 1402 is located on a bottom of the recessed compartment 111.

The four pairs of leads 14 are respectively a first lead 141, a second lead 142, a third lead 143, a fourth lead 144, a fifth lead 145, a sixth lead 146, a seventh lead 147, and an eighth lead 148, in which the first lead 141 and the second lead 142 form a first lead pair; the third lead 143 and the fourth lead 144 forms a second lead pair; the fifth lead 145 and the sixth lead 146 forms a third lead pair; and the seventh lead 147 and the eighth lead 148 forms a fourth lead pair.

It is noted that the LED lighting beads provided in the embodiments of the application all comprises at least four pairs of leads 14, and it can certainly be appreciated that more leads 14 can be included, such as five pairs leads 14 or more pairs of leads 14, no limit being imposed herein.

Figure 4A:
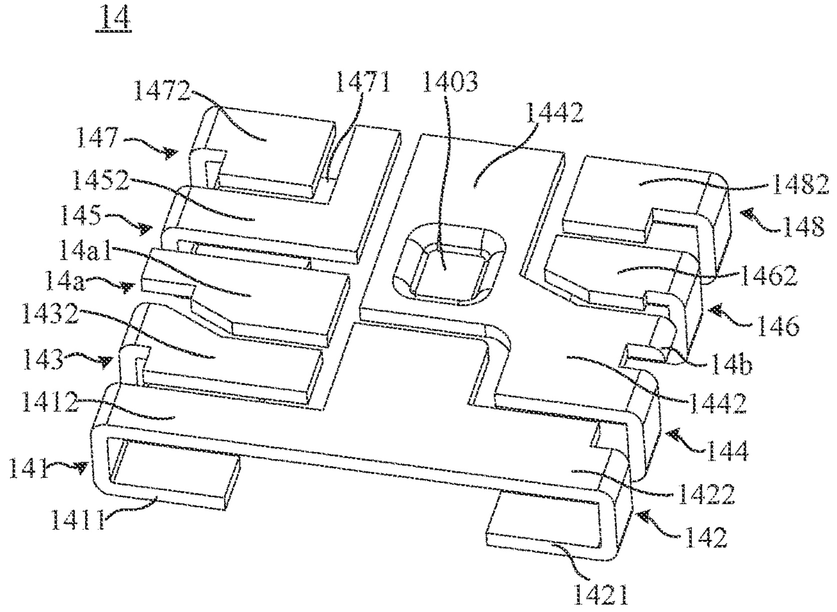
FIGS. 4*a* and 4*b* are schematic perspective views, taken from different viewing angles, showing leads of the LED lighting bead provided in the embodiments of the application, with an LED encapsulation resin removed.
Figure 4B:
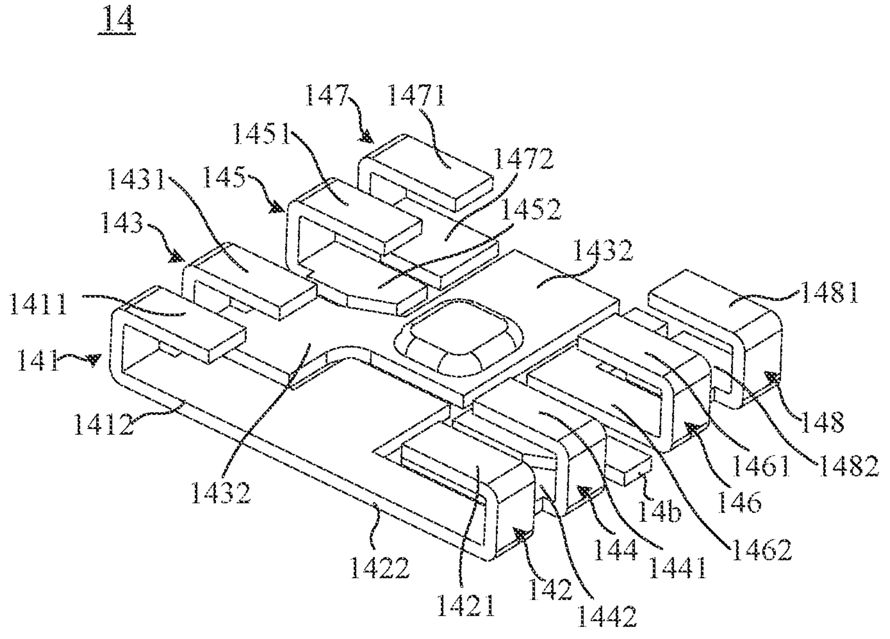

As shown in FIGS. 4*a* and 4*b*, the first lead 141 comprises a first connecting portion 1411 and a first chip-fixing portion 1412, and the second lead 142 comprises a second connecting portion 1421 and a second chip-fixing portion 1422, wherein the first chip-fixing portion 1412 and the second chip-fixing portion 1422 can be integrally formed as one piece, and being integrally formed as one piece allows soldering spots between the first lead 141 and the second lead 142 and solder lines of the conductive lines to be reduced. By using the integrated chip-fixing portions to make electrical connection, since the LED lighting bead is subsequently used to make the LED lighting strip, a conductive line soldered to the first lead 141 and the second lead 142 is a common positive terminal (anode) and can be connected straight from a leading end to a tailing end, namely from a leading lighting bead to a tail lighting bead, so that the reliability of the lighting strip can be enhanced. The third lead 143 comprises a third connecting portion 1431 and a third chip-fixing portion 1432; the fourth lead 144 comprises a fourth connecting portion 1441 and a fourth chip-fixing portion 1442; the fifth lead 145 comprises a fifth connecting portion and a fifth chip-fixing portion; the sixth lead 146 comprises a sixth chip-fixing portion; the seventh lead 147 comprises a seventh connecting portion 1471 and a seventh chip-fixing portion 1472; and the eighth lead comprises an eighth connecting portion 1481 and an eighth chip-fixing portion 1482.

It is noted that, without being indicated specifically, the chip-fixing portion of each of the leads 14 is arranged at intervals in the insulation housing 11, and being arranged at intervals is for the need of electrical connection. A special situation can be, for example, the first chip-fixing portion 1412 and the second chip-fixing portion 1422 being integrally formed as one piece. For two or multiple ones of the chip-fixing portions that are integrally formed together, since a portion of the chip-fixing portions is provided with electronic devices, while a portion of the chip-fixing portions is not provided with electronic devices, such as the fourth chip-fixing portion 1442 being provided with the driving chip 121 or the die 122, the chip-fixing portions that are provided with electronic devices generate heat during operation, while the chip-fixing portions that are not provided with electronic devices generate only a less amount of heat, so that if the arrangement is not made at intervals, then warping may occur due to inconsistent heating. Thus, the chip-fixing portions being arranged at intervals can effectively prevent warping resulting from inconsistent heating, so that the secureness of the leads 14 and the insulation housing 11 can be enhanced.

Figure 5:
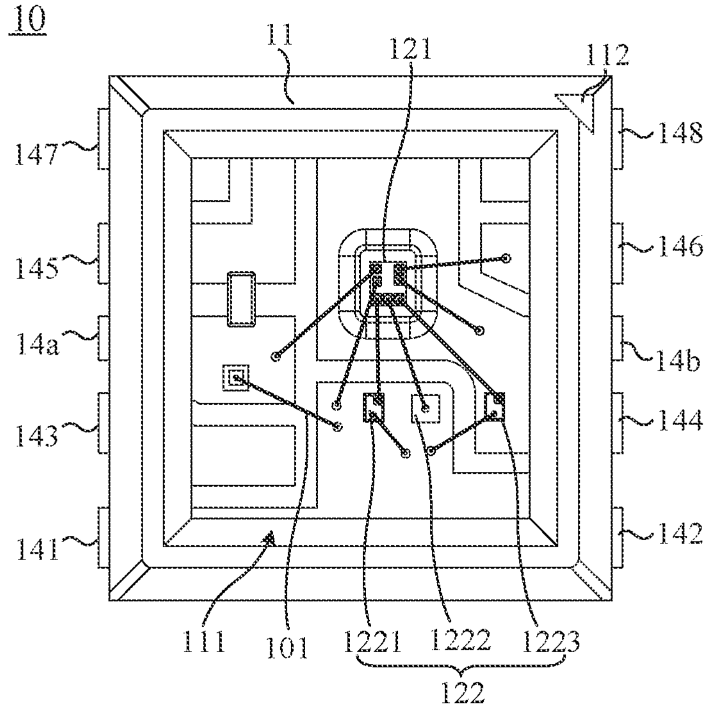
FIG. 5 is a schematic view showing the LED lighting bead provided in the embodiments of the application.
Figure 6:
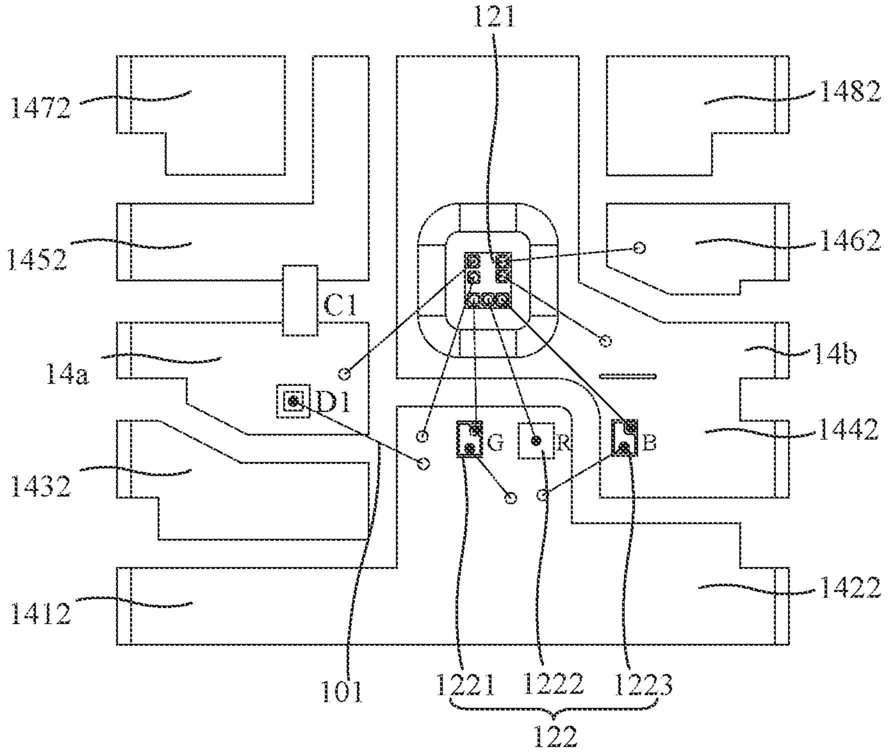
FIG. 6 is a schematic view showing a circuit connection relationship of the LED lighting bead provided in the embodiments of the application.

In the embodiments of the application, specifically as shown in FIGS. 5 and 6, the driving chip 121 is arrange on the fourth chip-fixing portion 1442 of the fourth lead 144, and the die 122 comprises a green light chip 1221, a red light chip 1222, and a blue light chip 1223, wherein the green light chip 1221, the red light chip 1222 and the blue light chip 1223 each have a terminal connected to the driving chip 121. It can certainly be appreciated that the driving chip 121 can alternatively arranged on the chip-fixing portion of another one of the leads, and the die 122 may further comprises a light-emitting chip of other color, or at least three or more than three light-emitting chips.

The die 122 is in electrical connection with the first chip-fixing portion 1412, and specifically, the die 122 is electrically connected by the bonding line 101 to the first chip-fixing portion 1412, or the die 122 is electrically connected to the first chip-fixing portion 1412 by means of bonding contact, such as, illustratively, a bottom of the die 122 is subjected to heat-curing of conductive silver paste to form electrical connection with the first chip-fixing portion 1412. It is noted that since the first chip-fixing portion 1412 and the second chip-fixing portion 1422 are integrally formed together as one piece, this may also be referred to the die 122 being set in electrical connection with the second chip-fixing portion 1422. Even for a situation that the first chip-fixing portion 1412 and the second chip-fixing portion 1422 are not integrally formed together as one piece and are instead arranged at intervals, the die 122 can be set in electrical connection with the first chip-fixing portion 1412, or can also be set in electrical connection with the second chip-fixing portion 1422. Ways of electrical connection include bonding line or conductive silver paste.

It is noted that, specifically, in case that bonding line or conductive silver paste is needed to make the electrical connection with of the die and the chip-fixing portion, determination must be made according to the type of the die. The structure of the PN junction of the die can be a vertical structure, or a horizontal structure. For the vertical structure, terminals on a bottom of the die must be connected to the chip-fixing portion by means of the conductive silver paste, where the bottom of the die indicates an end that is disposed on the chip-fixing portion, and terminals on a top of the die must be electrically connected to the driving chip by means of the bonding lines.

For the LED lighting bead 10 provided in the above embodiment, due to the arrangement of the four pairs of leads 14 and the connection relationship between the four pairs of leads 14 and the light-emitting assembly 12, the LED lighting bead 10 is allowed to connect, through four conductive lines, to other LED lighting beads, namely being allowed to be arranged orderly with other lighting beads on the four conductive lines, so that when observed from outside appearance, the multiple LED lighting beads are arranged on the four conductive lines to form an LED light string, yet the circuit connection involves serial connection and parallel connection, while in the communication connection relationship, each of the LED lighting beads is connected in series for easy control. Consequently, processing of the LED lighting strip becomes easier, and power supply with a high voltage to the LED lighting strip, long distance cascade connection and diversification of lighting, such as lighting fashions of a running light and a revolving lantern, can all be realized.

Figure 7:
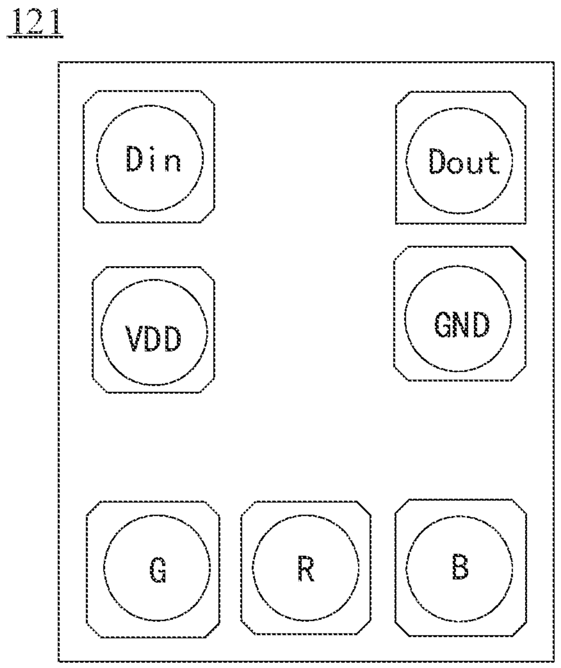
FIG. 7 is a schematic view showing a driving chip provided in the embodiments of the application.

As shown in FIGS. 6 and 7, a positive terminal VDD of the driving chip 121 is electrically connected, by a bonding line 101, to the first chip-fixing portion 1412 is in on with, this being also considered electrical connection to the second chip-fixing portion 1422. A negative terminal GND of the driving chip 121 is electrically connected, by a bonding line 101, to the fourth chip-fixing portion 1442. The positive terminal VDD of the driving chip 121 is also referred to as a power supplying terminal, and the negative terminal GND of the driving chip 121 is also referred to as a grounding terminal. The fifth chip-fixing portion 1452 functions to transmit a control signal to a signal input terminal Din of the driving chip 121. The sixth chip-fixing portion 1462 is connected, by a bonding line 101, to a signal output terminal Dout of the driving chip 121.

Specifically, in some embodiments, as shown in FIG. 5, the first chip-fixing portion 1412 (or the second chip-fixing portion 1422) is provided with a single one or multiple ones of die 122 arranged thereon; the die(s) 122 are set in electrical connection with the driving chip 121 by means of bonding lines 101, and the die(s) 122 are also electrically connected to the first chip-fixing portion 1412 (or the second chip-fixing portion 1422) by means of a bonding line 101, or alternatively, the die(s) 122 are electrically connected to the first chip-fixing portion 1412 (or the second chip-fixing portion 1422) by means of bonding contact. The driving chip 121 functions to control light emission of the die(s) 122. It is noted that the die(s) 122 and the driving chip 121 can be alternatively arranged on the other ones of the chip-fixing portions, and no limit is imposed herein.

Specifically, as shown in FIGS. 6 and 7, the first chip-fixing portion 1412 is provided with a green light chip 1221 and a red light chip 1222 arranged thereon, or, so to speak, the second chip-fixing portion 1422 is provided with the green light chip 1221 and the red light chip 1222 arranged thereon. The green light chip 1221 is electrically connected, by bonding lines 101, to the first chip-fixing portion 1412 and the driving chip 121. The red light chip 1222 is connected, by a bonding line 101, to the driving chip 121 and is electrically connected, through bonding contact, with the first chip-fixing portion 1412.

Specifically, a first terminal of the green light chip 1221 is electrically connected with the first chip-fixing portion 1412 by a bonding line, and a second terminal of the green light chip 1221 is electrically connected, by a bonding line 101, to a G control terminal of the driving chip 121. The first terminal and the second terminal of the green light chip 1221 respectively correspond to two ends of the PN junction. Controlling a voltage between the first terminal and the second terminal of the green light chip 1221 can control the PN junction of the green light chip 1221 to emit light.

Specifically, a first terminal of the red light chip 1222 is electrically connected with the first chip-fixing portion 1412 by conductive silver paste, and a second terminal of the red light chip 1222 is electrically connected, by a bonding line 101, to an R control terminal of the driving chip 121. The first terminal and the second terminal of the red light chip 1222 respectively correspond to two ends of the PN junction. Controlling a voltage between the first terminal and the second terminal of the red light chip 1222 的 the first terminal and the second terminal can control the PN junction of the red light chip 1222 to emit light. It is noted that the PN junction of the red light chip 1222 is of a vertical structure.

In some embodiments, the fourth chip-fixing portion 1442 is provided with the driving chip 121 and a die 122 arranged thereon. The die 122 is in electrical connection with the first chip-fixing portion 1412 by means of a bonding line and may also be regarded as being in electrical connection with the second chip-fixing portion 1422. The die 122 is also set in electrical connection with the driving chip 121 by means of a bonding line.

Illustratively, as shown in FIGS. 6 and 7, the die arranged on the fourth chip-fixing portion 1442 is a blue light chip 1223, and can also be a die of other color. A first terminal of the blue light chip 1223 is electrically connected to the first chip-fixing portion 1412 by a bonding line, and a second terminal of the blue light chip 1223 is electrically connected, by a bonding line to a B control terminal of the driving chip 121. To enhance the lighting effect of the LED lighting bead, the blue light chip 1223 is arranged on the fourth chip-fixing portion 1442 at a location adjacent to the first chip-fixing portion 1412, so that the blue light chip 1223 is close to the die arranged on the first chip-fixing portion 1412, such as the green light chip 1221 and the red light chip 1222. Thus, under the control of the driving chip 121, the light-emitting chips of three different colors can be used to generated different color combinations.

In some embodiments, to improve the reliability of the LED lighting bead in an actual application, the first chip-fixing portion 1412 and the second chip-fixing portion 1422 that are shown in FIGS. 4*a* and 6 as being integrally formed together as one piece can be cut and separate. As illustratively shown in FIGS. 8 and 9, due to the cut surfaces, the first chip-fixing portion 1412 and the second chip-fixing portion 1422 so cut and separated, when subjected to thermal expansion, are capable of reducing release of internal stress so as to improve the reliability of the LED lighting bead.

Figure 8:
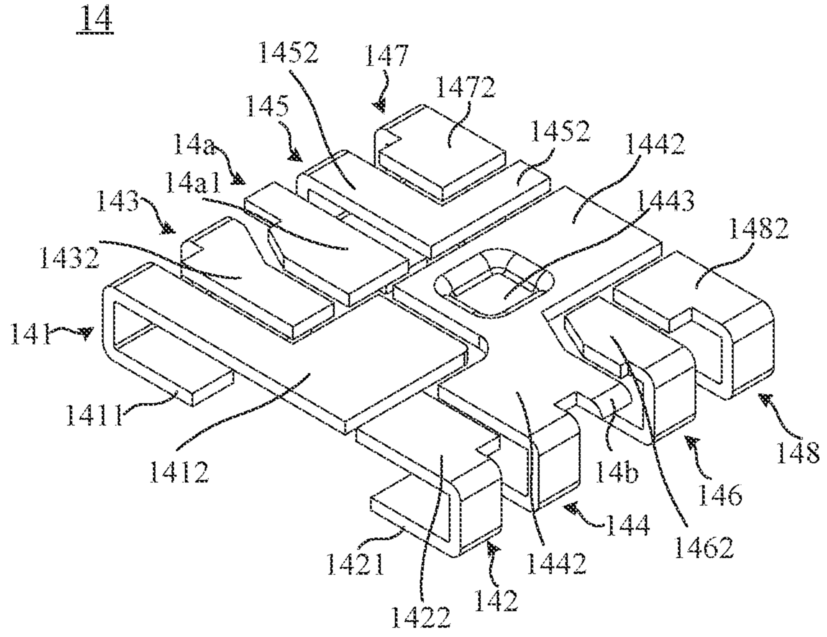
FIG. 8 is a perspective view showing another type of leads of the LED lighting bead provided in the embodiments of the application.
Figure 9:
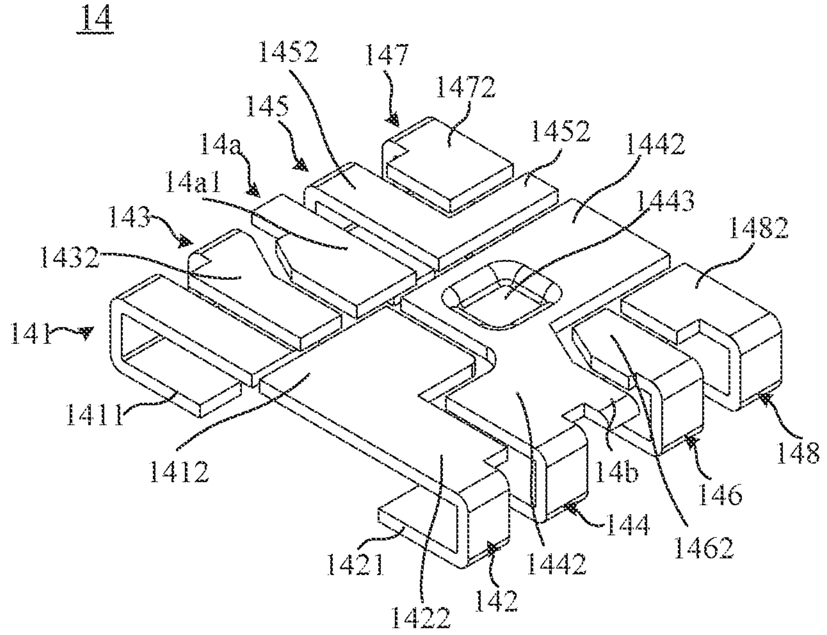
FIG. 9 is a schematic view illustrating a further type of leads of the LED lighting bead provided in the embodiments of the application.

It is noted that cutting apart the first chip-fixing portion 1412 and the second chip-fixing portion 1422 that are integrally formed together as one piece specifically comprises two ways shown in FIGS. 8 and 9 to provide cut-apart first chip-fixing portion 1412 and second chip-fixing portion 1422 that are cut and separated apart. Thus, the positive terminal VDD of the driving chip 121 is electrically connected by a bonding line 101 to the cut-apart first chip-fixing portion 1412, or the positive terminal VDD of the driving chip 121 is electrically connected by a bonding line 101 to the cut-apart second chip-fixing portion 1422, as shown in FIG. 9.

In some embodiments, as shown in FIGS. 4*a* and 6, the LED lighting bead 10 further comprises a first transition lead 14*a*. The first transition lead 14*a* comprises a chip-fixing portion 14*a*1. The chip-fixing portion 14*a*1 of the first transition lead 14*a* is provided with a diode D1 arranged thereon. An end of the diode D1 is electrically connected with the chip-fixing portion 14*a*1 of the first transition lead 14*a*, and an opposite end of the diode D1 is electrically connected by a bonding line to the first chip-fixing portion 1412. The chip-fixing portion 14*a*1 of the first transition lead 14*a* is also connected by a bonding line 101 to the signal input terminal Din of the driving chip 121. The chip-fixing portion 14*a*1 of the first transition lead 14*a* is also electrically connected with the fifth chip-fixing portion 1452. The diode D1 can specifically be a Schottky diode. Since the signal input terminal Din of the driving chip 121 requires a reference voltage, the Schottky diode that responds quickly is necessary for pulling the voltage in order to provide a reference for the signal of the signal input terminal Din, so as to improve communication quality of the LED lighting bead.

In some embodiments, as shown in FIG. 6, the chip-fixing portion 14*a*1 of the first transition lead 14*a* is set in electrical connection with the fifth chip-fixing portion 1452 by means of a capacitor C1. Since the LED lighting bead provided in the embodiments of the application can be made as a high voltage power-supply LED lighting strip, and since the control signal is correspondingly a high voltage high-low level signal, signal coupling by the capacitor C1 can improve transmission quality of the signal.

It is noted that when the diode is of a PN structure, a cathode of the diode D1 is electrically connected with the chip-fixing portion 14*a*1 of the first transition lead 14*a*, and an anode of the diode D1 is electrically connected by a bonding line to the first chip-fixing portion 1412; when the diode is of an NP structure, the anode of the diode D1 is connected to the chip-fixing portion 14*a*1 of the first transition lead 14*a*, and the cathode of the diode D1 is electrically connected by a bonding line to the first chip-fixing portion 1412. The diode D1 and the chip-fixing portion are connected by means of bonding or by means of conductive silver paste. The means of connection between the capacitor C1 and the chip-fixing portion can be connection by means of bonding with conductive silver paste.

It is also noted that the diode D1 and the capacitor C1 may alternatively be not arranged on the first transition lead 14*a*, such as being arranged outside the LED lighting bead 10, namely a similar effect can be achieved by arranging an external circuit.

In some embodiments, to ease the processing of the LED lighting bead, as shown in FIGS. 5 and 6, the LED lighting bead 10 can be arranged to further comprise a second transition lead 14*b*, and the first transition lead 14*a* and the second transition lead 14*b* are arranged on two opposite sides of the insulation housing 11. It is appreciated that a chip-fixing portion of the second transition lead 14*b* is integrally formed with the fourth chip-fixing portion 1442 as one piece, or it is appreciated that the second transition lead 14*b* is extended from the fourth chip-fixing portion 1442.

It is noted that, after the processing of the LED lighting bead 10 is completed, it is a common practice to make marking on the insulation housing of the LED lighting bead or a product specification that the first transition lead 14*a* and the second transition lead 14*b* are dummy leads, and the dummy leads need no electrical connection and provide an effect of transition or continuation.

In some embodiments, to identify the direction of the LED lighting bead, such as the direction of the leads of the LED lighting bead, a marking piece 112 may be further formed in the insulation housing 11, specifically as shown in FIGS. 1 and 3. The marking piece may specifically be a notch formed in the insulation housing 11, and can also be just a sign, such as a character.

Figure 10A:
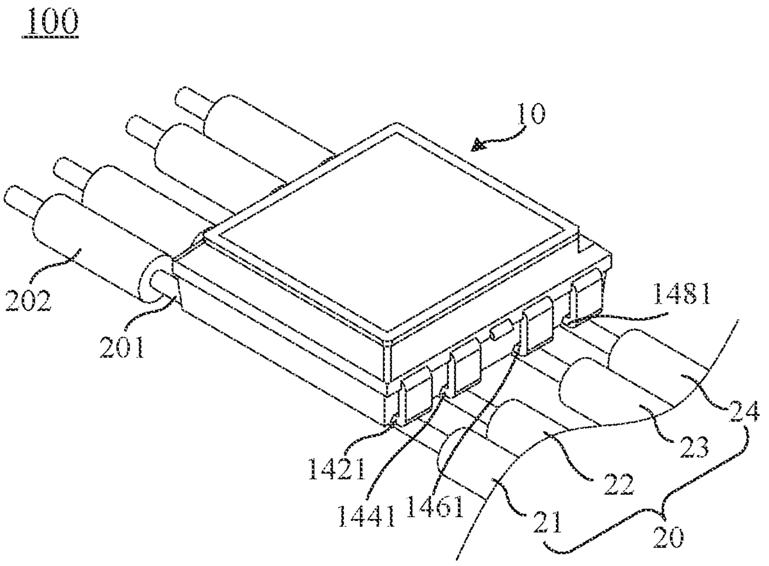
FIGS. 10*a* and 10*b* are schematic perspective views, taken from different viewing angle, showing a connection relationship between the LED lighting bead provided in the embodiments of the application and conductive lines.
Figure 10B:
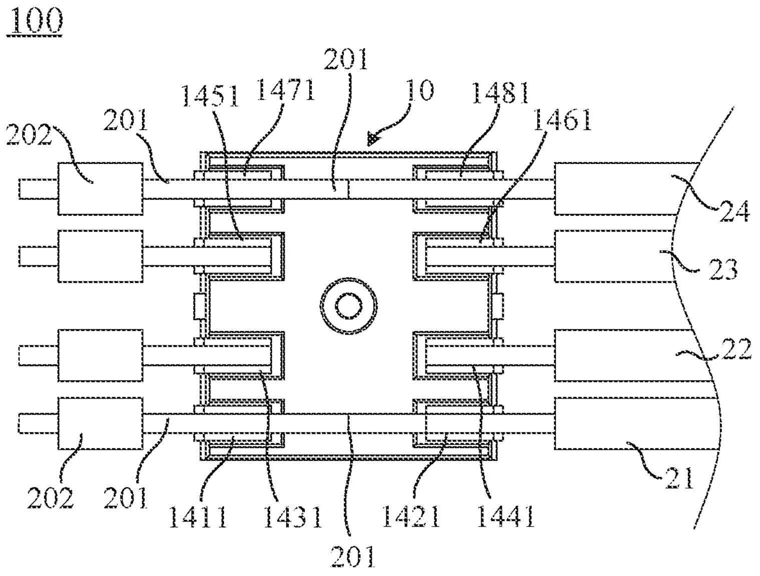

As shown in FIGS. 10*a* and 10*b*, in the various LED lighting beads 10 provided in the above embodiments, the first connecting portion 1411 of the first lead 141 and the second connecting portion 1421 of the second lead 142 are both for electrical connection with a first conductive line 21; the third connecting portion 1431 of the third lead 143 and the fourth connecting portion 1441 of the fourth lead 144 are both for electrical connection with a second conductive line 22; the fifth connecting portion 1451 of the fifth lead 145 and the sixth connecting portion 1461 of the sixth lead 146 are both for electrical connection with a third conductive line 23; the seventh connecting portion 1471 of the seventh lead 147 and the eighth connecting portion 1481 of the eighth lead 148 are both for electrical connection with a fourth conductive line 24. The first conductive line 21 is a positive line; the second conductive line 22 is a positive line; the third conductive line 23 is communication conductive line; and the fourth conductive line 24 is a negative line. The conductive line 20 comprises a conductive line core 201 and an insulation layer 202 enclosing the conductive line core 201. The conductive line 20 can be an enameled wire or a rubbered wire.

As shown in FIGS. 10*a* and 10*b*, a portion of the conductive line core 201 of the second conductive line 22 that is located between the third connecting portion 1431 of the third lead 143 and the fourth connecting portion 1441 of the fourth lead 144 is cut off; a portion of the conductive line core 201 of the third conductive line 23 that is located between the fifth connecting portion 1451 of the fifth lead 145 and the sixth connecting portion 1461 of the sixth lead 1461 is cut off.

In such an arrangement, an operation of processing for connecting the LED lighting bead 10 and the conductive lines 20 is specifically as follows. The insulation layers 202 are removed from corresponding portions of the conductive lines 20 to expose the conductive line cores 201, and solder is coated on the conductive line cores 201 or solder is coated on connection portions of the leads 14 of the LED lighting bead 10, and then, the leads 14 of the LED lighting bead 10 are soldered to the conductive lines 20. It is noted that, in a subsequent operation of using the LED lighting bead 10 and conductive lines 20 to make the LED lighting strip, a similar way of processing is adopted.

It is further noted that electrical connection between the leads 14 of the LED lighting bead 10 and the conductive lines 20 includes direct connection or indirect connection, wherein the direct connection is for example the leads 14 of the LED lighting bead 10 being soldered to and connected with the conductive lines 20, and indirect connection is for example the conductive lines 20 being first soldered to a carrier plate, the carrier plate including multiple soldering legs, and then, the leads 14 of the LED lighting bead 10 being correspondingly soldered to the soldering legs, such that the LED lighting bead 10 is electrically connected to the conductive lines 20 by means of the carrier plate.

In some embodiments, as shown in FIG. 4*a*, a chip mounting trough 1403 can be further arranged on the fourth chip-fixing portion 1442, and the driving chip 121 is disposed in the chip mounting trough 1403. Since a trough bottom of the chip mounting trough 1403 is lower than the other ones of the chip-fixing portions, the driving chip 121 is allowed to sink onto the bottom of the chip mounting trough 1403. This ensures that the die 122 is located above the driving chip 121 to prevent the driving chip from shielding light from the die 122 and thus effectively increase luminance of the LED lighting bead. And, also, the location of the highest site where a bonding line may be connected to the driving chip 121 is lowered to thereby reduce a length of the bonding line 101 so used, saving the fabrication cost of the LED lighting bead and also reducing release of stress around the driving chip to thereby improve the product reliability.

In some embodiments, a distance by which the trough bottom of the chip mounting trough 1403 is spaced from other chip-fixing portions can be set as a predetermined distance. The predetermined distance can be of any size that is smaller than a thickness of the driving chip 121, and the purpose of this is to allow the driving chip 121 to sink down to the very bottom of the recessed compartment 111. This ensures that the die 122 is located above the driving chip 121 to prevent the driving chip 121 from shielding light from the die 122, so as to effectively increase the luminance of the LED lighting bead, without increase of the fabrication cost of the LED structure. Further, the LED encapsulation structure is made of a combination of inorganic and organic materials. Since thermal expansion coefficients of the inorganic material and the organic material are different, the stresses generated by the inorganic material and the organic material are also different, this consequently leading to line punching or breaking of the bonding line 101. The application reduces the use length of the bonding line 101, so as to reduce a striking force acting on the bonding line 101 in subsequent operations, so as to avoid defects of line punching or breaking of the bonding line 101.

Figure 11:
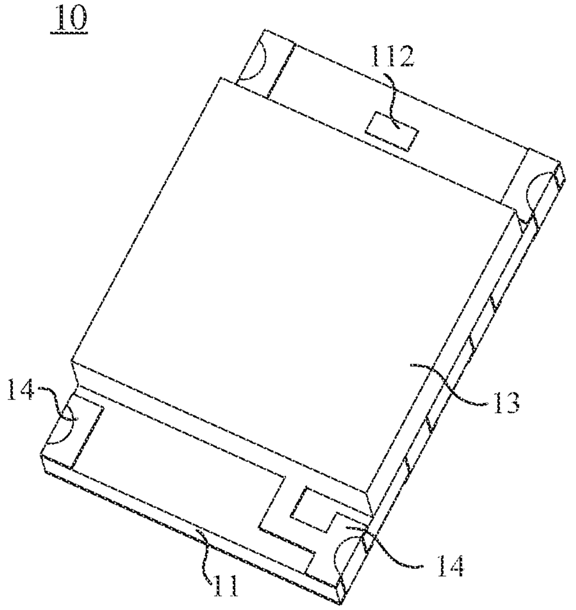
FIG. 11 is a schematic perspective view showing another LED lighting bead provided in the embodiments of the application.
Figure 12:
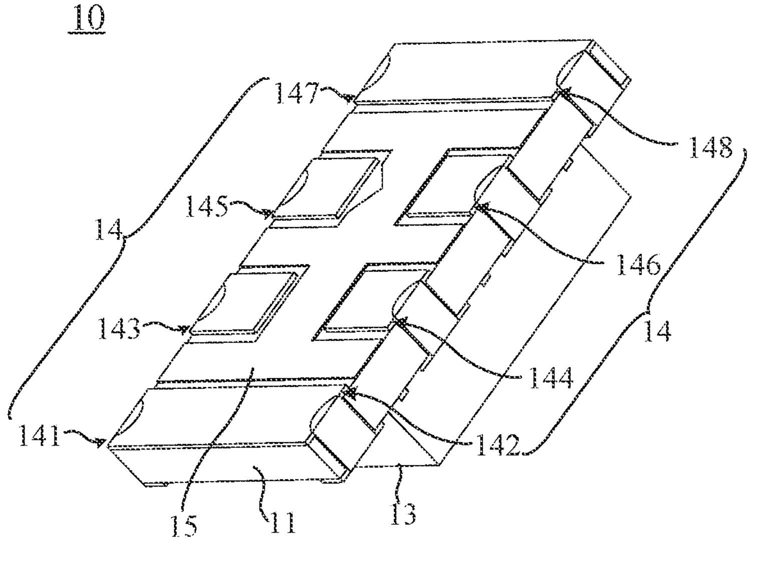
FIG. 12 is a schematic perspective view, taken from a different angle, showing said another LED lighting bead provided in the embodiments of the application.
Figure 13:
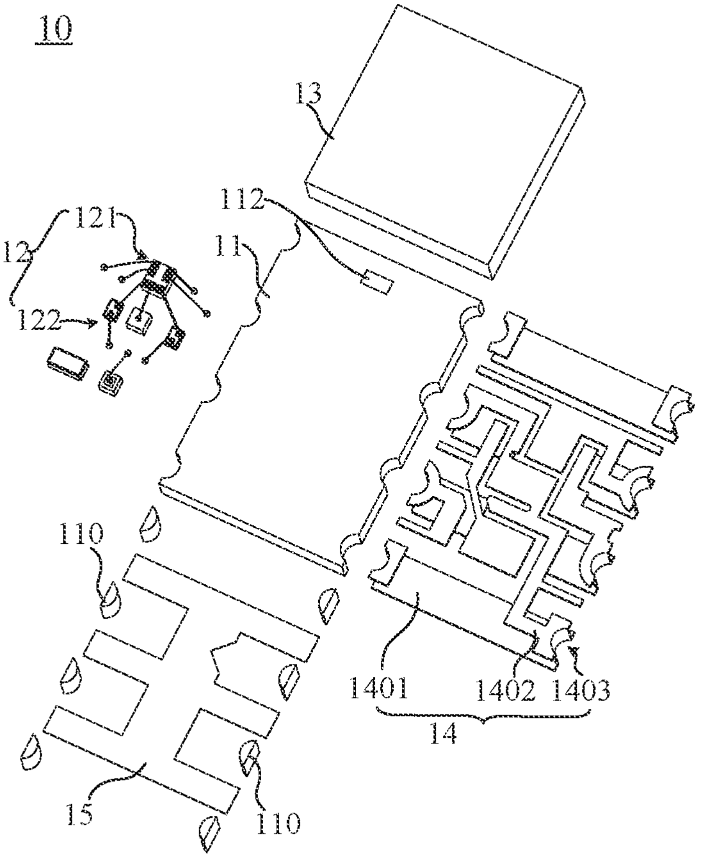
FIG. 13 is a schematic exploded view showing said another LED lighting bead provided in the embodiments of the application.

For Chip-A bead, referring to FIGS. 11-13, FIGS. 11-13 provide schematic views showing another LED lighting bead provided in the embodiments of the application. As shown in FIGS. 11-13, the LED lighting bead 10 comprises an insulation housing 11, a light-emitting assembly 12, an encapsulation resin 13, and at least four pairs of leads 14.

The insulation housing 11 is made of a plastic material. The light-emitting assembly 12 comprises a driving chip 121 and a die 122, and the driving chip 121 and the die 122 are connected by bonding lines 101. The driving chip 121 drives the die 122 to give off light. In the instant embodiment, the die 122 can be a multiple-color light-emitting chip, and may specifically comprise a green light chip 1221, a red light chip 1222, and a blue light chip 1223, and the green light chip 1221, the red light chip 1222, and the blue light chip 1223 form a full-color light.

In some embodiments, the die 122 may comprise a single-color light-emitting chip or a combination of multiple single-color light-emitting chips, such as a blue light chip, a red light chip, or a green light chip, or a full-color light made up of a blue light chip, a red light chip, and a green light chip, or may be combined with a white light-emitting chip, the white light-emitting chip being combinable with one light-emitting chip or multiple light-emitting chips among a blue light chip, a red light chip, and a green light chip to form a multi-color light.

The encapsulation resin 13 covers the light-emitting assembly 12, and is specifically set on and covers the driving chip 121 and the die 122, wherein the encapsulation resin 13 specifically comprises a light-transmitting glue, specifically for example a transparent glue, so that light emitting from the die may transmit through the encapsulation resin 13 to spread, in directions other than bottom, to the outside. Further, the encapsulation resin 13 also functions to protect the light-emitting assembly 12 and connection lines in the light-emitting assembly 12. The connection lines can specifically be bonding lines.

It is noted that as provided in the embodiments of the application, the bonding lines can be for example one of a gold line, a silver line, a copper line, an aluminum line, or an alloy line.

As shown in FIG. 13, the at least four pairs of leads 14 are fixed to the insulation housing 11, such as, specifically, a large sheet of copper foil being laminated on the insulation housing 11, and then the copper foil being etched to form a circuit corresponding to the leads 14, the circuit being specifically connecting portions 1401 and chip-fixing portions 1402 of the leads 14, wherein electrical connection between the connecting portions 1401 and the chip-fixing portions 1402 are achieved with vias 1403. The four pairs of leads 14 can be fixed, by means of bonding, to the insulation housing 11, and of course, other measures may be adopted, such as molding.

In the embodiments of the application, the leads 14 each comprise a connecting portion 1401, but not all of the leads 14 necessarily comprise a chip-fixing portion 1402, meaning only a portion of the leads 14 comprises a chip-fixing portion 1402, or all the leads 14 comprise a chip-fixing portion 1402. The light-emitting assembly 12 is arranged on the chip-fixing portion 1402. The connecting portion 1401 is provided for electrical connection with conductive lines. The conductive lines are external conductor wires, and specifically comprise a conductive line core and an insulation layer enclosing the conductive line core, and in view of the functionality of the conductive lines, the conductive lines are classified as power-supplying conductive lines and a communication conductive line.

Figure 14:
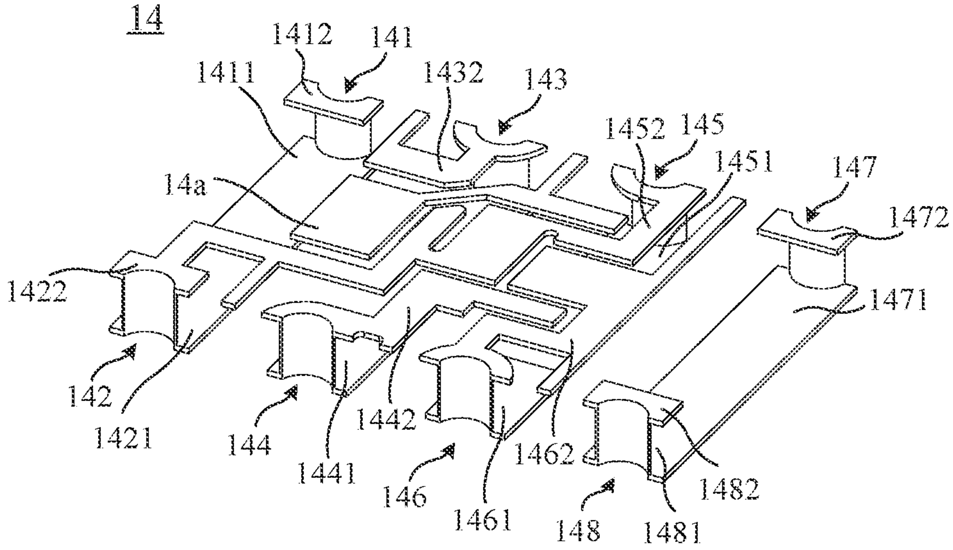
FIG. 14 is a schematic perspective view showing a lead of the LED lighting bead provided in the embodiments of the application.

Specifically, as shown in FIG. 14, the four pairs of leads 14 are respectively a first lead 141, a second lead 142, a third lead 143, a fourth lead 144, a fifth lead 145, a sixth lead 146, a seventh lead 147, and an eighth lead 148, in which the first lead 141 and the second lead 142 form a first lead pair; the third lead 143 and the fourth lead 144 forms a second lead pair; the fifth lead 145 and the sixth lead 146 forms a third lead pair; and the seventh lead 147 and the eighth lead 148 forms a fourth lead pair.

Specifically, illustratively, as shown in FIG. 12, the connecting portions 1401 of the four pairs of leads 14 are all located on a bottom of the insulation housing 11 and arranged at intervals. For each pair of the leads 14, the connecting portions 1401 are respectively located on two sides of the bottom of the insulation housing 11 and are opposite to each other; and correspondingly, the chip-fixing portions 1402 of the leads 14 are arranged, at intervals, on a top of the insulation housing 11.

It is noted that the LED lighting beads provided in the embodiments of the application all comprises at least four pairs of leads 14, and it can certainly be appreciated that more leads 14 can be included, such as five pairs leads 14 or more pairs of leads 14, no limit being imposed herein.

In making an LED lighting strip with the LED lighting bead 10, four conductive lines are required, and the four conductive lines are respectively a first conductive line, a second conductive line, a third conductive line, and a fourth conductive line, wherein the first conductive line is a positive line; the second conductive line is a positive line; the third conductive line is a communication conductive line; and the fourth conductive line is a negative line. The first lead pair is connected to the first conductive line, meaning the connecting portions of the first lead 141 and the second lead 142 are both in electrical connection with the first conductive line; the second lead pair is in electrical connection with the third conductive line, meaning the connecting portions of the third lead 143 and the fourth lead 144 are both in electrical connection with the third conductive line; the third lead pair is in electrical connection with the second conductive line, means the connecting portions of the fifth lead 145 and the sixth lead 146 are both in electrical connection with the second conductive line; the fourth lead pair is connected to the fourth conductive line, meaning the connecting portions of the seventh lead 147 and the eighth lead 148 are both in electrical connection with the fourth conductive line, in which a portion of the conductive line core of the third conductive line that is located between the connecting portions of the third lead 143 and the fourth lead 144 is cut off; and a portion of the conductive line core of the second conductive line that is located between the connecting portions of the fifth lead 145 and the sixth lead 146 is cut off.

Figure 15A:
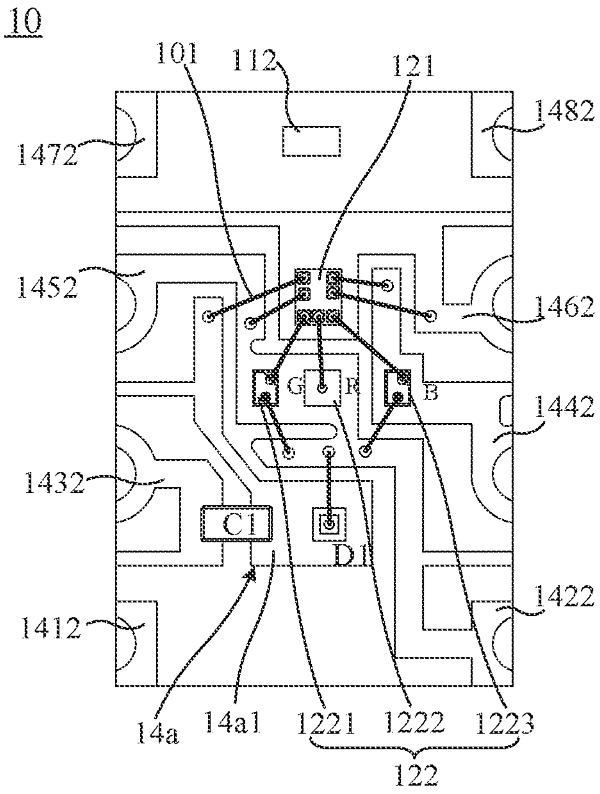
FIGS. 15*a* and 15*b* are schematic views showing a circuit connection relationship of the LED lighting bead provided in the embodiments of the application.
Figure 16A:
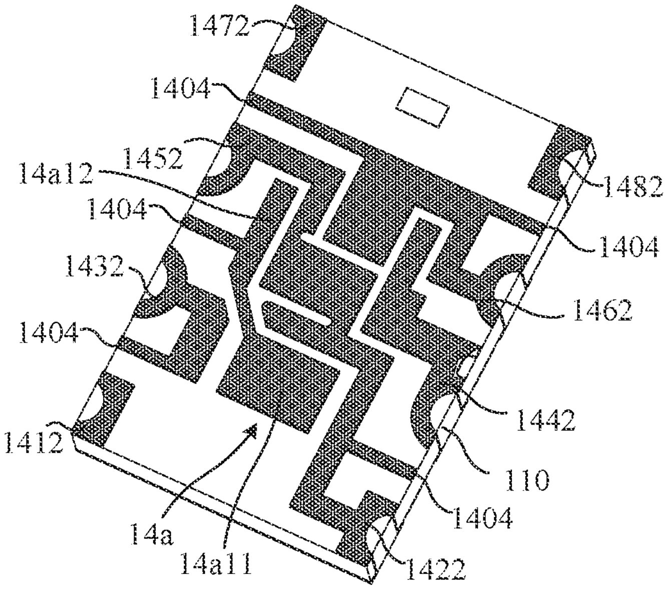
FIGS. 16*a* and 16*b* are schematic views showing an effect of hatching on the leads of the LED lighting bead provided in the embodiments of the application.
Figure 16B:
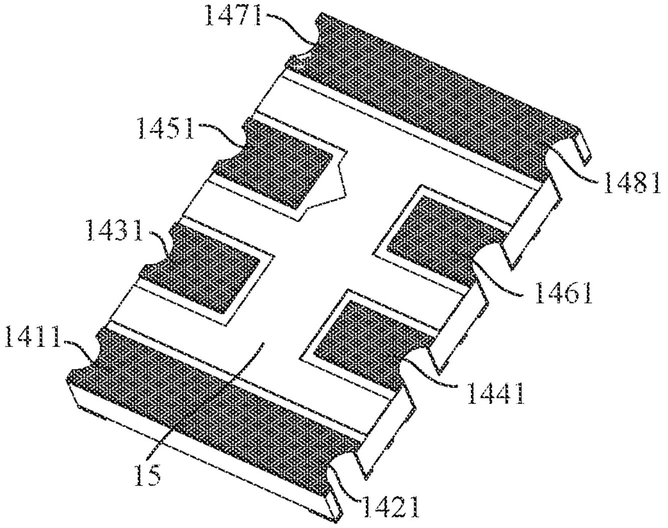

In the embodiments of the application, as shown in FIG. 15*a*, reference being simultaneously had to FIGS. 14, 16*a*, and 16*b*, for easy illustration, in FIGS. 16*a* and 16*b*, hatching is shown on the connecting portions and the chip-fixing portions of the leads 14. The first lead 141 comprises a first connecting portion 1411 and a first chip-fixing portion 1412. The second lead 142 comprises a second connecting portion 1421 and a second chip-fixing portion 1422. The die 122 is in electrical connection with the second chip-fixing portion 1422. A positive terminal VDD of the driving chip 121 is electrically connected by a bonding line 101 to the second chip-fixing portion 1422. The third lead 143 comprises a third connecting portion 1431 and a third chip-fixing portion 1432. The fourth lead 144 comprises a fourth connecting portion 1441 and a fourth chip-fixing portion 1442. The third chip-fixing portion 1432 functions to transmit a control signal to a signal input terminal Din of the driving chip 121. The fourth chip-fixing portion 1442 is connected by a bonding line 101 to a signal output terminal Dout of the driving chip 121. The fifth lead 145 comprises a fifth connecting portion 1451 and a fifth chip-fixing portion 1452. The sixth lead 146 comprises a sixth connecting portion 1461 and a sixth chip-fixing portion 1462. A negative terminal GND of the driving chip 121 is electrically connected by a bonding line 101 to the sixth chip-fixing portion 1462. The seventh lead 147 comprises a seventh connecting portion 1471 and a seventh chip-fixing portion 1472. The eighth lead 148 comprises an eighth connecting portion 1481 and an eighth chip-fixing portion 1482.

The first connecting portion 1411 and the second connecting portion 1421 are electrically connected with the first conductive line. The third connecting portion 1431 and the fourth connecting portion 1441 are electrically connected with the third conductive line. The fifth connecting portion 1451 and the sixth connecting portion 1461 are electrically connected with the second conductive line. The seventh connecting portion 1471 and the eighth connecting portion 1481 are electrically connected with the fourth conductive line.

For the LED lighting bead 10 provided in the above embodiment, due to the arrangement of the four pairs of leads 14 and the connection relationship between the four pairs of leads 14 and the light-emitting assembly 12, the LED lighting bead 10 is allowed to connect, through four conductive lines, to other LED lighting beads, namely being allowed to be arranged orderly with other lighting beads on the four conductive lines, so that when observed from outside appearance, the multiple LED lighting beads are arranged on the four conductive lines to form an LED light string, yet the circuit connection involves serial connection and parallel connection, while in the communication connection relationship, each of the LED lighting beads is connected in series for easy control. Consequently, processing of the LED lighting strip become easier, and power supply with a high voltage to the LED lighting strip, long distance cascade connection and diversification of lighting, such as lighting fashions of a running light and a revolving lantern, can all be realized.

In the embodiments of the application, the first connecting portion 1411 and the second connecting portion 1421 are integrally formed together as one piece so as to simplify the electrical connection with the first conductive line and also to enhance the reliability of the electrical connection with the first conductive line, and further, in an operation of using a via to electrically connect the chip-fixing portion and the connecting portion, it is possible to install a further reduced number of conductive electrodes to facilitate the processing. Of course, in some embodiments, the first connecting portion 1411 and the second connecting portion 1421 can be cut apart, meaning the first connecting portion 1411 and the second connecting portion 1421 are arranged at intervals. Being arranged at intervals effectively prevents a connection between the first connecting portion 1411 and the second connecting portion 1421 from bulging upwards from the insulation housing 11 so as to provide a service life of the LED lighting bead.

For the first lead 141, the seventh lead 147, and the eighth lead 148, as shown in FIGS. 15*a* and 16*a*, since the chip-fixing portions of the first lead 141, the seventh lead 147, and the eighth lead 148 are primarily provided for electrical connection, by means of vias, with the connecting portions located on the bottom of the insulation housing 11, and they have a relatively small surface area on the top of the insulation housing 11, it may regard the first lead 141, the seventh lead 147, and the eighth lead 148 as having no chip-fixing portion.

It is noted that the structure of the driving chip 121 may refer to FIG. 7, and it is noted that the driving chip 121 shown in FIG. 7 does not constrain the structure of the driving chip of the application, for example locations of the positive terminal VDD and the negative terminal GND and locations of the signal input terminal Din and the signal output terminal Dout can be different in different driving chips. The driving chips of the LED lighting beads provided in the subsequent embodiment can equally refer to FIG. 7 for illustration.

In some embodiments, as shown in FIGS. 15*a* and 16*a*, the second chip-fixing portion 1422 and the fifth chip-fixing portion 1452 are connected to each other, and specifically, the second chip-fixing portion 1422 and the fifth chip-fixing portion 1452 are integrally formed together as one piece, to ease electrical connection in a subsequent operation of making an LED lighting strip with the LED lighting bead 10 and also to enhance the reliability of power supply, and further, in an operation of electrically connecting the chip-fixing portion and the connecting portion with a via, the number of conductive electrodes required can be reduced to simplify the operation. Of course, it is appreciated that the second chip-fixing portion 1422 and the fifth chip-fixing portion 1452 can be arranged at intervals, meaning the second chip-fixing portion 1422 and the fifth chip-fixing portion 1452 that are integrally formed together as one piece can be cut apparat.

Figure 15B:
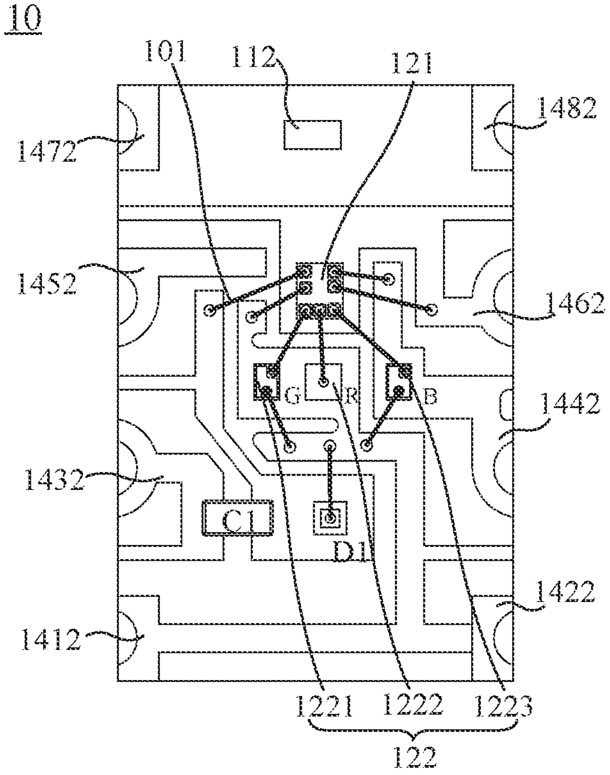

In some embodiments, instead of the first chip-fixing portion 1412 and the second chip-fixing portion 1422 being arranged at intervals as shown in FIG. 15*a*, the first chip-fixing portion 1412 and the second chip-fixing portion 1422 can be integrally formed together as one piece, as specifically shown in FIG. 15*b*. Since the connecting portions that correspond to the first chip-fixing portion 1412 and the second chip-fixing portion 1422 are both connected with the first conductive line, it is appreciated that the positive terminal VDD of the driving chip 121 can be electrically connected with the second chip-fixing portion 1422, or the positive terminal VDD of the driving chip 121 can be further in electrical connection with the first chip-fixing portion 1412.

In some embodiments, to ensure communication quality of the LED lighting bead 10 in order to subsequently realize precise control of each LED lighting bead of the LED lighting strip, in the arrangement of the LED lighting bead 10, as shown in FIG. 15*a*, the arrangement can be further made such that the LED lighting bead 10 comprises a first transition lead 14*a*. The first transition lead 14*a* comprises a chip-fixing portion 14*al*. The chip-fixing portion 14*a*1 of the first transition lead 14*a* is provided with a diode D1. A cathode of the diode D1 is electrically connected with the chip-fixing portion 14*a*1 of the first transition lead 14*a*, and an anode of the diode D1 is electrically connected by a bonding line to the second chip-fixing portion 1422 is in electrical connection with. Since in making the LED lighting strip with the LED lighting bead 10, a high voltage is needed to drive operation of each LED lighting bead, the signal input terminal Din of the driving chip 121 requires a reference voltage, and thus a Schottky diode that responds quickly is necessary for pulling the voltage in order to provide a reference for the signal of the signal input terminal Din, so as to consequently improve communication quality of the LED lighting bead.

In some embodiments, to further improve the communication quality, in designing the LED lighting bead 10, as shown in FIG. 15*a*, the chip-fixing portion 14*a*1 of the first transition lead 14*a* is arranged to be connected with the third chip-fixing portion 1432 by a capacitor C1. The chip-fixing portion 14*a*1 of the first transition lead 14*a*1 is connected by a bonding line to the signal input terminal Din of the driving chip 121. The capacitor C1 functions for signal coupling in order to increase the signal transmission quality.

In some embodiments, as shown in FIG. 16*a*, reference being also had to FIG. 15*a*, the chip-fixing portion 14*a*1 of the first transition lead 14*a* comprises a fixing terminal part 14*a*11 and the connecting terminal part 14*a*12, the fixing terminal part 14*a*11 and a connecting terminal part 14*a*12. The fixing terminal part 14*a*11 is arranged to receive the diode D1 and the capacitor C1 to dispose thereon, and the connecting terminal part 14*a*12 is arranged to receive a connection point of the bonding line to be arranged thereon, wherein the connecting terminal part 14*a*12 is extended to align with the sixth chip-fixing portion 1462. The driving chip 121 is arranged on the sixth chip-fixing portion 1462, and the signal input terminal Din of the driving chip 121 is electrically connected by a bonding line to the connecting terminal part 14*a*11, and specifically, the signal input terminal Din of the driving chip 121 is connected by the bonding line to the connection point of the connecting terminal part 14*a*12. This arrangement helps save the length of the bonding line, preventing the bonding line from breaking due to an excessive length, so as to increase the product life span.

In some embodiments, the LED lighting bead 10 may further comprises a second transition lead (not shown in the drawing). The second transition lead and the first transition lead are arranged on two opposite sides of the insulation housing 11. Of course, it is not necessary to arrange the second transition lead.

In some embodiments, since the connecting portions and the chip-fixing portions of the leads 14 must be subjected to electroplating through an electroplating operation, or for electrical connection made with a via, electroplating may also be needed for plated through hole, to simplify the electroplating operation, each of the leads 14 is provided, on the chip-fixing portion thereof, with a conductive electrode 1404. The conductive electrode 1404 is extended from the chip-fixing portion of each of the leads to an edge of the insulation housing 11. Illustratively, as shown in FIG. 16*a*, the second chip-fixing portion 1422, the third chip-fixing portion 1432, the chip-fixing portion 14*a*1 of the first transition lead 14*a*, and the sixth chip-fixing portion 1462 each include a conductive electrode 1404.

In some embodiments, as shown in FIG. 15*a*, the second chip-fixing portion 1422 is provided with a single one or multiple ones of die 122 arranged thereon, and the die(s) 122 are set in electrical connection with the driving chip 121 by means of bonding lines 101. Further, the die(s) 122 are also electrically connected to the second chip-fixing portion 1422 by means of a bonding line 101, or alternatively, the die(s) 122 are electrically connected to the second chip-fixing portion 1422 by means of bonding contact, for example by using conductive silver paste. It is noted that the one or multiple dies 122 can be alternatively arranged on the other ones of the chip-fixing portions, and no limit is imposed herein.

Illustratively, the second chip-fixing portion 1422 is provided with a green light chip 1221 and a red light chip 1222 arranged thereon, wherein the green light chip 1221 is electrically connected, by bonding lines 101, to the second chip-fixing portion 1422 and the driving chip 121, specifically, a G control terminal of the driving chip 121. The red light chip 1222 is connected, by a bonding line 101, to the driving chip 121 and is electrically connected, through bonding contact, with the second chip-fixing portion 1422.

Figure 16C:
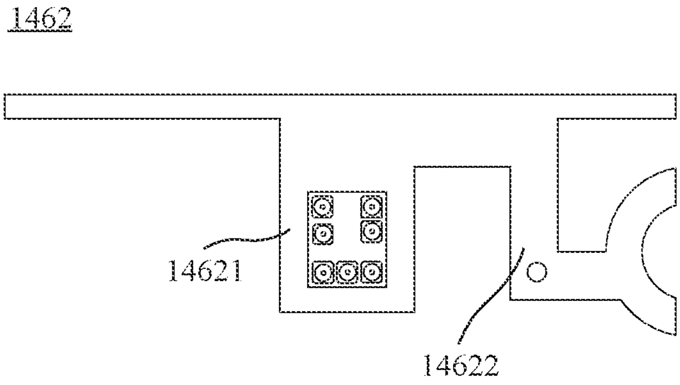
FIGS. 16*c* and 16*d* are schematic perspective views showing two chip-fixing portions provided in the embodiments of the application.
Figure 16D:
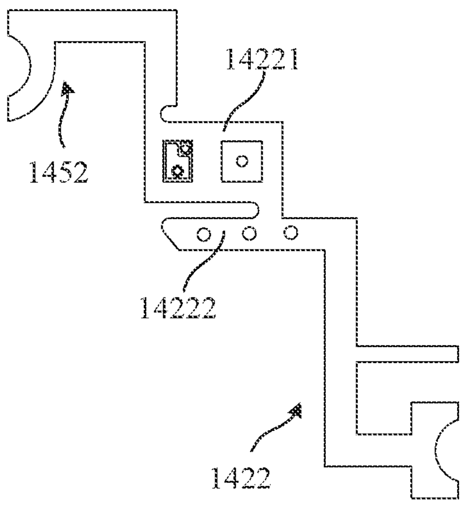

In the embodiments of the application, illustratively, as shown in FIG. 16*d*, the second chip-fixing portion 1422 at least comprises a first arrangement portion 14221 and a second arrangement portion 14222 that are arranged at intervals. The first arrangement portion 14221 is provided for receiving the green light chip 1221 and the red light chip 1222 to dispose thereon, and the second arrangement portion is provided for receiving a bonding line connection point to be arranged thereon. Since bottoms of the blue light chip and the green light chip are connected, through bonding glue, to the chip-fixing portions, the bonding blue is an organic substance, which has different internal stress during thermal expansion so as to readily result in delamination (or stripping) of two surrounding solder bonding points (the bonding line connection points) to cause failure of electrical connection. Thus, the first arrangement portion 14221 and the second arrangement portion 14222 being arranged at intervals can effectively prevent extension of delamination stripping to thereby effectively protect the secureness of the soldering points and improve the product reliability. It is noted that, in FIG. 16*d*, the fifth chip-fixing portion 1452 and the second chip-fixing portion 1422 are integrally formed together as one piece, and thus, the fifth chip-fixing portion 1452 ca be regarded as at least comprising the first arrangement portion 14221 and the second arrangement portion 14222 that are arranged at intervals.

In some embodiments, the fourth chip-fixing portion 1442 is provided with a die 122 arranged thereon. The die 122 is electrically connected by a bonding line 101 to the second chip-fixing portion 1422. The die 122 is also electrically connected by a bonding line 101 to the driving chip 121. Specifically, as shown in FIG. 15*a*, the die 122 arranged on the fourth chip-fixing portion 1442 is a blue light chip 1223, and the blue light chip 1223 is arranged on the fourth chip-fixing portion 1442 at a location adjacent to the second chip-fixing portion 1422, so that the blue light chip 1223 is close to the die arranged on the second chip-fixing portion 1422, and this saves bonding line and also facilitates combination for various colors, and thus, not only lowering product cost and improving product reliability, and also enhancing an effect of combined lighting and color mixing of the LED lighting bead.

In some embodiments, as shown in FIG. 15*a*, the driving chip 121 is arranged on the sixth chip-fixing portion 1462, and an area of the sixth chip-fixing portion 1462 in which the driving chip 121 is arranged in located among the third chip-fixing portion 1432, the fourth chip-fixing portion 1442, and the fifth chip-fixing portion 1452. Specifically, it can be regarded as the sixth chip-fixing portion 1462 having at least a portion extended among the third chip-fixing portion 1432, the fourth chip-fixing portion 1442, and the fifth chip-fixing portion 1452, and consequently, the distance between the driving chip 121 and the other chip-fixing portions or the dies on the other chip-fixing portions, so as to ease connection with bonding lines, and also to provide reliability and service life of product.

In some embodiments, to further enhance product reliability and service life, as shown in FIG. 16*c*, in designing the sixth chip-fixing portion 1462, the sixth chip-fixing portion 1462 can be arranged to comprise a first disposition portion 14621 and a second disposition portion 14622 that are arranged at intervals. The first disposition portion 14621 is connected to the second disposition portion 14622, and specifically, it can be regarded as the first disposition portion 14621 and the second disposition portion 14622 being of an integrated arrangement. The first disposition portion 14621 receives the driving chip 121 to dispose thereon, and the second disposition portion 14622 receives a bonding line connection point to be arranged thereon. A portion between the first disposition portion 14621 and the second disposition portion 14622 is a spacing area, and consequently, heat of the driving chip 121 is prevented from causing peeling of the bonding line connection point from the second disposition portion 14622, and thus extension of delamination stripping can be effectively prevented to effectively protect the secureness of the soldering point and improving product reliability. Correspondingly, the fourth chip-fixing portion 1442 comprises a die disposition portion 14021 and a bonding line connection point disposition portion 14022 extending from the die disposition portion 14021. The bonding line connection point disposition portion 14022 is extended to the spacing area. Consequently, the distance between the driving chip and the chip-fixing portion to which a bonding line is connected can be further reduced to thereby save cost and improve product reliability.

In some embodiments, as shown in FIG. 16*b*, the LED lighting bead 10 may further comprise an isolation board 15. The isolation board 15 is specifically a bismaleimide-triazine (BT) board, which is also referred to as a resin substrate. The isolation board 15 is specifically arranged on the bottom of the insulation housing 11 to isolate the connecting portion of each of the leads 14, preventing shorting caused by solder balls in a subsequent operation of soldering and connecting the LED lighting bead and the conductive lines. Since the surface of the insulation housing 11 is rough, if no isolation board 15 is used, it is quite easy to cause shorting in soldering the connecting portions of the leads 14 and the conductive lines.

In some embodiments, as shown in FIG. 14, in the LED lighting bead 10, the connecting portion and the chip-fixing portion of each of the leads 14 are electrically connected by adopting a via, and the via is filled up with resin by means of molding. Organic glue should not penetrate to solder pad leads on the bottom, because a product via cylindrical lead is connected to the surrounding, and obtaining a single product require cutting, making the filling resin 110 of the single product exhibiting a cylindrical form.

Figure 17A:
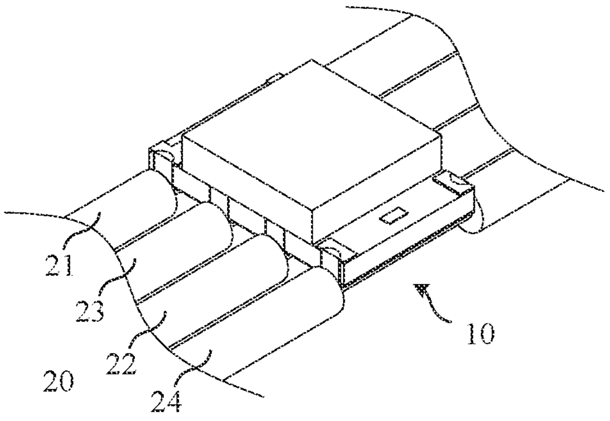
FIGS. 17*a* and 17*b* are schematic perspective views, taken from different viewing angles, showing a connection relationship between the LED lighting bead provided in the embodiments of the application and conductive lines.
Figure 17B:
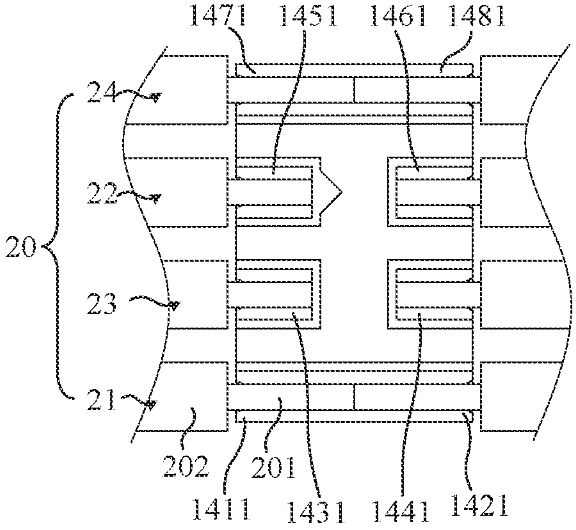

As shown in FIGS. 17*a* and 17*b*, the first lead 141 and the second lead 142 form a first lead pair and are electrically connected with a first conductive line 21; the third lead 143 and the fourth lead 144 form a second lead pair and are electrically connected with a third conductive line 23; the fifth lead 145 and the sixth lead 146 form a third lead pair and are connected with a second conductive line 22; the seventh lead 147 and the eighth lead 148 form a fourth lead pair and are connected with a fourth conductive line 24. Four conductive lines 20 are respectively the first conductive line 21, the second conductive line 22, the third conductive line 23, and the fourth conductive line 24, wherein the first conductive line 21 is a positive line; the second conductive line 22 is a positive line; the third conductive line 23 is a communication conductive line; and the fourth conductive line 24 is a negative line. Specifically, the first connecting portion 1411 of the first lead 141 and the second connecting portion 1421 of the second lead 142 are both in electrical connection with the first conductive line 21; the third connecting portion 1431 of the third lead 143 and the fourth connecting portion 1441 of the fourth lead 144 are both in electrical connection with the third conductive line 23; the fifth connecting portion 1451 of the fifth lead 145 and the sixth connecting portion 1461 of the sixth lead 146 are both in electrical connection with the second conductive line 22; the seventh connecting portion 1471 of the seventh lead 147 and the eighth connecting portion 1481 of the eighth lead 148 are both in electrical connection with the fourth conductive line 24. The conductive line core 201 of the third conductive line 23 that is located between the third connecting portion 1431 and the fourth connecting portion 1441 is cut off; the conductive line core 201 of the second conductive line 22 that is located between the fifth connecting portion 1451 and the sixth connecting portion 1461 is cut off.

In the embodiments of the application, since LED lighting beads that are manufacturing with the same operation would have essentially completely identical outside shapes, it is hard for processing of an LED lighting strip, and thus, the LED lighting bead 10 may further comprise a marking piece to identify different ones of the LED lighting bead. Illustratively, as shown in FIG. 11, the marking piece 112 is arranged on the insulation housing 11 to indicate different LED lighting beads for easing subsequent using of different LED lighting beads to make the LED lighting strip. The marking piece 112 can be different shapes to identify different ones of the LED lighting beads, such as rectangle, square, and triangle, and it is of course feasible to use different colors and signs.

Figure 18:
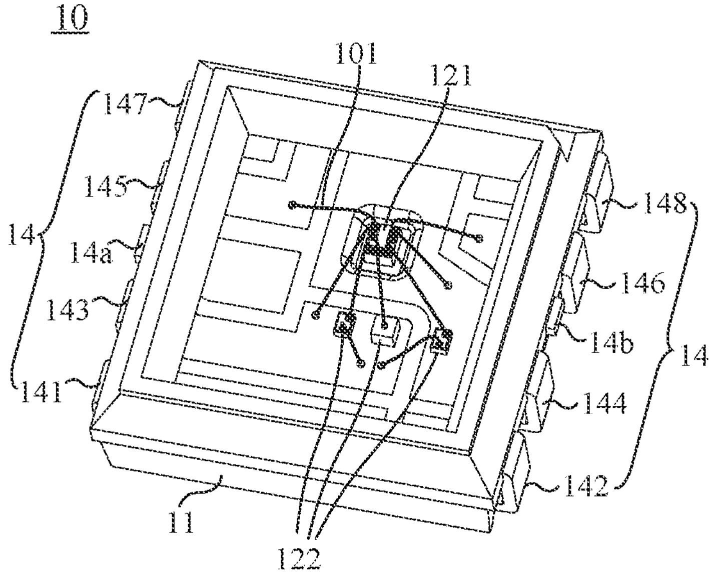
FIG. 18 is a schematic perspective view showing another LED lighting bead provided in the embodiments of the application.
Figure 19:
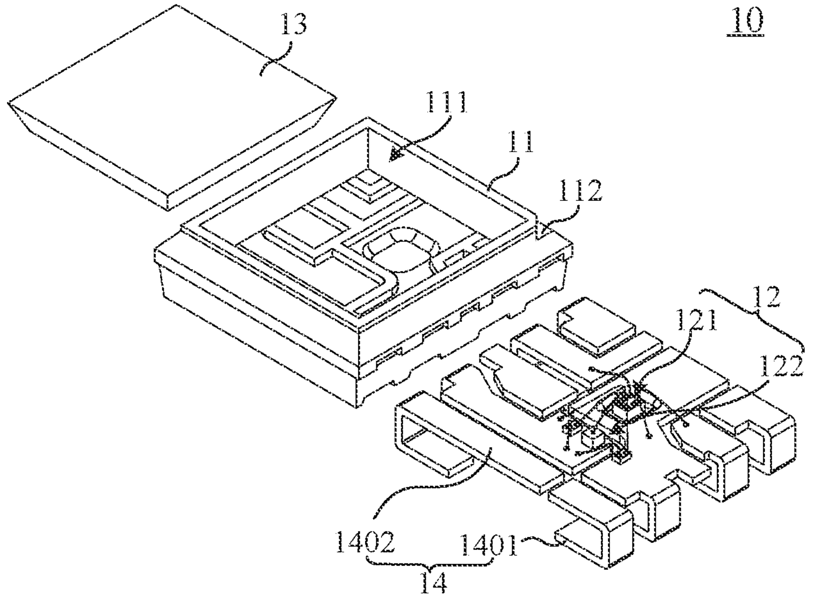
FIG. 19 is a schematic exploded view showing said another LED lighting bead provided in the embodiments of the application.

For Top-B bead, referring to FIGS. 18 and 19, FIGS. 18-19 provide schematic views showing another LED lighting bead provided in the embodiments of the application. As shown in FIGS. 18-19, the LED lighting bead 10 comprises an insulation housing 11, a light-emitting assembly 12, an encapsulation resin 13, and at least four pairs of leads 14.

Compared to Top-A bead, a difference of the LED lighting bead 10 resides in a structural arrangement of the chip-fixing portions of the at least four pairs of leads 14 and a connection relationship of the light-emitting assembly and the chip-fixing portions of the four pairs of leads. The following provides a detailed introduction for the difference. It is noted that the structures and arrangement locations of the insulation housing 11, the light-emitting assembly 12, the encapsulation resin 13, and the connecting portions of the at least four pairs of leads 14 can be the same as the structures and arrangement locations of the insulation housing 11, the light-emitting assembly 12, the encapsulation resin 13, and the connecting portions of the at least four pairs of leads 14 of Top-A bead, and can also be different. No detailed description will be provided herein.

Figure 20:
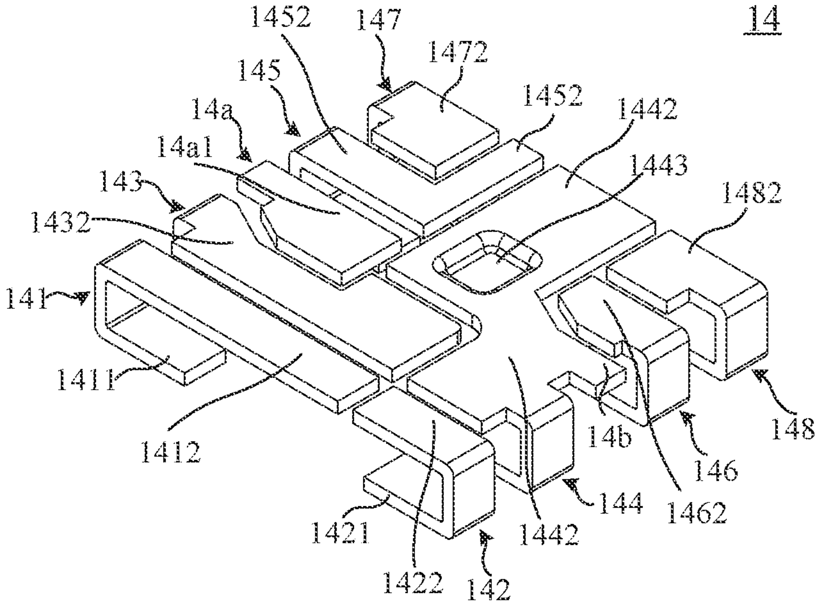
FIG. 20 is a schematic perspective view showing leads of the LED lighting bead provided in the embodiments of the application.

Referring also to FIG. 20, the four pairs of leads 14 are respectively a first lead 141, a second lead 142, a third lead 143, a fourth lead 144, a fifth lead 145, a sixth lead 146, a seventh lead 147, and an eighth lead 148, in which the first lead 141 and the second lead 142 form a first lead pair; the third lead 143 and the fourth lead 144 form a second lead pair; the fifth lead 145 and the sixth lead 146 form a third lead pair; and the seventh lead 147 and the eighth lead 148 form a fourth lead pair.

Figure 21:
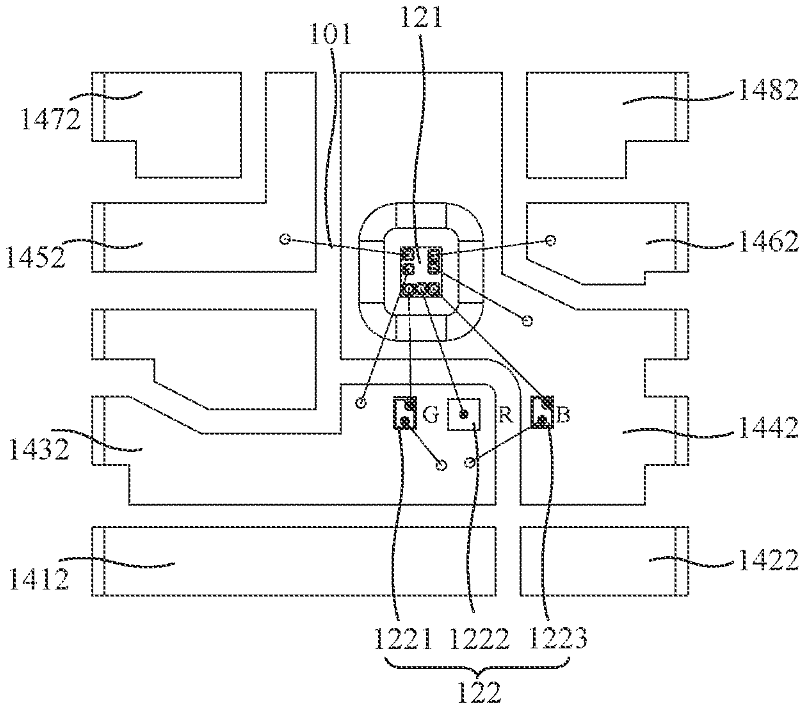
FIG. 21 is a schematic view showing a circuit connection relationship of the LED lighting bead provided in the embodiments of the application.

As shown in FIGS. 20 and 21, the first lead 141 comprises a first connecting portion 1411 and a first chip-fixing portion 1412, and the second lead 142 comprises a second connecting portion 1421 and a second chip-fixing portion 1422. The first connecting portion 1411 and the second connecting portion 1421 are electrically connected with a first conductive line. The first conductive line is a positive line. The first chip-fixing portion 1412 and the second chip-fixing portion 1422 are arranged at intervals. The third lead 143 comprises a third connecting portion 1431 and a third chip-fixing portion 1432, and the fourth lead 144 comprises a fourth connecting portion 1441 and a fourth chip-fixing portion 1442. A positive terminal VDD of a driving chip 121 is electrically connected by a bonding line 101 to the third chip-fixing portion 1432. A negative terminal GND of the driving chip 121 is electrically connected by a bonding line 101 to the fourth chip-fixing portion 1442. Dies 122 are electrically connected by bonding lines 101 to the driving chip 121. The third connecting portion 1431 and the fourth connecting portion 1441 are electrically connected with a second conductive line, and a portion of the second conductive line that is located between the third connecting portion 1431 and the fourth connecting portion 1441 is cut off. The second conductive line is a positive line. The fifth lead 145 comprises a fifth connecting portion 1451 and a fifth chip-fixing portion 1452, and the sixth lead 146 comprises a sixth connecting portion 1461 and a sixth chip-fixing portion 1462. The fifth chip-fixing portion 1452 is connected by a bonding line 101 to a signal input terminal Din of the driving chip 121. The sixth chip-fixing portion 1462 is connected by a bonding line 101 to a signal output terminal Dout of the driving chip 121. The fifth connecting portion 1451 and the sixth connecting portion 1461 are electrically connected with the third conductive line, and a portion of the third conductive line that is located between the fifth connecting portion 1451 and the sixth connecting portion 1461 is cut off. The third conductive line is a communication conductive line. The seventh lead 147 comprises a seventh connecting portion 1471 and a seventh chip-fixing portion 1472, and the eighth lead 148 comprises an eighth connecting portion 1481 and an eighth chip-fixing portion 1482. The seventh connecting portion 1471 and the eighth connecting portion 1481 are connected with a fourth conductive line. The fourth conductive line is a negative line. The seventh chip-fixing portion 1472 and the eighth chip-fixing portion 1482 are arranged at intervals, and may also be possibly integrated together as one piece. The connection relationship of the at least four pairs of leads 14 of the LED lighting bead 10 and the light-emitting assembly 12 allows the LED lighting bead 10 to easily assemble to make the LED lighting strip.

For the LED lighting bead 10 provided in the above embodiment, due to the arrangement of the four pairs of leads 14 and the connection relationship between the four pairs of leads 14 and the light-emitting assembly 12, the LED lighting bead 10 is allowed to connect, through four conductive lines, to other LED lighting beads, namely being allowed to be arranged orderly with other lighting beads on the four conductive lines, so that when observed from outside appearance, the multiple LED lighting beads are arranged on the four conductive lines to form an LED light string, yet the circuit connection involves serial connection and parallel connection, while in the communication connection relationship, each of the LED lighting beads is connected in series for easy control. Consequently, processing of the LED lighting strip becomes easier, and power supply with a high voltage to the LED lighting strip, long distance cascade connection and diversification of lighting, such as lighting fashions of a running light and a revolving lantern, can all be realized.

In some embodiments, as shown in FIG. 20, the LED lighting bead 10 further comprises: a first transition lead **14*a* and a second transition lead 14*b*, wherein a chip-fixing portion of the second transition lead 14*b* and the fourth chip-fixing portion 1442 are integrally formed together as one piece, and it can be regarded as the second transition lead 14*b* being extended from the fourth chip-fixing portion 1442 toward outside of the insulation housing so as to form a symmetric structure with respect to the first transition lead 14*a*, making processing easy. The arrangement of the first transition lead 14*a*** provides a transition portion for electronic components not easily solderable to the LED lighting bead to thereby improve the easiness of electrically connecting with an electronic component.

In the embodiments of the application, the third chip-fixing portion 1432 or the fourth chip-fixing portion 1442 is provided with a single one or multiple ones of die 122 arranged thereon; the die(s) 122 are set in electrical connection with the driving chip 121 by means of bonding lines 101; the die(s) 122 are also electrically connected to the third chip-fixing portion 1432 by means of a bonding line 101, or alternatively, the die(s) 122 are electrically connected to the third chip-fixing portion 1432 by means of bonding contact. Since the third chip-fixing portion 1432 and the fourth chip-fixing portion 1442 are provided with dies arranged thereon, subsequent manufacture of the LED lighting strip can be realized, and the length of the bonding line can be saved, and the product reliability and service life are enhanced.

Illustratively, as shown in FIG. 21, the third chip-fixing portion 1432 is provided with a green light chip 1221 and a red light chip 1222 arranged thereon, and the fourth chip-fixing portion 1442 is provided with a blue light chip 1223 arranged thereon, wherein the green light chip 1221 is electrically connected by bonding lines 101 to the third chip-fixing portion 1432 and the driving chip 121, specifically being electrically connected to a G control terminal of the driving chip 121; the red light chip 1222 is electrically connected by a bonding line 101 to the driving chip 121, specifically being electrically connected to an R control terminal of the driving chip 121, and is electrically connected to the third chip-fixing portion 1432 by means of bonding contact, such as being connected by means of bonding contact with conductive silver paste; the blue light chip 1223 is electrically connected by bonding lines 101 to the driving chip 121 and the third chip-fixing portion 1432, and specifically, the blue light chip 1223 is connected by a bonding line 101 to a B control terminal of the driving chip 121.

In some embodiments, the blue light chip 1223 is arranged on the fourth chip-fixing portion 1442 at a location adjacent to the third chip-fixing portion 1432, so that the blue light chip 1223 is close to the dies arranged on the third chip-fixing portion 1432, so as to realize better combinations for multiple colors, making the lighting effect of the LED lighting bead more diversified and lighting being more uniform, and saving bonding line and improving product reliability and service life, not only lowering product cost, and also enhancing an effect of combined lighting and color mixing of the LED lighting bead.

Illustratively, as shown in FIG. 21, the driving chip 121 can also be disposed on the fourth chip-fixing portion 1442, and can of course also be disposed on the other chip-fixing portions. A portion of the fourth chip-fixing portion 1442 on which the driving chip 121 is disposed is located among the third chip-fixing portion 1432, the fifth chip-fixing portion 1452, and the sixth chip-fixing portion 1462. This saves bonding line and improves product reliability and service life.

In some embodiments, as shown in FIG. 20, a chip mounting trough 1403 is further formed in the fourth chip-fixing portion 1442, and the driving chip 121 is arranged in the chip mounting trough 1403. Since a trough bottom of the chip mounting trough 1403 is lower than the other ones of the chip-fixing portions, the driving chip 121 is allowed to sink onto the bottom of the chip mounting trough 1403. This ensures that the dies 122 are located above the driving chip 121 to prevent the driving chip from shielding light from the dies 122 and thus effectively increase luminance of the LED lighting bead. And, also, the location of the highest site where a bonding line may be connected to the driving chip 121 is lowered to thereby reduce a length of the bonding line 101 so used, saving the fabrication cost of the LED lighting bead.

In some embodiments, a distance by which the trough bottom of the chip mounting trough 1403 is spaced from other chip-fixing portions can be set as a predetermined distance. The predetermined distance can be of any size that is smaller than a thickness of the driving chip 121, and the purpose of this is to allow the driving chip 121 to sink down to the very bottom of the recessed compartment 111. This ensures that the dies 122 are located above the driving chip 121 to prevent the driving chip 121 from shielding light from the dies 122, so as to effectively increase the luminance of the LED lighting bead, without increase of the fabrication cost of the LED structure.

Further, the LED encapsulation structure is made of a combination of inorganic and organic materials. Since thermal expansion coefficients of the inorganic material and the organic material are different, the stresses generated by the inorganic material and the organic material are also different, this consequently leading to line punching or breaking of the bonding line 101. The application reduces the use length of the bonding line 101, so as to reduce a striking force acting on the bonding line 101 in subsequent operations, so as to avoid defects of line punching or breaking of the bonding line 101.

Figure 22:
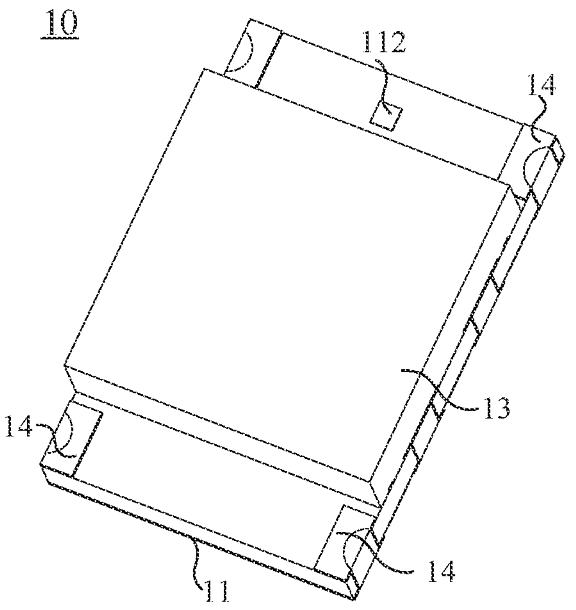
FIG. 22 is a schematic perspective view showing another LED lighting bead provided in the embodiments of the application.
Figure 23:
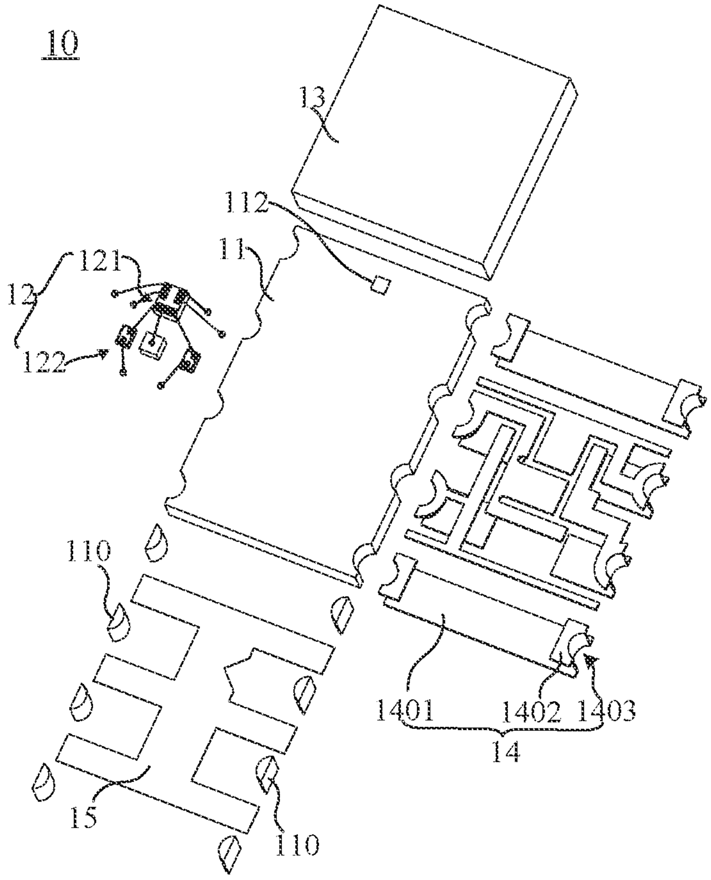
FIG. 23 is a schematic exploded view showing said another LED lighting bead provided in the embodiments of the application.

For Chip-B bead, referring to FIGS. 22 and 23, FIGS. 22-23 provide schematic views showing another LED lighting bead. As shown in FIG. 22-23, the LED lighting bead 10 comprises an insulation housing 11, a light-emitting assembly 12, an encapsulation resin 13, and at least four pairs of leads 14.

Compared to Chip-A bead, a difference of the LED lighting bead 10 resides in a structural arrangement of the chip-fixing portions of the at least four pairs of leads 14 and a connection relationship of the light-emitting assembly and the chip-fixing portions of the four pairs of leads 14. The following provides a detailed introduction for the difference. It is noted that the structures and locations of the insulation housing 11, the light-emitting assembly 12, the encapsulation resin 13, and the connecting portions of the at least four pairs of leads 14 can be the same as the structures and locations of the insulation housing 11, the light-emitting assembly 12, the encapsulation resin 13, and the connecting portions of the at least four pairs of leads 14 of Chip-A bead, and can also be different. No detailed description will be provided herein.

Figure 24:
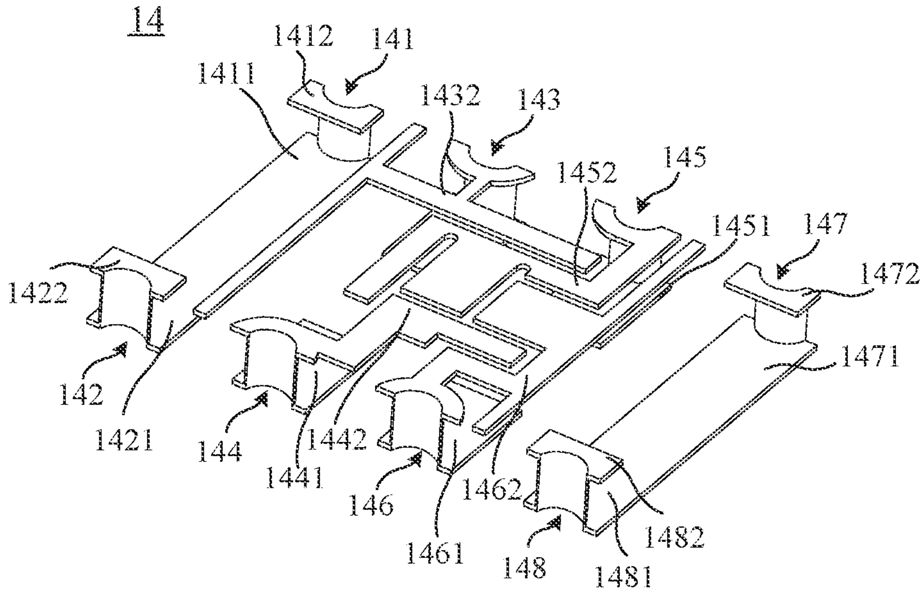
FIG. 24 is a schematic perspective view showing leads of the LED lighting bead provided in the embodiments of the application.
Figure 25:
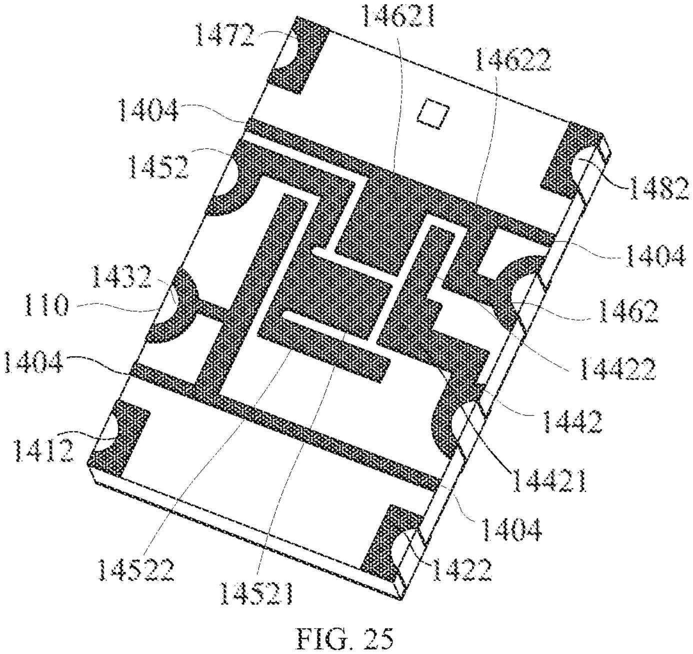
FIG. 25 is a schematic view showing an effect of filling for the lead of the LED lighting bead provided in the embodiments of the application.

Referring also to FIGS. 24 and 25, the at least four pairs of leads 14 are respectively a first lead 141, a second lead 142, a third lead 143, a fourth lead 144, a fifth lead 145, a sixth lead 146, a seventh lead 147, and an eighth lead 148, in which the first lead 141 and the second lead 142 form a first lead pair; the third lead 143 and the fourth lead 144 form a second lead pair; the fifth lead 145 and the sixth lead 146 form a third lead pair; and the seventh lead 147 and the eighth lead 148 form a fourth lead pair.

In the arrangement, connecting portions of the first lead 141 and the second lead 142 are both electrically connected with a first conductive line; connecting portions of the third lead 143 and the fourth lead 144 are both electrically connected with a third conductive line; connecting portions of the fifth lead 145 and the sixth lead 146 are both electrically connected with a second conductive line; connecting portions of the seventh lead 147 and the eighth lead 148 are both electrically connected with a fourth conductive line. The first conductive line is a positive line; the second conductive line is a positive line; the third conductive line is a communication conductive line; the fourth conductive line is a negative conductive line. A portion of a conductive line core of the third conductive line that is located between the connecting portions of the third lead 143 and the fourth lead 144 is cut off, and a portion of a conductive line core of the second conductive line that is located between the connecting portions of the fifth lead 145 and the sixth lead 146 is cut off.

Figure 26:
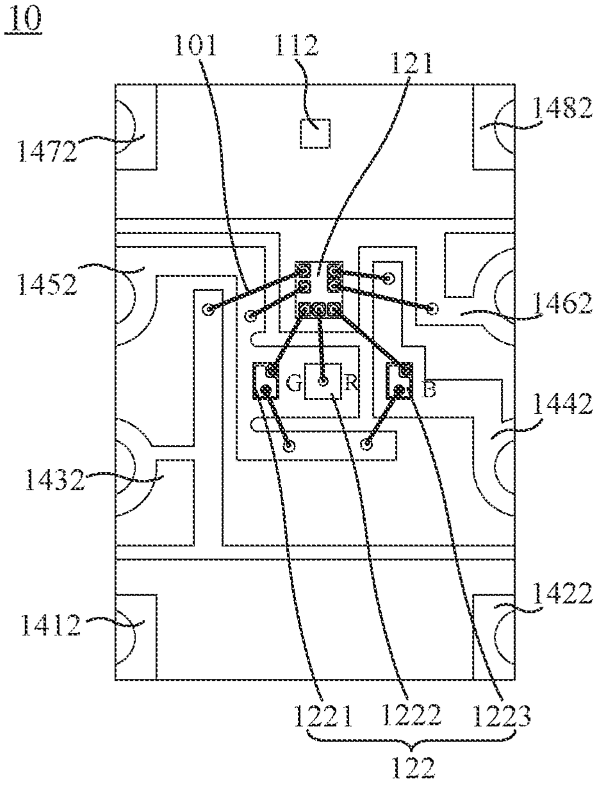
FIG. 26 is a schematic view showing a circuit connection relationship of the LED lighting bead provided in the embodiments of the application.

Referring also to FIG. 26, the first lead 141 comprises a first connecting portion 1411 and a first chip-fixing portion 1412, and the second lead 142 comprises a second connecting portion 1421 and a second chip-fixing portion 1422. The first connecting portion 1411 and the second connecting portion 1421 are both electrically connected with the first conductive line. The first connecting portion 1411 and the second connecting portion 1421 can be arranged at intervals, and can also be of an integrally-formed one-piece arrangement. The integrally-formed one-piece arrangement improves the reliability of electrical connection with the first conductive line. The third lead 143 comprises a third connecting portion 1431 and a third chip-fixing portion 1432, and the fourth lead 144 comprises a fourth connecting portion 1441 and a fourth chip-fixing portion 1442. The third chip-fixing portion 1432 is connected by a bonding line 101 to a signal input terminal Din of the driving chip 121. The fourth chip-fixing portion 1442 is connected by a bonding line 101 to a signal output terminal of the driving chip 121. The third connecting portion 1431 and the fourth connecting portion 1441 are electrically connected with the third conductive line, and a portion of the conductive line core of the third conductive line that is located between the third connecting portion 1431 and the fourth connecting portion 1441 is cut off. The fifth lead 145 comprises a fifth connecting portion 1451 and a fifth chip-fixing portion 1452, and the sixth lead 146 comprises a sixth connecting portion 1461 and a sixth chip-fixing portion 1462. A positive terminal VDD of the driving chip 121 is electrically connected by a bonding line 101 to the fifth chip-fixing portion 1452. A negative terminal GND of the driving chip 121 is electrically connected by a bonding line 101 to the sixth chip-fixing portion 1462. The dies 122 are electrically connected by bonding lines 101 to the fifth chip-fixing portion 1452. The fifth connecting portion 1451 and the sixth connecting portion 1461 are electrically connected to the second conductive line. A portion of the conductive line core of the second conductive line that is located between the fifth connecting portion 1451 and the sixth connecting portion 1461 is cut off. The seventh lead 147 comprises a seventh connecting portion 1471 and a seventh chip-fixing portion 1472, and the eighth lead 148 comprises an eighth connecting portion 1481 and an eighth chip-fixing portion 1482. The seventh connecting portion 1471 and the eighth connecting portion 1481 are electrically connected to the fourth conductive line.

For the LED lighting bead 10 provided in the above embodiment, due to the arrangement of the four pairs of leads 14 and the connection relationship between the four pairs of leads 14 and the light-emitting assembly 12, the LED lighting bead 10 is allowed to connect, through four conductive lines, to other LED lighting beads, namely being allowed to be arranged orderly with other lighting beads on the four conductive lines, so that when observed from outside appearance, the multiple LED lighting beads are arranged on the four conductive lines to form an LED light string, yet the circuit connection involves serial connection and parallel connection, while in the communication connection relationship, each of the LED lighting beads is connected in series for easy control. Consequently, processing of the LED lighting strip becomes easier, and power supply with a high voltage to the LED lighting strip, long distance cascade connection and diversification of lighting, such as lighting fashions of a running light and a revolving lantern, can all be realized.

In some embodiments, the fifth chip-fixing portion 1452 is provided with a single one or multiple ones of die 122 arranged thereon; the die(s) 122 are set in electrical connection with the driving chip 121 by means of bonding lines 101; the die(s) 122 are also electrically connected to the fifth chip-fixing portion 1452 by means of a bonding line 101, or alternatively, the die(s) 122 are electrically connected to the fifth chip-fixing portion 1452 by means of bonding contact. It is appreciated that the die(s) 122 can be arranged on the chip-fixing portions of the other ones of the leads.

Illustratively, as shown in FIG. 26, the fifth chip-fixing portion 1452 is provided with a green light chip 1221 and a red light chip 1222, wherein the green light chip 1221 is electrically connected by bonding lines 101 to the fifth chip-fixing portion 1452 and the driving chip 121, specifically being electrically connected to a G control terminal of the driving chip 121; the red light chip 1222 is electrically connected by a bonding line 101 to the driving chip 121, specifically being electrically connected to an R control terminal of the driving chip 121, and is electrically connected to the fifth chip-fixing portion 1452 by means of bonding contact.

In some embodiments, as shown in FIG. 25, reference being also had to FIG. 26, the fifth chip-fixing portion 1452 at least comprises a third arrangement portion 14521 and a fourth arrangement portion 14522 that are arranged at intervals. The third arrangement portion 14521 receives the green light chip 1221 and the red light chip 1222 arranged thereon. The fourth arrangement portion 14522 receives a connection point of the bonding line arranged thereon. Since the bottoms of the blue light chip and the green light chip are connected, through bonding glue, to the chip-fixing portions, the bonding blue is an organic substance, which releases internal stress and expanded during thermal expansion, so as to readily result in delamination (or stripping) of two surrounding solder bonding points (the bonding line connection points) to cause failure of electrical connection. Thus, the third arrangement portion 14521 and the fourth arrangement portion 14522 being arranged at intervals can effectively prevent extension of delamination stripping to thereby effectively protect the secureness of the soldering points and improve the product reliability.

In some embodiments, as shown in FIG. 26, the fourth chip-fixing portion 1442 can also be provided with a die 122 arranged thereon. The die 122 is electrically connected by a bonding line 101 to the fifth chip-fixing portion 1452, and the die 122 is also electrically connected by a bonding line 101 to the driving chip 121. Specifically, for example, the die 12 arranged on the fourth chip-fixing portion 1442 is a blue light chip 1223, and the blue light chip 1223 is disposed on the fourth chip-fixing portion 1442 at a location adjacent to the fifth chip-fixing portion 1452, so that the blue light chip 1223 is close to the dies 122 arranged on the fifth chip-fixing portion 1452. As such, different ones of the dies 122 may combine to form various different colors, so that not only the product cost is reduced and the product reliability is enhanced, but an effect of combined lighting and color mixing of the LED lighting bead is also enhanced.

In some embodiments, the sixth chip-fixing portion 1462 is provided with the driving chip 121 arranged thereon. An area of the sixth chip-fixing portion 1462 in which the driving chip 121 is arranged in located between the fourth chip-fixing portion and the fifth chip-fixing portion.

In some embodiments, as shown in FIG. 26, the driving chip 121 may also be arranged on the sixth chip-fixing portion 1462. An area of the sixth chip-fixing portion 1462 in which the driving chip 121 is arranged in located between the fourth chip-fixing portion 1442 and the fifth chip-fixing portion 1452. Specifically, it can be regarded as the sixth chip-fixing portion 1462 having at least a portion extended between the fourth chip-fixing portion 1442 the fifth chip-fixing portion 1452, and consequently, the distance between the driving chip 121 and the other chip-fixing portions or the dies on the other chip-fixing portions, so as to ease connection with bonding lines, and also to provide reliability and service life of product.

In some embodiments, to further enhance product reliability and service life, as shown in FIGS. 25 and 26, in designing the sixth chip-fixing portion 1462, the sixth chip-fixing portion 1462 can be arranged to comprise a first disposition portion 14621 and a second disposition portion 14622 that are arranged at intervals. The first disposition portion 14621 is connected to the second disposition portion 14622, and specifically, it can be regarded as the first disposition portion 14621 and the second disposition portion 14622 being of an integrated arrangement. The first disposition portion 14621 receives the driving chip 121 to dispose thereon, and the second disposition portion 14622 receives a bonding line connection point to be arranged thereon. A portion between the first disposition portion 14621 and the second disposition portion 14622 is a spacing area, and consequently, heat of the driving chip 121 is prevented from causing peeling of the bonding line connection point from the second disposition portion 14622, and thus extension of delamination stripping can be effectively prevented to effectively protect the secureness of the soldering point and improving product reliability. Correspondingly, the fourth chip-fixing portion 1442 comprises a die disposition portion 14021 and a bonding line connection point disposition portion 14022 extending from the die disposition portion 14021. Consequently, the distance between the driving chip and the chip-fixing portion to which a bonding line is connected can be further reduced to thereby save cost and improve product reliability.

In some embodiments, since the connecting portions and the chip-fixing portions of the leads 14 must be subjected to electroplating through an electroplating operation, or for electrical connection made with a via, electroplating may also be needed for plated through hole, to simplify the electroplating operation, the chip-fixing portion of one or multiple of the leads 14 is provided with a conductive electrode 1404. The conductive electrode 1404 is extended from the chip-fixing portion of each one of the leads to an edge of the insulation housing 11. Illustratively, as shown in FIG. 25, the third chip-fixing portion 1432 and the sixth chip-fixing portion 1462 both comprise a conductive electrode 1404.

In Chip-B bead provided in the embodiments of the application, as shown in FIG. 23, the LED lighting bead 10 may further comprise an isolation board 15. The isolation board 15 is specifically a bismaleimide-triazine (BT) board, which is also referred to as a resin substrate. The isolation board 15 is specifically arranged on the bottom of the insulation housing 11 to isolate the connecting portion of each of the leads 14, preventing shorting caused by solder balls in a subsequent operation of soldering and connecting the LED lighting bead and the conductive lines. Since the surface of the insulation housing 11 is rough, if no isolation board 15 is used, it is quite easy to cause shorting in soldering the connecting portions of the leads 14 and the conductive lines.

Figure 27:
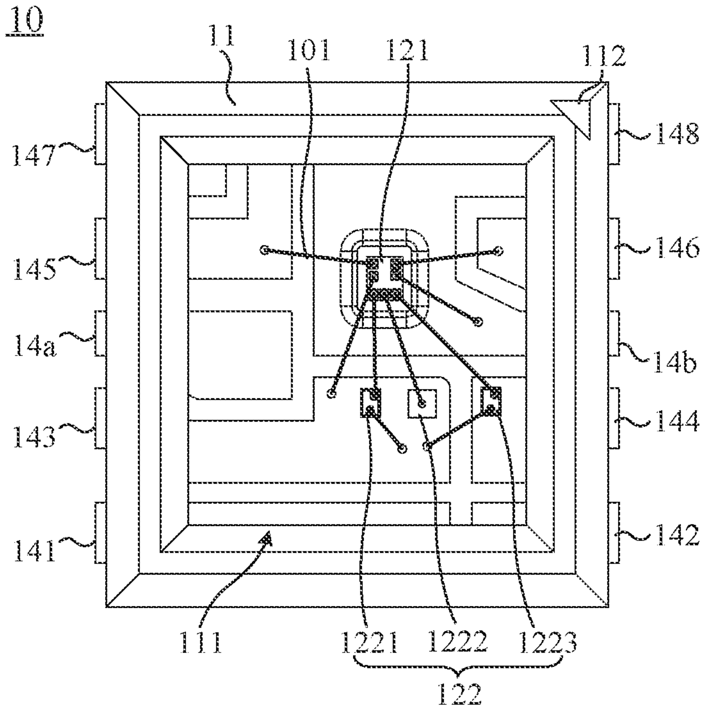
FIG. 27 is a schematic perspective view showing another LED lighting bead provided in the embodiments of the application.
Figure 28:
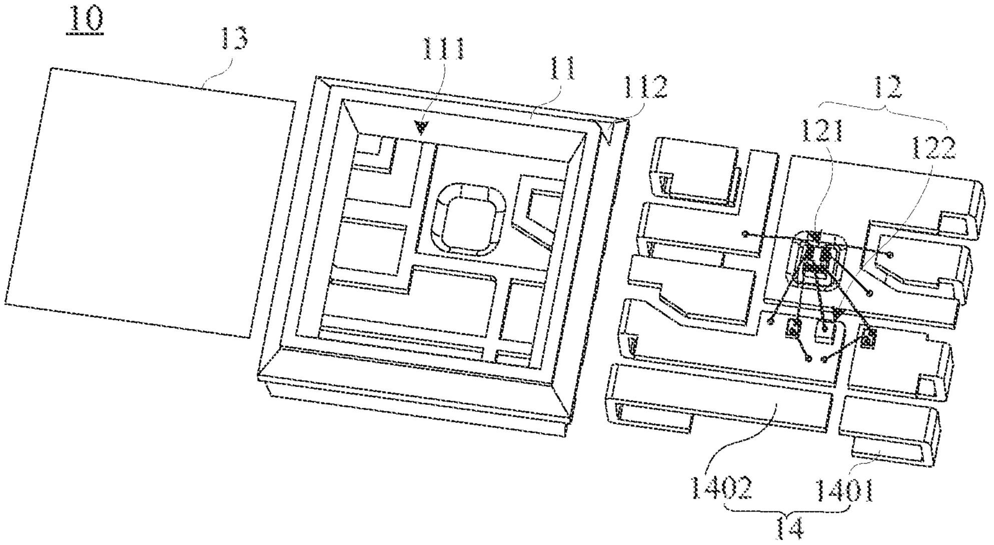
FIG. 28 is a schematic exploded view showing said another LED lighting bead provided in the embodiments of the application.

For Top-C bead, referring to FIGS. 27 and 28, FIGS. 27-28 provide schematic views showing another LED lighting bead provided in the embodiments of the application. As shown in FIGS. 27-28, the LED lighting bead 10 comprises an insulation housing 11, a light-emitting assembly 12, an encapsulation resin 13, and at least four pairs of leads 14.

Compared to Top-A bead, a difference of the LED lighting bead 10 resides in a structural arrangement of the chip-fixing portions of the at least four pairs of leads 14 and a connection relationship of the light-emitting assembly and the chip-fixing portions of the four pairs of leads. The following provides a detailed introduction for the difference. It is noted that the structures and arrangement locations of the insulation housing 11, the light-emitting assembly 12, the encapsulation resin 13, and the connecting portions of the at least four pairs of leads 14 can be the same as the structures and arrangement locations of the insulation housing 11, the light-emitting assembly 12, the encapsulation resin 13, and the connecting portions of the at least four pairs of leads 14 of Top-A bead, and can also be different. No detailed description will be provided herein.

Figure 29:
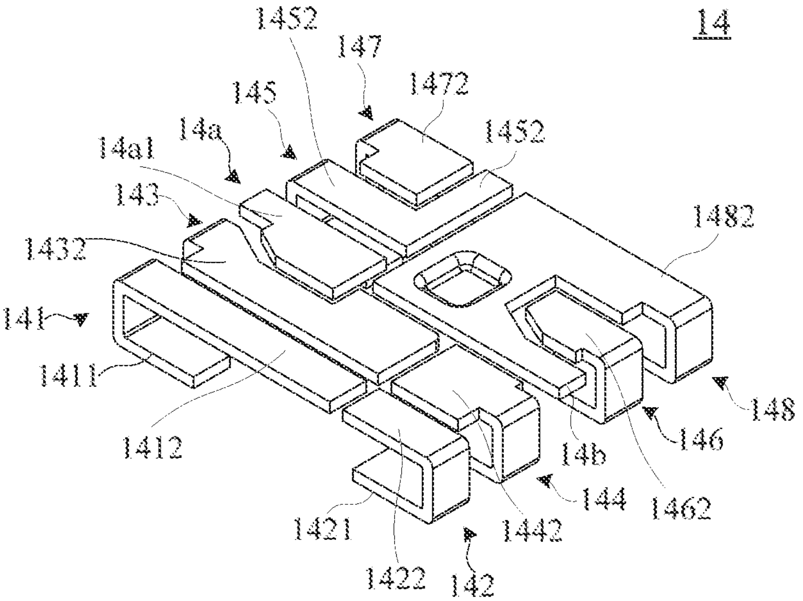
FIG. 29 is a schematic perspective view showing leads of the LED lighting bead provided in the embodiments of the application.

Referring also to FIG. 29, the at least four pairs of leads 14 are respectively a first lead 141, a second lead 142, a third lead 143, a fourth lead 144, a fifth lead 145, a sixth lead 146, a seventh lead 147, and an eighth lead 148, in which the first lead 141 and the second lead 142 form a first lead pair; the third lead 143 and the fourth lead 144 form a second lead pair; the fifth lead 145 and the sixth lead 146 form a third lead pair; and the seventh lead 147 and the eighth lead 148 form a fourth lead pair.

The first lead pair is electrically connected to a first conductive line, namely connecting portions of the first lead 141 and the second lead 142 are both in electrical connection with the first conductive line; the second lead pair is connected to a second conductive line, namely connecting portions of the third lead 143 and the fourth lead 144 are both in electrical connection with the second conductive line; the third lead pair is connected to the third conductive line, namely connecting portions of the fifth lead 145 and the sixth lead 146 are both in electrical connection with the third conductive line; the fourth lead pair is connected to the fourth conductive line, namely connecting portions of the seventh lead 147 and the eighth lead 148 are both in electrical connection with the fourth conductive line. The first conductive line is a positive line; the second conductive line is a positive line; the third conductive line is a communication conductive line; and the fourth conductive line is a negative line. A portion of a conductive line core of the second conductive line that is located between the connection portions of the third lead 143 and the fourth lead 144 is cut off, and a portion of a conductive line core of the third conductive line that is located between the connecting portions of the fifth lead 145 and the sixth lead 146 is cut off.

Figure 30:
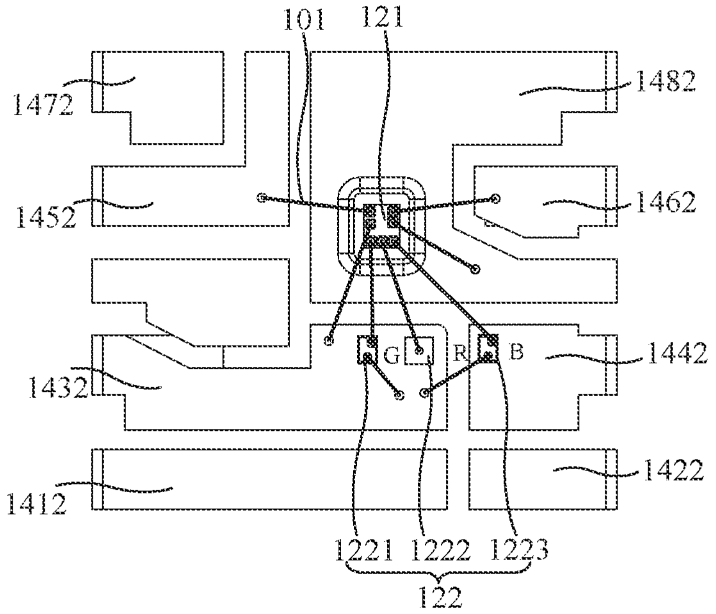
FIG. 30 is a schematic view showing a circuit connection relationship of the LED lighting bead provided in the embodiments of the application.

As shown in FIG. 30, reference being also had to FIG. 29, the first lead 141 comprises a first connecting portion 1411 and a first chip-fixing portion 1412, and the second lead 142 comprises a second connecting portion 1421 and a second chip-fixing portion 1422. The first connecting portion 1411 and the second connecting portion 1421 are connected with the first conductive line. The first chip-fixing portion 1412 and the second chip-fixing portion 1422 are arranged at intervals, or are integrated together as one piece. The third lead 143 comprises a third connecting portion 1431 and a third chip-fixing portion 1432, and the fourth lead 144 comprises a fourth connecting portion 1441 and a fourth chip-fixing portion 1442. A positive terminal VDD of the driving chip 121 is electrically connected by a bonding line 101 to the third chip-fixing portion 1432. Dies 122 are electrically connected with the third chip-fixing portion 1432. The third connecting portion 1431 and the fourth connecting portion 1441 are electrically connected with the second conductive line. A portion of a conductive line core of the second conductive line that is located between the third connecting portion 1431 and the fourth connecting portion 1441 is cut off. The fifth lead 145 comprises a fifth connecting portion 1451 and a fifth chip-fixing portion 1452, and the sixth lead 146 comprises a sixth connecting portion 1461 and a sixth chip-fixing portion 1462. The fifth chip-fixing portion 1452 is electrically connected by a bonding line 101 to a signal input terminal Din of the driving chip 121. The sixth chip-fixing portion 1462 is connected by a bonding line 101 to a signal output terminal of the driving chip 121 Dout. The fifth connecting portion 1451 and the sixth connecting portion 1461 are electrically connected with the third conductive line. A portion of a conductive line core of the third conductive line that is located between the fifth connecting portion 1451 and the sixth connecting portion 1461 is cut off. The seventh lead 147 comprises a seventh connecting portion 1471 and a seventh chip-fixing portion 1472, and the eighth lead 148 comprises an eighth connecting portion 1481 and an eighth chip-fixing portion 1482. The eighth chip-fixing portion 1482 is electrically connected by a bonding line 101 to a negative terminal GND of the driving chip 121. The seventh connecting portion 1471 and the eighth connecting portion 1481 are connected with a fourth communication line.

For the LED lighting bead 10 provided in the above embodiment, due to the arrangement of the four pairs of leads 14 and the connection relationship between the four pairs of leads 14 and the light-emitting assembly 12, the LED lighting bead 10 is allowed to connect, through four conductive lines, to other LED lighting beads, namely being allowed to be arranged orderly with other lighting beads on the four conductive lines, so that when observed from outside appearance, the multiple LED lighting beads are soldered on the four conductive lines to form an LED light string, yet the circuit connection involves serial connection and parallel connection, while in the communication connection relationship, each of the LED lighting beads is connected in series for easy control. Consequently, processing of the LED lighting strip becomes easier, and power supply with a high voltage to the LED lighting strip, long distance cascade connection and diversification of lighting, such as lighting fashions of a running light and a revolving lantern, can all be realized.

In some embodiments, as shown in FIG. 29, the LED lighting bead 10 further comprises a first transition lead 14*a* and a second transition lead 14*b*. A chip-fixing portion of the second transition lead and the eighth chip-fixing portion 1482 are integrally formed together as one piece, and it can be regarded as the second transition lead 14*b* being extended out from the eighth chip-fixing portion 1482. The first transition lead 14*a* and the second transition lead 14*b* are exposed on two sides of the insulation housing of the LED lighting bead and are symmetric, yet the first transition lead 14*a* and the second transition lead 14*b* are also set in electrical connection with external conductive lines.

In some embodiments, the sixth chip-fixing portion 1462 of the sixth lead 146 is located between the chip-fixing portion of the second transition lead 14*b* and the eighth chip-fixing portion 1482. Such a structural arrangement not only enhance the secureness of the sixth lead 146, the eighth lead 148 and the insulation housing 11, but also saves bonding line to thereby improve product reliability and service life.

In some embodiments, the third chip-fixing portion 1432 or the fourth chip-fixing portion 1442 is provided with a single one or multiple ones of die 122 arranged thereon. The die(s) 122 are set in electrical connection with the driving chip 121 by means of bonding lines 101. The die(s) 122 are also electrically connected to the third chip-fixing portion 1432 by means of bonding lines 101, or alternatively, the die(s) 122 are electrically connected to the third chip-fixing portion 1432 by means of bonding contact.

Illustratively, as shown in FIG. 30, the third chip-fixing portion 1432 is provided with a green light chip 1221 and a red light chip 1222 arranged thereon, and the fourth chip-fixing portion 1442 is provided with a blue light chip 1223 arranged thereon, wherein the green light chip 1221 is electrically connected by bonding lines 101 to the third chip-fixing portion 1432 and the driving chip 121, specifically being connected to a G control terminal of the driving chip 121; the red light chip 1222 is electrically connected by a bonding line 101 to the driving chip 121, specifically being connected by the bonding line 101 to an R control terminal of the driving chip 121, and the red light chip 1222 is electrically connected with the third chip-fixing portion 1432 by means of bonding contact; the blue light chip 1223 is electrically connected by bonding lines 101 to a B control terminal of the driving chip 121 and the third chip-fixing portion 1432.

In some embodiments, as shown in FIG. 30, the blue light chip 1223 is arranged on the fourth chip-fixing portion 1442 at a location adjacent to the third chip-fixing portion 1432, so that the blue light chip 1223 is close to the dies 122 arranged on the third chip-fixing portion 1432. As such, the green light chip 1221, the red light chip 1222, and the blue light chip 1223 can be combined to provide more colors, not only lowering product cost and enhancing product reliability, but also enhancing an effect of combined lighting and color mixing of the LED lighting bead.

In some embodiments, the eighth chip-fixing portion 1482 is provided with the driving chip 121 arranged thereon. A portion of the eighth chip-fixing portion on which the driving chip 121 is located among the third chip-fixing portion 1432, the fifth chip-fixing portion 1452, and the sixth chip-fixing portion 1462. This saves bonding line and improves product reliability and service life.

In some embodiments, the eighth chip-fixing portion 1482 comprises a chip mounting trough, and the driving chip 121 is arranged in the chip mounting trough. Since a trough bottom of the chip mounting trough 1403 is lower than the other ones of the chip-fixing portions, the driving chip 121 is allowed to sink onto the bottom of the chip mounting trough 1403. This ensures that the dies 122 are located above the driving chip 121 to prevent the driving chip from shielding light from the dies 122 and thus effectively increase luminance of the LED lighting bead. Since the altitude of the driving chip 121 is relatively high, the location of the highest site where a bonding line may be connected to the driving chip 121 is lowered to thereby reduce a length of the bonding line 101 so used, saving the fabrication cost of the LED lighting bead.

Figure 31:
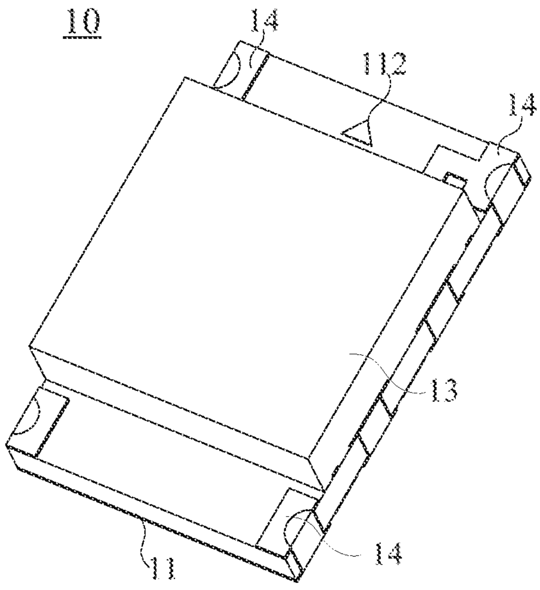
FIG. 31 is a schematic perspective view showing another LED lighting bead provided in the embodiments of the application.
Figure 32:
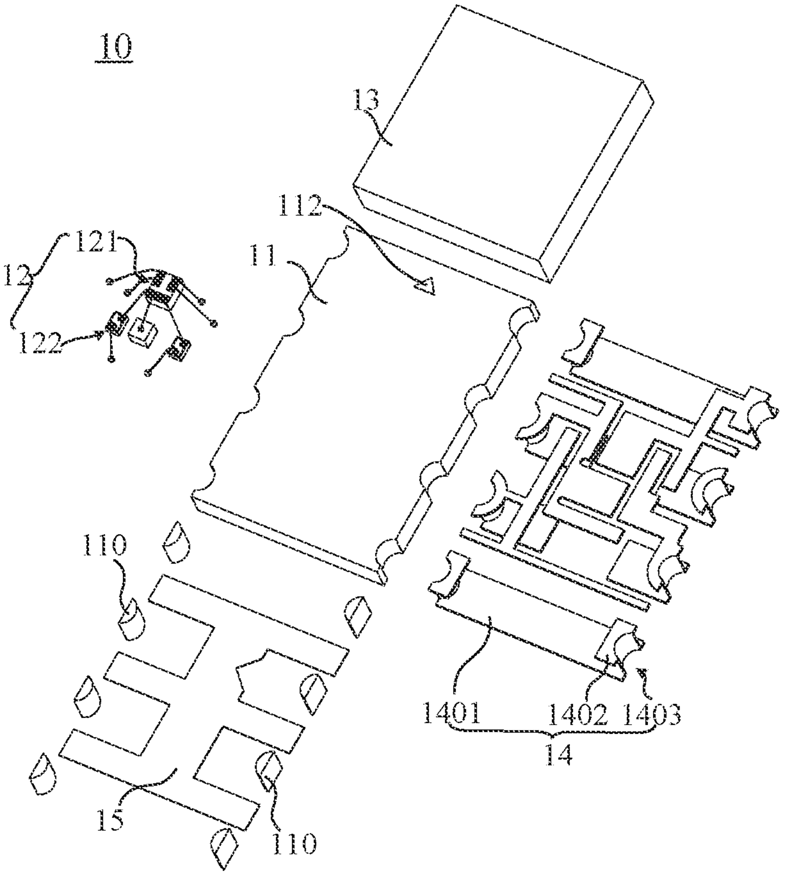
FIG. 32 is a schematic exploded view showing said another LED lighting bead provided in the embodiments of the application.

For Chip-C bead, referring to FIGS. 31 and 32, FIGS. 31-32 provide schematic views showing another LED lighting bead. As shown in FIGS. 31-32, the LED lighting bead 10 comprises an insulation housing 11, a light-emitting assembly 12, an encapsulation resin 13, and at least four pairs of leads 14.

Compared to Chip-A bead, a difference of the LED lighting bead 10 resides in a structural arrangement of the chip-fixing portions of the at least four pairs of leads 14 and a connection relationship of the light-emitting assembly and the chip-fixing portions of the four pairs of leads 14. The following provides a detailed introduction for the difference. It is noted that the structures and locations of the insulation housing 11, the light-emitting assembly 12, the encapsulation resin 13, and the connecting portions of the at least four pairs of leads 14 can be the same as the structures and locations of the insulation housing 11, the light-emitting assembly 12, the encapsulation resin 13, and the connecting portions of the at least four pairs of leads 14 of Chip-A bead, and can also be different. No detailed description will be provided herein.

Figure 33:
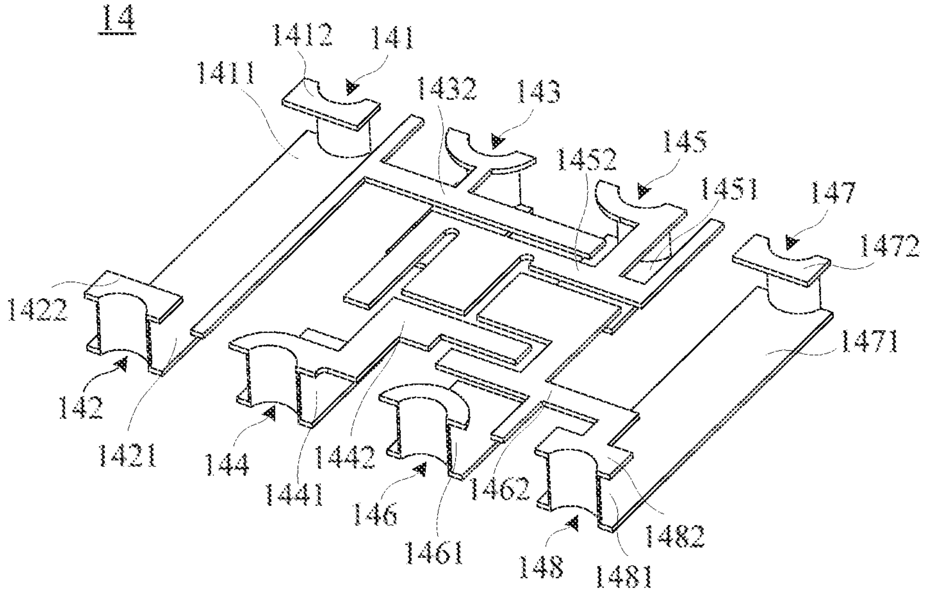
FIG. 33 is a schematic perspective view showing leads of the LED lighting bead provided in the embodiments of the application.
Figure 34:
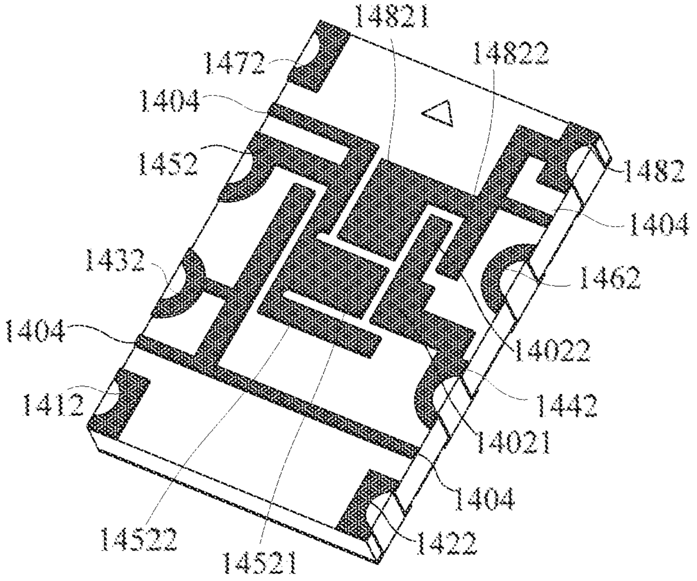
FIG. 34 is a schematic view showing an effect of hatching on the leads of the LED lighting bead provided in the embodiments of the application.

Referring also to FIGS. 33 and 34, the at least four pairs of leads 14 are respectively a first lead 141, a second lead 142, a third lead 143, a fourth lead 144, a fifth lead 145, a sixth lead 146, a seventh lead 147, and an eighth lead 148, in which the first lead 141 and the second lead 142 form a first lead pair; the third lead 143 and the fourth lead 144 form a second lead pair; the fifth lead 145 and the sixth lead 146 form a third lead pair; and the seventh lead 147 and the eighth lead 148 form a fourth lead pair.

Specifically, the first lead pair is connected to a first conductive line, namely connecting portions of the first lead 141 and the second lead 142 are both in electrical connection with a first conductive line; the second lead pair is connected to a third conductive line, and connecting portions of the third lead 143 and the fourth lead 144 are both in electrical connection with the third conductive line; the third lead pair is connected to a second conductive line, and connection portions of the fifth lead 145 and the sixth lead 146 are both in electrical connection with the second conductive line; the fourth lead pair is connected to a fourth conductive line, and connecting portions of the seventh lead 147 and the eighth lead 148 are both in electrical connection with the fourth conductive line, wherein the first conductive line is a positive line; the second conductive line is a positive line; the third conductive line is a communication conductive line; and the fourth conductive line is a negative conductive line. A portion of a conductive line core of the third conductive line that is located between the connecting portions of the third lead and the fourth lead is cut off; a portion of a conductive line core of the second conductive line that is located between the connecting portions of the fifth lead and the sixth lead is cut off.

Figure 35:
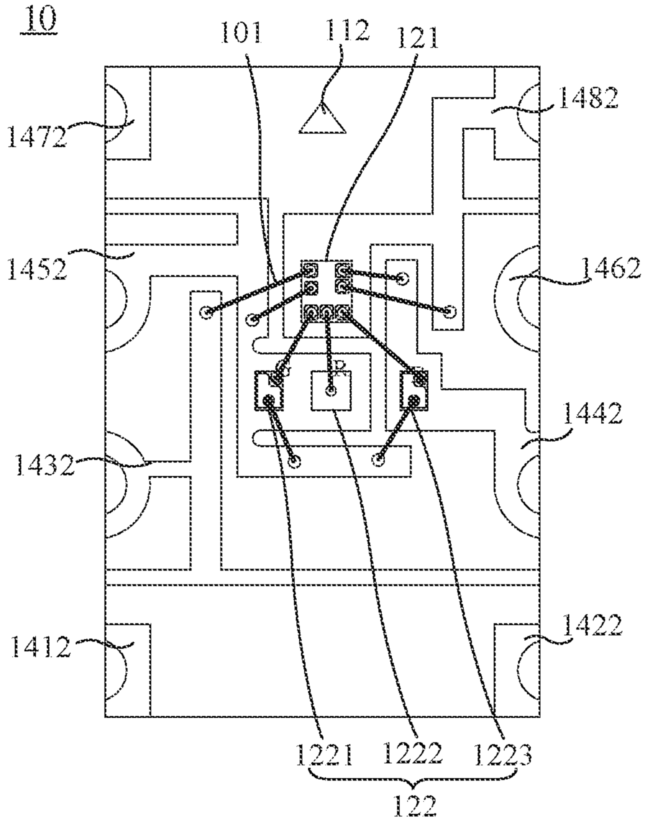
FIG. 35 is a schematic view showing a circuit connection relationship of the LED lighting bead provided in the embodiments of the application.

As shown in FIG. 35, reference being also had to FIGS. 33 and 34, the first lead 141 comprises a first connecting portion 1411 and a first chip-fixing portion 1412, and the second lead 142 comprises a second connecting portion 1421 and a second chip-fixing portion 1422. The first chip-fixing portion 1412 and the second chip-fixing portion 1422 are arranged at intervals, or are integrated together as one piece, to electrically connect to the first conductive line. The third lead 143 comprises a third connecting portion 1431 and a third chip-fixing portion 1432, and the fourth lead 144 comprises a fourth connecting portion 1441 and a fourth chip-fixing portion 1442. The third chip-fixing portion 1432 is connected by a bonding line 101 to a signal input terminal Din of the driving chip 121. The fourth chip-fixing portion 1442 is connected by a bonding line 101 to a signal output terminal of the driving chip 121 Dout. The third connecting portion 1431 and the fourth connecting portion 1441 are electrically connected with the third conductive line, and a portion of a conductive line core of the third conductive line that is located between the third connecting portion 1431 and the fourth connecting portion 1441 is cut off. The fifth lead 145 comprises a fifth connecting portion 1451 and a fifth chip-fixing portion 1452, and the sixth lead 146 comprises a sixth connecting portion 1461 and a sixth chip-fixing portion 1462. A positive terminal VDD of the driving chip 121 is electrically connected by a bonding line 101 to the fifth chip-fixing portion 1452. Dies 121 are connected by bonding lines 101 to the fifth chip-fixing portion 1452. The fifth connecting portion 1451 and the sixth connecting portion 1461 are electrically connected to the second conductive line, and a portion of a conductive line core of the second conductive line that is located between the fifth connecting portion 1451 and the sixth connecting portion 1461 is cut off. The seventh lead 147 comprises a seventh connecting portion 1471 and a seventh chip-fixing portion 1472, and the eighth lead 148 comprises an eighth connecting portion 1481 and an eighth chip-fixing portion 1482. A negative terminal GND of the driving chip 121 is electrically connected by a bonding line 101 to the eighth chip-fixing portion 1482.

For the LED lighting bead 10 provided in the above embodiment, due to the arrangement of the four pairs of leads 14 and the connection relationship between the four pairs of leads 14 and the light-emitting assembly 12, the LED lighting bead 10 is allowed to connect, through four conductive lines, to other LED lighting beads, namely being allowed to be arranged orderly with other lighting beads on the four conductive lines, so that when observed from outside appearance, the multiple LED lighting beads are soldered on the four conductive lines to form an LED light string, yet the circuit connection involves serial connection and parallel connection, while in the communication connection relationship, each of the LED lighting beads is connected in series for easy control. Consequently, processing of the LED lighting strip becomes easier, and power supply with a high voltage to the LED lighting strip, long distance cascade connection and diversification of lighting, such as lighting fashions of a running light and a revolving lantern, can all be realized.

In some embodiments, the fifth chip-fixing portion 1452 is provided with a single one or multiple ones of die 122 arranged thereon. The die(s) 122 are set in electrical connection with the driving chip 121 by means of bonding lines 101. The die(s) 122 are also electrically connected to the fifth chip-fixing portion 1452 by means of bonding lines 101, or alternatively, the die(s) 122 are electrically connected to the fifth chip-fixing portion 1452 by means of bonding contact, such as being connected with conductive silver paste. It is certainly appreciated that the die(s) 122 can be arranged on the chip-fixing portions of the others of the leads.

Illustratively, as shown in FIG. 35, the fifth chip-fixing portion 1452 is provided with a green light chip 1221 and a red light chip 1222 arranged thereon, wherein the green light chip 1221 are electrically connected by bonding lines 101 to the fifth chip-fixing portion 1452 and the driving chip 121, specifically being connected to a G control terminal of the driving chip 121; the red light chip 1222 is connected by a bonding line 101 to the driving chip 121, specifically being connected to an R control terminal of the driving chip 121, and is also electrically connected to the fifth chip-fixing portion 1452 by means of bonding contact.

In some embodiments, as shown in FIG. 34, reference being also had to FIG. 35, the fifth chip-fixing portion 1452 at least comprises a third arrangement portion 14521 and a fourth arrangement portion 14522 that are arranged at intervals. The third arrangement portion 14521 receives the green light chip 1221 and the red light chip 1222 to arranged thereon. The fourth arrangement portion 14522 receives a bonding line connection point to be arranged thereon. Since the bottoms of the blue light chip and the green light chip are connected, through bonding glue, to the chip-fixing portions, the bonding blue is an organic substance, which, upon expanding due to heating, release internal stress differently, so as to readily result in delamination (or stripping) of two surrounding solder bonding points (the bonding line connection points) to cause failure of electrical connection. Thus, the third arrangement portion 14521 and the fourth arrangement portion 14522 being arranged at intervals can effectively prevent extension of delamination stripping to thereby effectively protect the secureness of the soldering points and improve the product reliability.

In some embodiments, as shown in FIG. 35, the fourth chip-fixing portion 1442 is provided with a die 122 arranged thereon. The die 122 is electrically connected by a bonding line 101 to the fifth chip-fixing portion 1452. The die 122 is also electrically connected by a bonding line 101 to the driving chip 121. Specifically, for example, the die 122 arranged on the fourth chip-fixing portion 1442 is a blue light chip 1223, and the blue light chip 1223 is arranged on the fourth chip-fixing portion 1442 at a location adjacent to the fifth chip-fixing portion 1452, so that the blue light chip 1223 is close to the dies 122 arranged on the fifth chip-fixing portion 1452. As such, different ones of the dies 122 may combine to form various different colors, so that not only the product cost is reduced and the product reliability is enhanced, but an effect of combined lighting and color mixing of the LED lighting bead is also enhanced.

In some embodiments, the eighth chip-fixing portion 1482 is provided with the driving chip 121 arranged thereon. An area of the eighth chip-fixing portion 1482 in which the driving chip 121 is arranged in located between the fourth chip-fixing portion 1442 and the fifth chip-fixing portion

1452. Since the fourth chip-fixing portion 1442 and the fifth chip-fixing portion 1452 are provided to receive the dies and the bonding line connection points thereon, this arrangement could shorten the distance of the bonding line, saving bonding line to reduce cost, and also increase the service life of the LED lighting bead.

In some embodiments, to further enhance product reliability and service life, as shown in FIGS. 34 and 35, the eighth chip-fixing portion 1482 can be arranged to comprise a third disposition portion 14821 and a fourth disposition portion 14822 that are arranged at intervals. The third disposition portion 14821 is connected to the fourth disposition portion 14822. The third disposition portion 14821 receives the driving chip 121 to arrange thereon. The fourth disposition portion 14822 receives a bonding line connection point to arrange thereon. A portion between the third disposition portion 14821 and the fourth disposition portion 14822 is a spacing area. The fourth chip-fixing portion 1442 comprises a die disposition portion 14021 and a bonding line connection point disposition portion 14022 extending from the die disposition portion 14021. The bonding line connection point disposition portion 14022 is extended to the spacing area. As such, heating of the driving chip 121 is prevented from causing delamination of the bonding line connection point, so as to increase the product service life. Also, the distance of connection of the bonding line between the driving chip and the chip-fixing portion is reduced to save cost and improve product reliability.

In some embodiments, since the connecting portions and the chip-fixing portions of the leads 14 must be subjected to electroplating through an electroplating operation, or for electrical connection made with a via, electroplating may also be needed for plated through hole, to simplify the electroplating operation, the chip-fixing portion of one or multiple of the leads 14 is provided with a conductive electrode 1404. The conductive electrode 1404 is extended from the chip-fixing portion of each one of the leads to an edge of the insulation housing 11. Illustratively, as shown in FIG. 34, the third chip-fixing portion 1432, the fifth chip-fixing portion 1452, and the eighth chip-fixing portion 1482 each include a conductive electrode 1404.

In Chip-B bead provided in the embodiments of the application, the LED lighting bead 10 may further comprise an isolation board 15. The isolation board 15 is specifically a bismaleimide-triazine (BT) board, which is also referred to as a resin substrate. The isolation board 15 is specifically arranged on the bottom of the insulation housing 11 to isolate the connecting portion of each of the leads 14, preventing shorting caused by solder balls in a subsequent operation of soldering and connecting the LED lighting bead and the conductive lines. Since the surface of the insulation housing 11 is rough, if no isolation board 15 is used, it is quite easy to cause shorting in soldering the connecting portions of the leads 14 and the conductive lines.

It is noted that for Top-A bead, Top-B bead, and Top-C bead, and Chip-A bead, Chip-B bead, and Chip-C bead provided in the above embodiments, in the following embodiments, Top-A bead and Chip-A bead are referred to as "first LED lighting bead", Top-C bead and Chip-C bead "second LED lighting bead", Top-B bead and Chip-B bead "third LED lighting bead". In the following, a description is provided for an LED lighting strip made by using the first LED lighting bead, the second LED lighting bead, and the third LED lighting bead.

LED lighting strips provided in the embodiments of the application all comprise at least four conductive lines and multiple LED modules. The LED modules comprises at least two LED lighting beads. The at least two LED lighting beads are electrically connected with the four conductive lines, and the multiple LED lighting beads are arranged orderly on the four conductive lines and form a strip, where one conductive line of the four conductive lines is a communication conductive line, and remaining three conductive lines are power-supplying conductive lines. On the communication conductive line, the LED lighting beads on the strip are all connected in series; and on the power-supplying conductive lines, the multiple LED modules are connected in parallel to each other, and the at least two LED lighting beads of each of the LED modules are connected in series.

Illustratively, the LED module comprises: a first LED lighting bead and a second LED lighting bead. External structures of the first LED lighting bead and the second LED lighting bead are identical, while internal structures of the first LED lighting bead and the second LED lighting bead are different, wherein the external structure comprises an insulation housing, connecting portions of leads, and encapsulation resin, and the internal structure comprises chip-fixing portions of the leads.

Illustratively, the LED module may further comprise: a third LED lighting bead. The third LED lighting bead is connected in series with the first LED lighting bead and the second LED lighting bead, wherein the third LED lighting bead is arranged between the first LED lighting bead and the second LED lighting bead, the first LED lighting bead being a leading lighting bead of the LED modules, the second LED lighting bead being a tail lighting bead of the LED module.

In the arrangement, the third LED lighting bead is identical to the first LED lighting bead and the second LED lighting bead in respect of the external structure; and the third LED lighting bead is different from the first LED lighting bead and the second LED lighting bead in respect of the internal structure.

In some embodiments, in the LED module, the number of the third LED lighting bead is one or plural, wherein when the number of the third LED lighting bead is plural, the plural third LED lighting beads are all arranged between the first LED lighting bead and the second LED lighting bead and are all connected in series.

In the embodiments of the application, operation voltages of the first LED lighting bead, the second LED lighting bead, and the third LED lighting bead are identical.

In the arrangement, a method for manufacturing the LED lighting strip specifically comprises: arranging at least four conductive lines to extend along a linear trace, arranging corresponding LED lighting beads at intervals along the linear trace on the at least four conductive lines; subjecting the LED lighting beads and the at least four conductive lines to processing of soldering; and subjecting cut-off parts of a portion of the conductive lines to processing of stamp-cutting.

In the arrangement, the conductive lines comprise a conductive line core and an insulation layer enclosing the conductive line core, wherein the conductive line comprises an enameled wire, and the insulation layer may also be referred to an enameled wire layer. Before the at least four conductive lines are arranged to extend along the linear trace, it needs to strip off the insulation layers of the conductive lines, so that each of the conductive lines has a conductive line core exposed to correspond to the leads of the LED lighting bead. It is appreciated that it is also possible to have the insulation layers of the conductive lines stripped off after the at least four conductive lines are arranged to extend along the linear trace.

In some embodiments, for outside aesthetics, stripping of the insulation layers can be conducted at fixed intervals on the conductive lines, so that the LED lighting beads of the multiple LED modules of the LED lighting strip can be arranged on the four conductive lines in an equally distant manner. Of course, an unequally distant arrangement on the four conductive lines is also feasible.

By coating solder paste on the conductive line cores of the conductive lines and subjecting the LED lighting beads and the at least four conductive lines to processing of soldering, soldering secureness between the LED lighting beads and the conductive line cores of the conductive lines can be improved. In some ways of embodiments, it is also feasible to coat the solder paste on the connecting portions of the LED lighting beads. Specifically, a hot air mechanism is applied to conduct soldering, and thus fixing, of the connecting portions of the LED lighting beads and the conductive line cores of the conductive lines. After the soldering is done, it still needs to cut off the conductive line cores of a portion of the conductive lines, specifically, it needs to cut off the conductive line cores of the second conductive line and the third conductive line. In stamp-cutting, the conductive lines on which the LED lighting beads are soldered is turned over so as to have the conductive lines facing upward, while the LED lighting beads facing downward, and a cutting tool is applied to stamp down from an upper side so as to complete the manufacture of the LED lighting strip.

In some embodiments, it is also possible to first push aside the insulation layers of the conductive lines to expose the conductive line cores, and then subject the second conductive line and the third conductive line to stamp-cutting. Solder paste is coated on the conductive line cores, and then, the LED lighting beads are positioned on the conductive line cores on which the solder paste is applied, and then, UV resin is dripped from the top side to be subsequently cured. In the next step, the LED lighting strip is turned over, and UV resin is dripped on an opposite surface of the LED lighting strip to be subsequently cured, to thereby complete the manufacture of the LED lighting strip.

Figure 36:
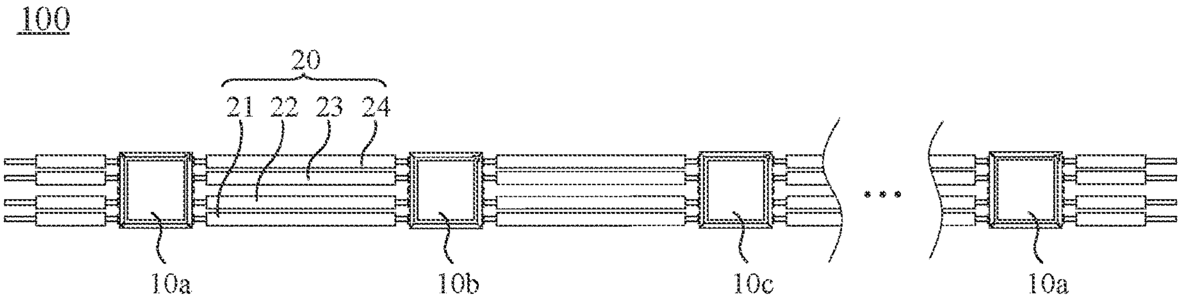
FIG. 36 is a schematic view showing an LED lighting strip provided in the embodiments of the application.
Figure 37:
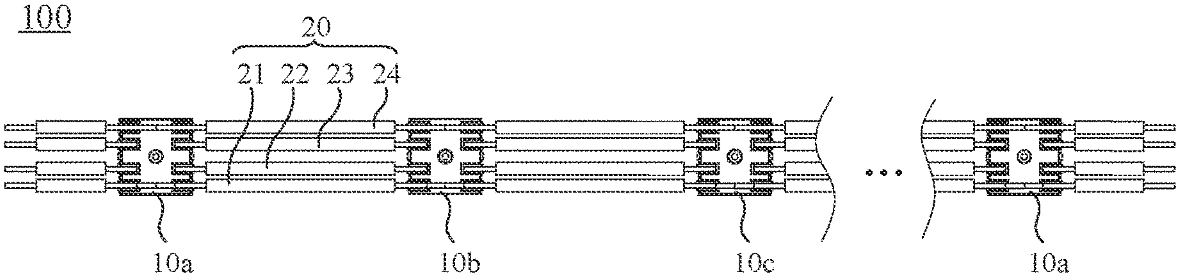
FIG. 37 is a schematic view, taken from a different viewing angle, showing the LED lighting strip provided in the embodiments of the application.

In the following, the various LED lighting beads provided in the above embodiments are combined to make various LED lighting strips. Each of the LED lighting strips corresponds to a different operation voltage. The following provides a detailed description for the various LED lighting strips provided in the embodiments of the application:

Referring to FIGS. 36 and 37, FIGS. 36 and 37 show, from different viewing angles, a structure of an LED lighting strips provided in the embodiments of the application. As shown in FIGS. 36 and 37, the LED lighting strip 100 specifically comprises at least four conductive lines 20 and plural LED modules. In the LED lighting strip 100, each of the LED modules comprises three LED lighting beads, which are respectively an LED lighting bead 10*a*, an LED lighting bead 10*b*, and an LED lighting bead 10*c*, wherein the LED lighting bead 10*a* is a Top-A bead; the LED lighting bead 10*b* is a Top-B bead, and the LED lighting bead 10*c* is a Top-C bead. The LED lighting bead 10*a*, the LED lighting bead 10*b*, and the LED lighting bead 10*c* are all electrically connected with the four conductive lines 20. The four conductive lines are respectively a first conductive line 21, a second conductive line 22, a third conductive line 23, and a fourth conductive line 24. The first conductive line 21 is a positive line; the second conductive line 22 is a positive line; the third conductive line 23 is a communication conductive line; and the fourth conductive line is a negative line.

The four pairs of leads of the three LED lighting beads of each of the LED modules are electrically connected with the pairs of conductive lines. Specifically, the first lead and the second lead are both connected to the first conductive line 21; the third lead and the fourth lead are both connected to the second conductive line 22; the fifth lead and the sixth lead are both connected to the third conductive line 23; and the seventh lead and the eighth lead are both connected to the fourth conductive line 24. A specifical way of connection can refer to the specific descriptions of the above embodiments in respect of the LED lighting beads.

The three LED lighting beads of the plural LED modules are arranged orderly on the four conductive lines 20 to form a strip, namely forming an elongate light string, for easily serving as an atmospheric lighting decoration positioned on other objects, such as decoration on a Christmas tree. On the third conductive line 23, which is the communication conductive line, the LED lighting beads of the strip are all connected in series; on the first conductive line 21, the second conductive line 22, and the fourth conductive line 24, which are the power-supplying conductive lines, the plural LED modules are connected in parallel to each other, and the three LED lighting beads of each of the LED modules are connected in series to each other, meaning the LED lighting bead 10*a*, the LED lighting bead 10*b*, and the LED lighting bead 10*c* are connected in series.

Illustratively, for example, the LED lighting strip 100 specifically comprises a hundred of LED modules, and each of the LED modules comprises three LED lighting beads, which are respectively an LED lighting bead 10*a*, an LED lighting bead 10*b*, and an LED lighting bead 10*c*. On three power-supplying conductive lines, each module of the one hundred of LED modules is connected to each other in parallel, and the three LED lighting beads of each of the LED modules are connected in series, and the three hundreds of LED lighting beads of the LED lighting strips 100 are all connected in series on the communication conductive line. The LED lighting strips 100 are not limited to being one hundred LED modules, and can be of any other numbers of LED modules, more than or less than one hundred.

For the arrangement, the way of connecting the LED modules in parallel to each other and connecting the three LED lighting beads of each of the LED modules in series, and connecting each of the LED lighting beads on the communication conductive line in series may refer the description to the specific structure of each of the above-described LED lighting bead specifically. For better understanding the circuit connection of the LED lighting strip 100, reference can be made to FIG. 38.

Figure 38:
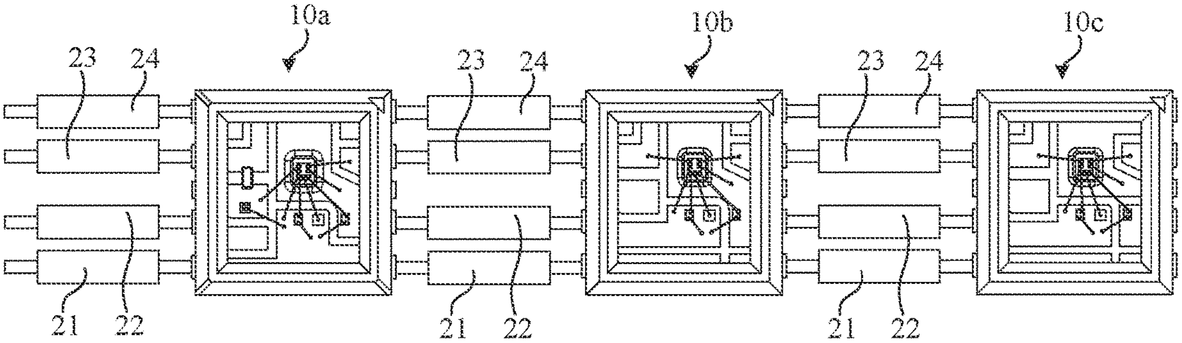
FIG. 38 is a schematic view showing a circuit connection relationship of the LED lighting strip provided in the embodiments of the application.

As shown in FIG. 38, one end of each of the three dies of the LED lighting bead 10*a* is electrically connected to the first chip-fixing portion of the first lead thereof, and an opposite end of each of the three dies of the LED lighting bead 10*a* is electrically connected to a control terminal of the driving chip thereof. The driving chip specifically comprises three control terminals, which are respectively a G control terminal, an R control terminal, and a B control terminal. A positive terminal VDD of the driving chip is electrically connected to the first chip-fixing portion of the LED lighting bead 10*a*, and a negative terminal GND of the driving chip is connected to the fourth chip-fixing portion of the fourth lead of the LED lighting bead 10*a*. One end of each of three dies of the LED lighting bead 10*b* is electrically connected to the third chip-fixing portion of the third lead thereof, and an opposite end of the three dies of the LED lighting bead 10*b* is electrically connected to a control terminal of the driving chip thereof. A positive terminal VDD of the driving chip is electrically connected to the third chip-fixing portion of the LED lighting bead 10*b*. A negative terminal GND of the driving chip is electrically connected to the fourth chip-fixing portion of the LED lighting bead 10*b*. One end of each of the three dies of the LED lighting bead 10*c* is electrically connected to the third chip-fixing portion of the third lead thereof, and an opposite end of each of the three dies of the LED lighting bead 10*c* is electrically connected to a control terminal of the driving chip thereof. A positive terminal VDD of the driving chip is electrically connected to the third chip-fixing portion of the LED lighting bead 10*c*. A negative terminal GND of the driving chip is electrically connected to the eighth chip-fixing portion of the LED lighting bead 10*c*, so as to achieve serial connection power supply of the three LED lighting beads.

Specifically, the path for power supply is as follows: For the LED lighting beads of each of the LED modules, an electrical current flows in sequence through the first conductive line 21, the first chip-fixing portion of the first lead of the LED lighting bead 10*a*, the driving chip of the LED lighting bead 10*a*, the fourth chip-fixing portion of the fourth lead of the LED lighting bead 10*a*, the second conductive line 22, the third chip-fixing portion of the third lead of the LED lighting bead 10*b*, the driving chip of the LED lighting bead 10*b*, the fourth chip-fixing portion of the fourth lead of the LED lighting bead 10*b*, the second conductive line 22, the third chip-fixing portion of the third lead of the LED lighting bead 10*c*, the driving chip of the LED lighting bead 10*c*, the eighth chip-fixing portion of the eighth lead of the LED lighting bead 10*c*, and the fourth conductive line, so as to make a serial-connection power supply circuit; for different ones of the LED modules, the leading lighting bead (such as the LED lighting bead 10*a*) of each of the LED modules is connected with the first conductive line, and the tail lighting bead that is in serial connection with the leading lighting bead is connected with the fourth conductive line, so that it can be sure that each of the LED modules is connected in parallel on the first conductive line and the fourth conductive line.

As shown in FIG. 38, for the LED lighting beads of each of the LED modules, the signal input terminal Din of the driving chip of the LED lighting bead 10*a* is connected to the fifth chip-fixing portion of the fifth lead of the LED lighting bead 10*a* (or by way of the chip-fixing portion of the first transition lead and the fifth chip-fixing portion), and the signal output terminal Dout of the driving chip of the LED lighting bead 10*a* is connected to the sixth chip-fixing portion of the sixth lead of the LED lighting bead 10*a*; the signal input terminal Din of the driving chip of the LED lighting bead 10*b* is connected to the fifth chip-fixing portion of the fifth lead of the LED lighting bead 10*b*, and the signal output terminal Dout of the driving chip of the LED lighting bead 10*b* is connected to the sixth chip-fixing portion of the sixth lead of the LED lighting bead 10*b*; the signal input terminal Din of the driving chip of the LED lighting bead 10*c* is connected to the fifth chip-fixing portion of the fifth lead of the LED lighting bead 10*c*, and the signal output terminal Dout of the driving chip of the LED lighting bead 10*c* is connected to the sixth chip-fixing portion of the sixth lead of the LED lighting bead 10*c*; wherein the connecting portions of the fifth leads and the sixth leads are all connected to the communication conductive line, so as to achieve that each of the LED lighting beads in the plural LED modules is connected in series on the communication conductive line.

Since the LED lighting strip adopts parallel connection among the LED modules and serial connection among the LED lighting beads of the LED modules, the power supply loss of the LED lighting strip 100 is relatively small, so that the LED lighting strip 100 may realize long distance cascade connection, namely the LED lighting strip can be made to be very long. More importantly, the manufacture of the LED lighting strip 100 is simple, and the manufacture can be done by simply soldering the three types of LED lighting bead (the LED lighting bead 10*a*, the LED lighting bead 10*b*, and the LED lighting bead 10*c*) provided in the above embodiments in sequence on the four conductive lines. The LED lighting strip adopts parallel-serial connection for power supply and serial connection for signal, in order to realize application solutions of multiple different power supply voltages, and a communication protocol is adapted to control each of the LED lighting beads of the LED lighting strip, so as to realize diversification and arbitrary adjustment of the lighting effect, without being constrained by cascade stapes and distance. The LED lighting strip can effectively resolve the drawbacks and shortcomings of the existing LED lighting strip, meaning it can realize long distance cascade connection and diversification of lighting effect, easy control, and arbitrary regulation of power supply voltage as desired. Further, the LED lighting strip may adopt the same manufacturing art as that for the existing line lights, and the manufacture is easy and the production yield of the LED lighting strip can be enhanced.

Figure 39:
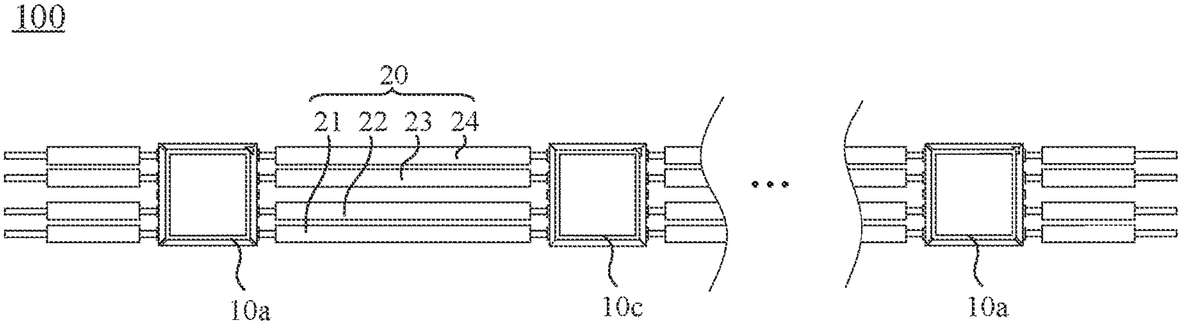
FIG. 39 is a schematic view showing another LED lighting strip provided in the embodiments of the application.

Referring to FIGS. 39, FIG. 39 shows a structure of another LED lighting strip provided in the embodiments of the application. As shown in FIG. 39, the LED lighting strip 100 may specifically comprise at least four conductive lines 20 and plural LED modules. In the LED lighting strip 100, each of the LED modules comprises two LED lighting beads, which are respectively an LED lighting bead 10*a* and an LED lighting bead 10*c*, wherein the LED lighting bead 10*a* is a Top-A bead, and the LED lighting bead 10*c* is a Top-C bead. The LED lighting bead 10*a* and the LED lighting bead 10*c* are both electrically connected with the four conductive lines 20. The four conductive lines are respectively a first conductive line 21, a second conductive line 22, a third conductive line 23, and a fourth conductive line 24. The first conductive line 21 is a positive line; the second conductive line 22 is a positive line; the third conductive line 23 is a communication conductive line; the fourth conductive line is a negative line.

The two LED lighting beads of the plural LED modules are arranged in sequence on four conductive lines 20 to form a strip, namely forming an elongate light string, for easily serving as an atmospheric lighting decoration positioned on other objects, such as decoration on a Christmas tree. On the third conductive line 23, which is the communication conductive line, the LED lighting beads of the strip are all connected in series; on the first conductive line 21, the second conductive line 22, and the fourth conductive line 24, which are the power-supplying conductive lines, the plural LED modules are connected in parallel to each other, and the two LED lighting beads of each of the LED modules are connected in series to each other, meaning the LED lighting bead 10*a* and the LED lighting bead 10*c* are connected in series.

Illustratively, for example, the LED lighting strip 100 specifically comprises two hundreds of LED modules, and each of the LED modules comprises two LED lighting beads, which are respectively an LED lighting bead 10*a* and an LED lighting bead 10*c*. On three power-supplying conductive lines, each module of the two hundreds of LED modules is connected to each other in parallel, and the two LED lighting beads of each of the LED modules are connected in series, namely, the four hundreds of LED lighting beads of the LED lighting strip 100 are all connected in series on the communication conductive line.

For the arrangement, the way of connecting the LED modules in parallel to each other and connecting the two LED lighting beads of each of the LED modules in series, and connecting each of the LED lighting beads on the communication conductive line in series may refer the description to the specific structure of each of the above-described LED lighting bead specifically. For better understanding the circuit connection of the LED lighting strip 100, reference can be made to FIG. 40.

Figure 40:
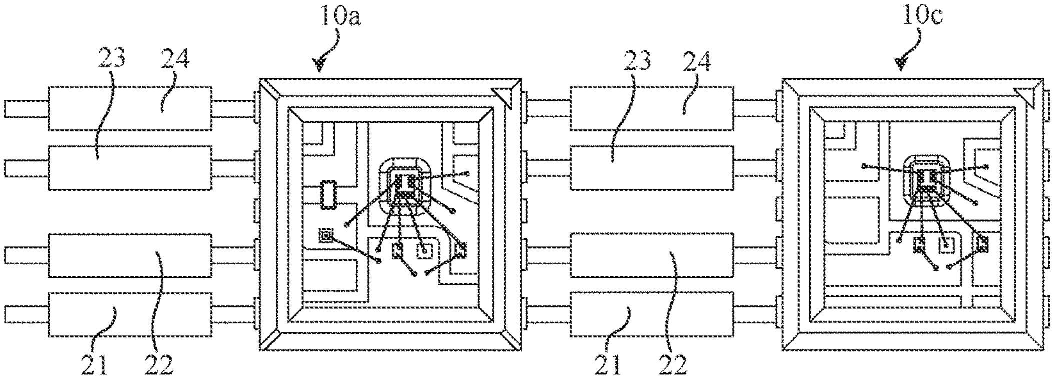
FIG. 40 is a schematic view showing a circuit connection relationship of the LED lighting strip provided in the embodiments of the application.

As shown in FIG. 40, one end of each of the three dies of the LED lighting bead 10*a* is electrically connected to the first chip-fixing portion of the first lead thereof, and an opposite end of each of the three dies of the LED lighting bead 10*a* is electrically connected to a control terminal of the driving chip thereof. The number of the control terminals of the driving chip is specifically three, which are respectively a G control terminal, an R control terminal, and a B control terminal. A positive terminal VDD of the driving chip is electrically connected to the first chip-fixing portion of the LED lighting bead 10*a*, and a negative terminal GND of the driving chip is connected to the fourth chip-fixing portion of the fourth lead of the LED lighting bead 10*a*. One end of each of the three dies of the LED lighting bead 10*c* is electrically connected to the third chip-fixing portion of the third lead thereof, and an opposite end of each of the three dies of the LED lighting bead 10*c* is electrically connected to a control terminal of the driving chip thereof. A positive terminal VDD of the driving chip is electrically connected to the third chip-fixing portion of the LED lighting bead 10*c*, and a negative terminal GND of the driving chip is electrically connected to the eighth chip-fixing portion of the LED lighting bead 10*c*, so as to achieve serial connection power supply of the two LED lighting beads.

Specifically, the path for power supply is as follows: Fort he LED lighting beads of each of the LED modules, an electrical current flows in sequence through the first conductive line 21, the first chip-fixing portion of the first lead of the LED lighting bead 10*a*, the driving chip of the LED lighting bead 10*a*, the fourth chip-fixing portion of the fourth lead of the LED lighting bead 10*a*, the second conductive line 22, the third chip-fixing portion of the third lead of the LED lighting bead 10*c*, the driving chip of the LED lighting bead 10*c*, the eighth chip-fixing portion of the eighth lead of the LED lighting bead 10*c*, and the fourth conductive line, so as to make a serial-connection power supply circuit; for different ones of the LED modules, the LED lighting bead 10*a* of each of the LED modules is connected with the first conductive line, and the LED lighting bead 10*c* that is in serial connection with the LED lighting bead 10*a* is connected with the fourth conductive line, so that it can be sure that each of the LED modules is connected in parallel on the first conductive line and the fourth conductive line. As to each of the LED lighting beads of the LED lighting strip on the communication conductive line, reference can be made to the above embodiments, and no detailed description will be provided here.

Since the LED lighting strip adopts parallel connection among the LED modules and serial connection among the LED lighting beads of the LED modules, the power supply loss of the LED lighting strip 100 is relatively small, so that the LED lighting strip 100 may realize long distance cascade connection, namely the LED lighting strip can be made to be very long. More importantly, the manufacture of the LED lighting strip 100 is simple, and the manufacture can be done by simply soldering the two types of LED lighting bead (the LED lighting bead 10*a* and the LED lighting bead 10*c*) provided in the above embodiments in sequence, by following an order, on the four conductive lines. The LED lighting strip adopts parallel-serial connection for power supply and serial connection for signal, in order to realize application solutions of multiple different power supply voltages, and a communication protocol is adapted to control each of the LED lighting beads of the LED lighting strip, so as to realize diversification and arbitrary adjustment of the lighting effect, without being constrained by cascade stapes and distance. The LED lighting strip can effectively resolve the drawbacks and shortcomings of the existing LED lighting strip, meaning it can realize long distance cascade connection and diversification of lighting effect, easy control, and arbitrary regulation of power supply voltage as desired. Further, the LED lighting strip may adopt the same manufacturing art as that for the existing line lights, and the manufacture is easy and the production yield of the LED lighting strip can be enhanced.

Figure 41:
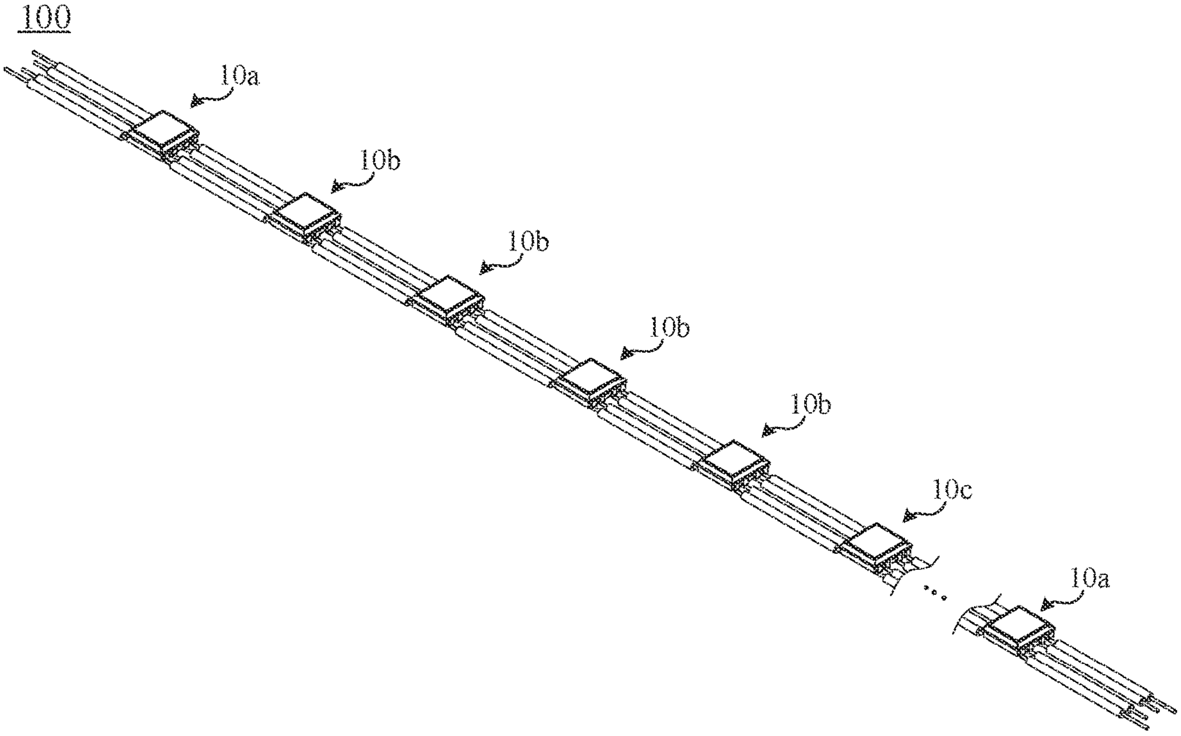
FIG. 41 is a schematic view showing another LED lighting strip provided in the embodiments of the application.

Referring to FIG. 41, FIG. 41 shows a structure of another LED lighting strip provided in the embodiments of the application. As shown in FIG. 41, the LED lighting strip 100 may specifically comprise at least four conductive lines 20 and plural LED modules. In the LED lighting strip 100, each of the LED modules comprises six LED lighting beads, which are respectively an LED lighting bead 10*a*, an LED lighting bead 10*c*, and four LED lighting beads 10*b*, the LED lighting bead 10*a* being a leading lighting bead, the LED lighting bead 10*c* being a tail lighting bead, wherein the LED lighting bead 10*a* is a Top-A bead; the LED lighting beads 10*b* are Chip-B beads; the LED lighting bead 10*c* is a Top-C bead. The LED lighting bead 10*a*, the LED lighting beads 10*b*, and the LED lighting bead 10*c* are all electrically connected with the four conductive lines 20. The four conductive lines are respectively a first conductive line 21, a second conductive line 22, a third conductive line 23, and a fourth conductive line 24. The first conductive line 21 is a positive line; the second conductive line 22 is a positive line; the third conductive line 23 is a communication conductive line; and the fourth conductive line is a negative line.

The six LED lighting beads of the plural LED modules are arranged orderly on the four conductive lines 20 to form a strip, namely forming an elongate light string, for easily serving as an atmospheric lighting decoration positioned on other objects, such as decoration on a Christmas tree. On the third conductive line 23, which is the communication conductive line, the LED lighting beads of the strip are all connected in series; on the first conductive line 21, the second conductive line 22, and the fourth conductive line 24, which are the power-supplying conductive lines, the plural LED modules are connected in parallel to each other, and the six LED lighting beads of each of the LED modules are connected in series to each other, meaning the LED lighting bead 10*a*, the four LED lighting beads 10*b*, and the LED lighting bead 10*c* are connected in series.

For the arrangement, a specific corresponding circuit of serial connection and parallel connection may refer to Top-A bead, Top-B bead, and Top-C bead provided in the above embodiments, and may also refer to the embodiment of corresponding to the LED lighting strip illustrated in FIGS. 36 and 37 for understanding. No detailed description will be provided here.

It is noted that, in the embodiments of the application, the operation voltages of Top-A bead, Top-B bead, and Top-C bead can be the same or different, or substantially the same. Preferably, the operation voltages of Top-A bead, Top-B bead and Top-C bead are the same, for example the operation voltages being all 4v, and can of course be of other voltages, such as 3.6V or 5V. Consequently, the power supply voltage of the LED lighting strip shown in FIG. 36 is 12V; the power supply voltage of the LED lighting strip shown in FIG. 39 is 8V; the power supply voltage of the LED lighting strip shown in FIG. 41 is 24V. It can thus be appreciated that through serially connecting a different number of LED lighting beads in each of the LED modules, it is possible to realize a different power supply voltage, and also to realize power supplying with a high voltage. The high-voltage power supplying can be interpreted in such a way that a power supply device lower than 10V is used in the current market to supply power to the LED lighting strip, and if the LED lighting strip is relatively long, due to line loss, power supplying with a low voltage would result in insufficient luminance for LED lighting beads at the tail of the LED lighting strip, thereby affecting the user's experience. Further, such a phenomenon becomes more obvious for a longer period of time of use of the LED lighting strip. The LED lighting strips provided in the embodiments of the application may use high voltage power supplying, such as 12V, 24V, 32V, and 40V. Power supplying with a high voltage can reduce the influence of line loss, so that the LED lighting strip can be made extremely long.

It is further noted that there is in fact no clear definition for a bound of the so-called low voltage power supplying referred to in the market, and the above-mentioned voltage of 10V is just an example for explanation. Some refer this being below 8V, or below 12V, or below other voltage levels. Oppositely, the LED lighting strips provided in the embodiments of the application can easily realize a power supply voltage above 20V.

The above is manufacturing an LED lighting strip with the Top type LED lighting beads, and in the following, manufacturing of an LED lighting strip with the Chip type LED lighting beads will be described. It is noted that the LED lighting strip provided in the embodiments of the application is preferably made with one type of LED lighting bead alone. The type indicates difference of the manufacturing operation with the LED lighting beads, such as using only the Top type LED lighting beads, or only using the Chip type LED lighting beads. Of course, the LED lighting strip may simultaneously use the Chip type and the Top type of LED lighting beads.

Figure 42:
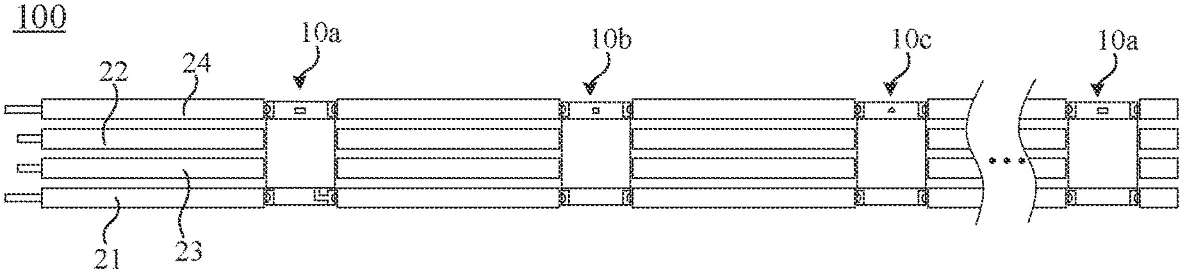
FIG. 42 is a schematic view showing a further LED lighting strip provided in the embodiments of the application.
Figure 43:
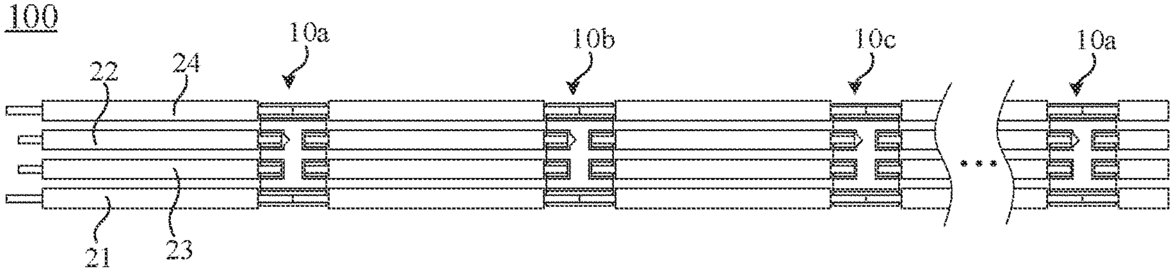
FIG. 43 is a schematic view, taken from a different viewing angle, showing said a further LED lighting strip provided in the embodiments of the application.

Referring to FIGS. 42 and 43, FIGS. 42 and 43 show, from different viewing angles, a structure of another LED lighting strip provided in the embodiments of the application. As shown in FIGS. 42 and 43, the LED lighting strip 100 may specifically comprise at least four conductive lines 20 and plural LED modules. In the LED lighting strip 100, each of the LED modules comprises three LED lighting beads, which are respectively an LED lighting bead 10*a*, an LED lighting bead 10*b*, and an LED lighting bead 10*c*, wherein the LED lighting bead 10*a* is a Chip-A bead; the LED lighting bead 10*b* is a Chip-B bead; and the LED lighting bead 10*c* is a Chip-C bead. The LED lighting bead 10*a*, the LED lighting bead 10*b* and the LED lighting bead 10*c* are all electrically connected with the four conductive lines 20. The four conductive lines are respectively a first conductive line 21, a second conductive line 22, a third conductive line 23, and a fourth conductive line 24. The first conductive line 21 is a positive line; the second conductive line 22 is a positive line; the third conductive line 23 is a communication conductive line; and the fourth conductive line is a negative line.

The four pairs of leads of the three LED lighting beads of each of the LED modules are electrically connected with the pairs of conductive lines. Specifically, the first lead and the second lead are both connected to the first conductive line 21; the third lead and the fourth lead are both connected to the third conductive line 23; the fifth lead and the sixth lead are both connected to the second conductive line 22; and the seventh lead and the eighth lead are both connected to the fourth conductive line 24. A specifical way of connection can refer to the specific descriptions of the above embodiments in respect of the LED lighting beads.

The three LED lighting beads of the plural LED modules are arranged orderly on the four conductive lines 20 to form a strip, namely forming an elongate light string, for easily serving as an atmospheric lighting decoration positioned on other objects, such as decoration on a Christmas tree. On the third conductive line 23, which is the communication conductive line, the LED lighting beads of the strip are all connected in series; on the first conductive line 21, the second conductive line 22, and the fourth conductive line 24, which are the power-supplying conductive lines, the plural LED modules are connected in parallel to each other, and the three LED lighting beads of each of the LED modules are connected in series to each other, meaning the LED lighting bead 10*a*, the LED lighting bead 10*b*, and the LED lighting bead 10*c* are connected in series.

Illustratively, for example, the LED lighting strip 100 specifically comprises two hundreds of LED modules, and each of the LED modules comprises three LED lighting beads, which are respectively an LED lighting bead 10*a*, an LED lighting bead 10*b*, and an LED lighting bead 10*c*. On three power-supplying conductive lines, each module of the one hundred of LED modules is connected to each other in parallel, and the three LED lighting beads of each of the LED modules are connected in series, and the six hundreds of LED lighting beads of the LED lighting strips 100 are all connected in series on the communication conductive line.

Figure 44:
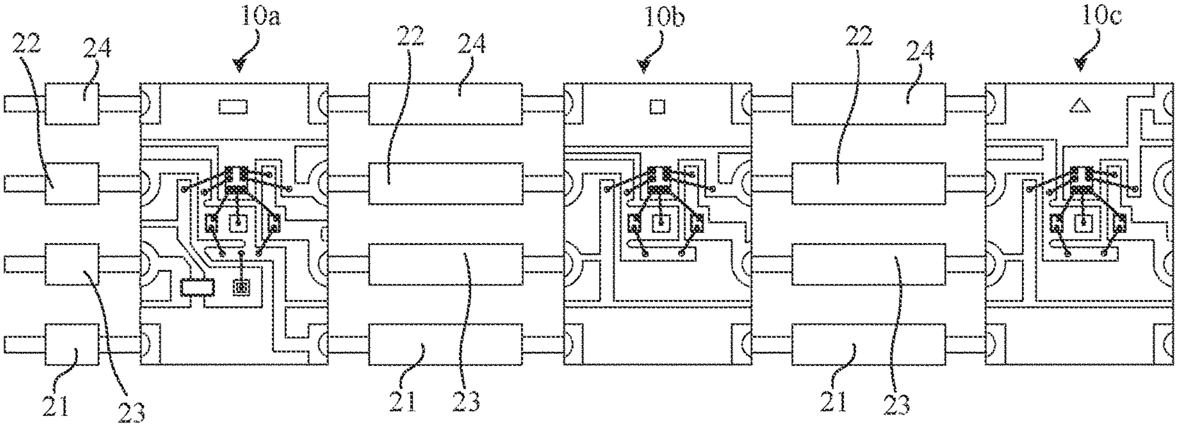
FIG. 44 is a schematic view showing a circuit connection relationship of said a further LED lighting strip provided in the embodiments of the application.

As shown in FIG. 44, one end of each of the three dies of the LED lighting bead 10*a* is electrically connected to the second chip-fixing portion of the second lead thereof, and an opposite end of each of the three dies of the LED lighting bead 10*a* is electrically connected to a control terminal of the driving chip thereof. A positive terminal VDD of the driving chip is electrically connected to the second chip-fixing portion of the LED lighting bead 10*a* is in electrical connection with, or the positive terminal VDD of the driving chip is electrically connected to the fifth chip-fixing portion of the fifth lead of the LED lighting bead 10. A negative terminal GND of the driving chip is electrically connected to the sixth chip-fixing portion of the sixth lead of the LED lighting bead 10*a*. One end of each of the three dies of the LED lighting bead 10*b* is electrically connected to the fifth chip-fixing portion of the fifth lead thereof, and an opposite end of each of the three dies of the LED lighting bead 10*b* is electrically connected to a control terminal of the driving chip thereof. A positive terminal VDD of the driving chip is electrically connected to the fifth chip-fixing portion of the LED lighting bead 10*b*, and a negative terminal GND of the driving chip is electrically connected to the sixth chip-fixing portion of the sixth lead of the LED lighting bead 10*b*. One end of each of the three dies of the LED lighting bead 10*c* is electrically connected to the fifth chip-fixing portion of the fifth lead thereof, and an opposite end of each of the three dies of the LED lighting bead 10*c* is electrically connected to a control terminal of the driving chip thereof. A positive terminal VDD of the driving chip is electrically connected to the fifth chip-fixing portion of the LED lighting bead 10*c*, and a negative terminal GND of the driving chip is electrically connected to the eighth chip-fixing portion of the LED lighting bead 10*c*, so as to achieve serial connection power supply of the three LED lighting beads.

Specifically, the path for power supply is as follows: For the LED lighting beads of each of the LED modules, an electrical current flows in sequence through the first conductive line 21, the second chip-fixing portion of the second lead of the LED lighting bead 10*a*, the driving chip of the LED lighting bead 10*a*, the sixth chip-fixing portion of the sixth lead of the LED lighting bead 10*a*, the second conductive line 22, the fifth chip-fixing portion of the fifth lead of the LED lighting bead 10*b*, the driving chip of the LED lighting bead 10*b*, the sixth chip-fixing portion of the sixth lead of the LED lighting bead 10*b*, the second conductive line 22, the fifth chip-fixing portion of the fifth lead of the LED lighting bead 10*c*, the driving chip of the LED lighting bead 10*c*, the eighth chip-fixing portion of the eighth lead of the LED lighting bead 10*c*, and the fourth conductive line, so as to make a serial-connection power supply circuit, for different ones of the LED modules, the leading lighting bead (such as the LED lighting bead 10*a*) of each of the LED modules is connected with the first conductive line 21, and the tail lighting bead that is in serial connection with the leading lighting bead is connected with the fourth conductive line 24, so that it can be sure that each of the LED modules is connected in parallel on the first conductive line 21 and the fourth conductive line 24. Each of the LED lighting bead being in series connection on the communication conductive line may refer to the above embodiments, and no detailed description will be provided here.

Since the LED lighting strip adopts parallel connection among the LED modules and serial connection among the LED lighting beads of the LED modules, the power supply loss of the LED lighting strip 100 is relatively small, so that the LED lighting strip 100 may realize long distance cascade connection, namely the LED lighting strip can be made to be very long. More importantly, the manufacture of the LED lighting strip 100 is simple, and the manufacture can be done by simply soldering the three types of LED lighting bead (the LED lighting bead 10*a*, the LED lighting bead 10*b*, and the LED lighting bead 10*c*) provided in the above embodiments in sequence on the four conductive lines. The LED lighting strip adopts parallel-serial connection for power supply and serial connection for signal, in order to realize application solutions of multiple different power supply voltages, and a serial communication protocol is adapted to control each of the LED lighting beads of the LED lighting strip, so as to realize diversification and arbitrary adjustment of the lighting effect, without being constrained by cascade stapes and distance. The LED lighting strip can effectively resolve the drawbacks and shortcomings of the existing LED lighting strip, meaning it can realize long distance cascade connection and diversification of lighting effect, easy control, and arbitrary regulation of power supply voltage as desired. Further, the LED lighting strip may adopt the same manufacturing art as that for the existing line lights, and the manufacture is easy and the production yield of the LED lighting strip can be enhanced.

Figure 45:
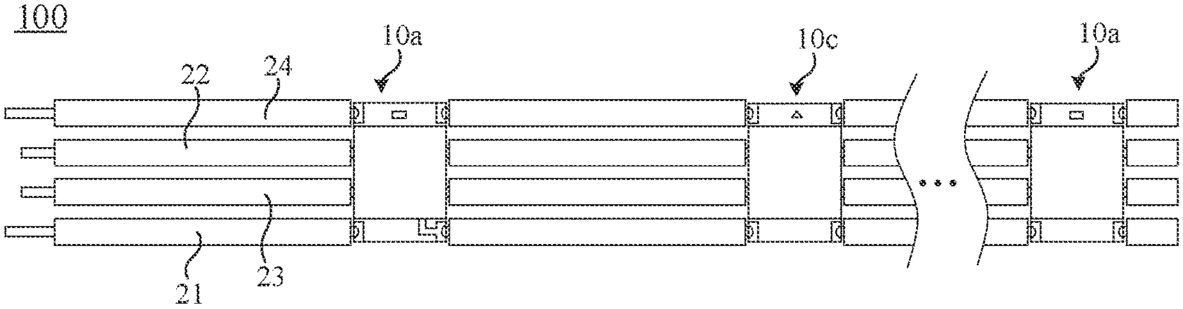
FIG. 45 is a schematic view showing a further LED lighting strip provided in the embodiments of the application.

Referring to FIG. 45, FIG. 45 shows a structure of another LED lighting strip provided in the embodiments of the application. As shown in FIG. 45, the LED lighting strip 100 may specifically comprise at least four conductive lines 20 and plural LED modules. In the LED lighting strip 100, each of the LED modules comprises two LED lighting beads, which are respectively an LED lighting bead 10*a* and an LED lighting bead 10*c*, wherein the LED lighting bead 10*a* is a Chip-A bead, and the LED lighting bead 10*c* is a Chip-C bead. The LED lighting bead 10*a* and the LED lighting bead 10*c* are both electrically connected with the four conductive lines 20, and the four pairs of leads of each of the LED lighting beads are respectively electrically connected to the four conductive lines. The four conductive lines are respectively a first conductive line 21, a second conductive line 22, a third conductive line 23, and a fourth conductive line 24. The first conductive line 21 is a positive line; the second conductive line 22 is a positive line; the third conductive line 23 is a communication conductive line; the fourth conductive line is a negative line.

The two LED lighting beads of the plural LED modules are arranged in sequence on four conductive lines 20 to form a strip, namely forming an elongate light string, for easily serving as an atmospheric lighting decoration positioned on other objects, such as decoration on a Christmas tree. On the third conductive line 23, which is the communication conductive line, the LED lighting beads of the strip are all connected in series; on the first conductive line 21, the second conductive line 22, and the fourth conductive line 24, which are the power-supplying conductive lines, the plural LED modules are connected in parallel to each other, and the two LED lighting beads of each of the LED modules are connected in series to each other, meaning the LED lighting bead 10*a* and the LED lighting bead 10*c* are connected in series.

Figure 46:
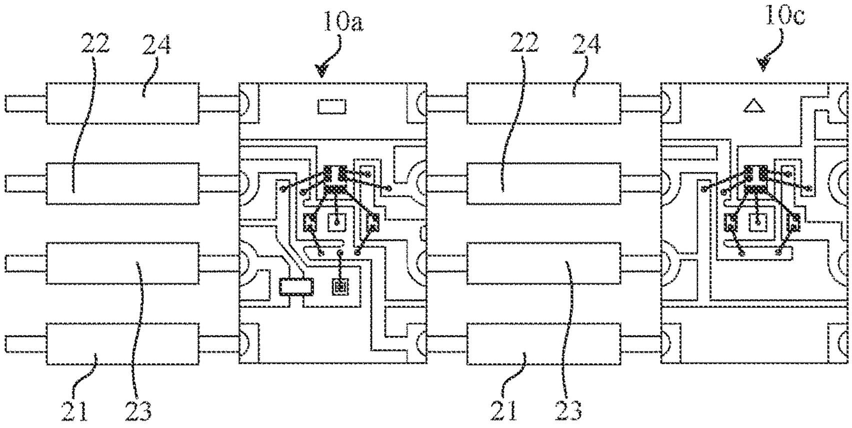
FIG. 46 is a schematic view showing a circuit connection relationship of said a further LED lighting strip provided in the embodiments of the application.

As shown in FIG. 46, one end of each of the three dies of the LED lighting bead 10*a* is electrically connected to the second chip-fixing portion of the second lead thereof, and an opposite end of each of the three dies of the LED lighting bead 10*a* is electrically connected to a control terminal of the driving chip thereof. A positive terminal VDD of the driving chip is electrically connected to the second chip-fixing portion of the LED lighting bead 10*a*, and a negative terminal GND of the driving chip is electrically connected to the sixth chip-fixing portion of the sixth lead of the LED lighting bead 10*a*. One end of each of the three dies of the LED lighting bead 10*c* is electrically connected to the fifth chip-fixing portion of the fifth lead thereof, and an opposite end of each of the three dies of the LED lighting bead 10*c* is electrically connected to a control terminal of the driving chip thereof. A positive terminal VDD of the driving chip is electrically connected to the fifth chip-fixing portion of the LED lighting bead 10*c*, and a negative terminal GND of the driving chip is electrically connected to the eighth chip-fixing portion of the LED lighting bead 10*c*, so as to achieve serial connection power supply of the two LED lighting beads.

Specifically, the path for power supply is as follows: Fort he LED lighting beads of each of the LED modules, an electrical current flows in sequence through the first conductive line 21, the second chip-fixing portion of the second lead of the LED lighting bead 10*a*, the driving chip of the LED lighting bead 10*a*, the sixth chip-fixing portion of the sixth lead of the LED lighting bead 10*a*, the second conductive line 22, the fifth chip-fixing portion of the fifth lead of the LED lighting bead 10*c*, the driving chip of the LED lighting bead 10*c*, the eighth chip-fixing portion of the eighth lead of the LED lighting bead 10*c*, and the fourth conductive line, so as to make a serial-connection power supply circuit; for different ones of the LED modules, the LED lighting bead 10*a* of each of the LED modules is connected with the first conductive line 21, and the LED lighting bead 10*c* that is in serial connection with the LED lighting bead 10*a* is connected with the fourth conductive line 24, so that it can be sure that each of the LED modules is connected in parallel on the first conductive line and the fourth conductive line. As to each of the LED lighting beads of the LED lighting strip on the communication conductive line, reference can be made to the above embodiments, and no detailed description will be provided here.

Figure 47:
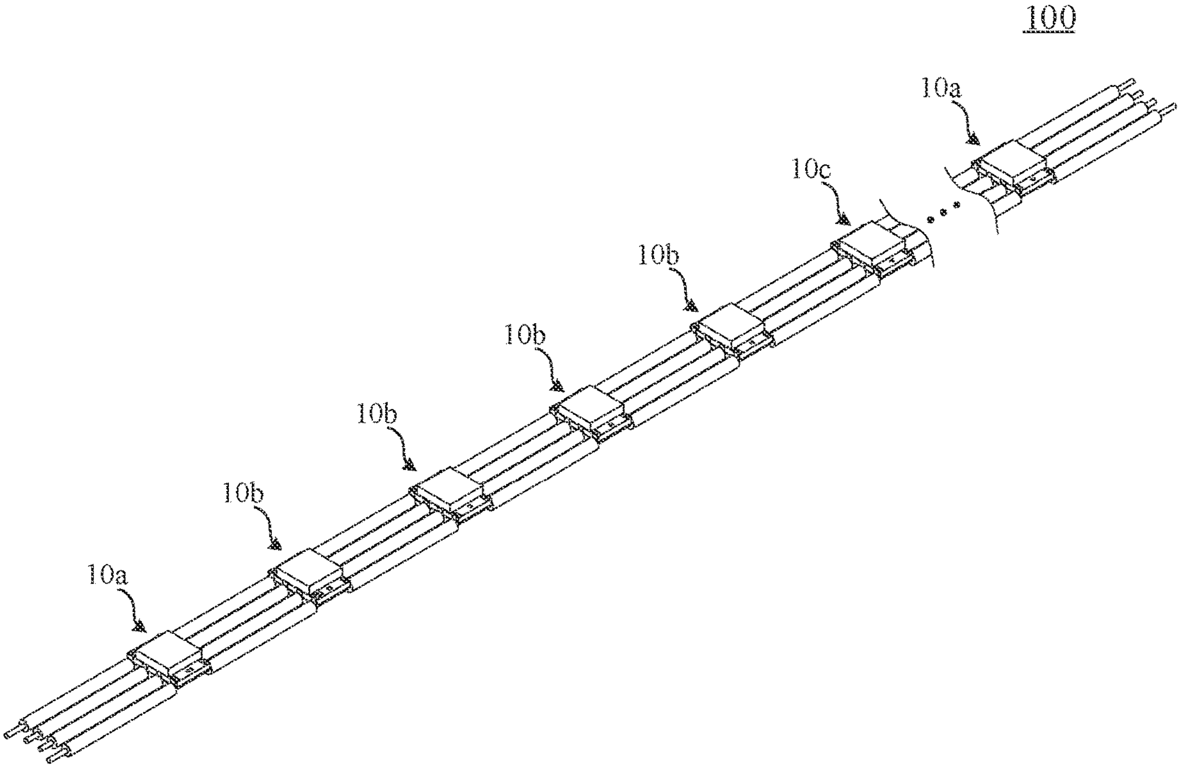
FIG. 47 is a schematic perspective view showing a further LED lighting strip provided in the embodiments of the application.

Referring to FIGS. 47, FIG. 47 shows a structure of another LED lighting strip provided in the embodiments of the application. As shown in FIG. 47, the LED lighting strip 100 may specifically comprise at least four conductive lines 20 and plural LED modules. In the LED lighting strip 100, each of the LED modules comprises six LED lighting beads, which are respectively an LED lighting bead 10*a*, an LED lighting bead 10*c*, and four LED lighting beads 10*b*, the LED lighting bead 10*a* being a leading lighting bead, the LED lighting bead 10*c* being a tail lighting bead, wherein, the LED lighting bead 10*a* is a Chip-A bead; the LED lighting beads 10*b* are Chip-B beads; and the LED lighting bead 10*c* is a Chip-C bead. The LED lighting bead 10*a*, the LED lighting beads 10*b*, and the LED lighting bead 10*c* are all electrically connected with the four conductive lines 20. The four conductive lines are respectively a first conductive line 21, a second conductive line 22, a third conductive line 23, and a fourth conductive line 24. The first conductive line 21 is a positive line; the second conductive line 22 is a positive line; the third conductive line 23 is a communication conductive line; and the fourth conductive line is a negative line.

The six LED lighting beads of the plural LED modules are arranged orderly on the four conductive lines 20 to form a strip, namely forming an elongate light string, for easily serving as an atmospheric lighting decoration positioned on other objects, such as decoration on a Christmas tree. On the third conductive line 23, which is the communication conductive line, the LED lighting beads of the strip are all connected in series; on the first conductive line 21, the second conductive line 22, and the fourth conductive line 24, which are the power-supplying conductive lines, the plural LED modules are connected in parallel to each other, and the six LED lighting beads of each of the LED modules are connected in series to each other, meaning the LED lighting bead 10*a*, the four LED lighting beads 10*b*, and the LED lighting bead 10*c* are connected in series.

For the arrangement, a specific corresponding circuit of serial connection and parallel connection may refer to Chip-A bead, Chip-B bead, and Chip-C bead provided in the above embodiments, and may also refer to the embodiment of corresponding to the LED lighting strip illustrated in FIGS. 42-43 for understanding. No detailed description will be provided here.

It is noted that, in the embodiments of the application, the operation voltages of Chip-A bead, Chip-B bead, and Chip-C bead can be the same or different, or substantially the same. Preferably, the operation voltages of Chip-A bead, Chip-B bead, and Chip-C bead are the same, for example the operation voltages being all 5v, and can of course be of other voltages, such as 3.3V or 3.6V. Consequently, the power supply voltage of the LED lighting strip shown in FIG. 42 is 15V; the power supply voltage of the LED lighting strip shown in FIG. 42 is 10V; the power supply voltage of the LED lighting strip shown in FIG. 41 is 30V. It can thus be appreciated that through serially connecting a different number of LED lighting beads in each of the LED modules, it is possible to realize a different power supply voltage, and also to realize power supplying with a high voltage. The high-voltage power supplying can be interpreted in such a way that a power supply device lower than 10V is used in the current market to supply power to the LED lighting strip, and if the LED lighting strip is relatively long, due to line loss, power supplying with a low voltage would result in insufficient luminance for LED lighting beads at the tail of the LED lighting strip, thereby affecting the user's experience. Further, such a phenomenon becomes more obvious for a longer period of time of use of the LED lighting strip. The LED lighting strips provided in the embodiments of the application may use high voltage power supplying, such as 15V, 30V, and 40V. Power supplying with a high voltage can reduce the influence of line loss, so that the LED lighting strip can be made extremely long.

Taking the LED lighting strip shown in FIGS. 41 and 47 as an example, each of the LED modules of the LED lighting strip comprises six LED lighting beads, and it is of course possible to comprises other numbers of lighting beads, for example each of the LED modules comprising four, five, seven, eight, or night. It can be regarded as each of the LED modules comprising n LED lighting beads, where n is a positive integer that is equal to or greater than 2. In the arrangement, the leading lighting bead and the tail lighting bead of each of the LED modules are respectively the LED lighting bead 10*a* and the LED lighting bead 10*c*, and an intermediate lighting bead is the LED lighting bead 10*b*.

It is further noted that the plural LED modules of one LED lighting strip may include an equal number of LED lighting beads, and can of course alternatively comprise different number of LED lighting beads. No limitation is imposed herein.

In summary, the LED lighting strips provided in the embodiments of the application all comprises at least four conductive lines and plural LED modules, and each of the LED modules comprises at least two LED lighting beads. The at least two LED lighting beads are electrically connected to the four conductive lines. One conductive line of the four conductive lines is a communication conductive line, and the remaining three conductive lines are power-supplying conductive lines. The plural LED lighting beads of each of the LED modules are orderly arranged on the four conductive lines to form a strip, so that when observed from outside appearance, all the LED lighting beads are connected in series on the four conductive lines, yet on power-supplying conductive lines, the plural LED modules are connected in parallel to each other and the at least two LED lighting beads of each of the LED modules are connected in series, and on the communication conductive line, the LED lighting beads of the strip are all connected in series. The LED lighting strip adopts serial-parallel connection for power and serial connection for signal in order to achieve various application solutions for different power supply voltages, and as a consequence thereof, a serial communication protocol is adopted to control each of the LED lighting beads of the LED lighting strip, and consequently, diversification and arbitrary regulation of the lighting effect can be realized and constraint of cascade stages and distance is eliminated. The LED lighting strip can effectively resolve the shortcomings and drawbacks of the existing LED lighting strips, and allows long distance cascade connection and diversification of the lighting effect, easy control, and arbitrary regulation of power supply voltage as desired. Further, the LED lighting strip may adopt the same manufacturing art as that for the existing line lights, and the manufacture is easy and the production efficiency of the LED lighting strip can be enhanced.

Figure 48:
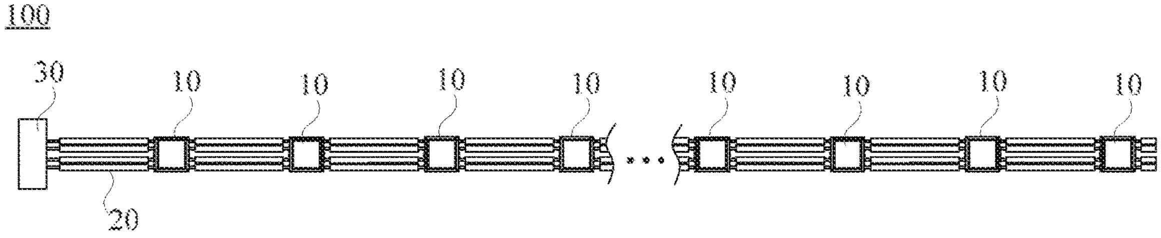
FIG. 48 is a schematic perspective view showing a further LED lighting strip provided in the embodiments of the application.

In some embodiments, as shown in FIG. 48, the LED lighting strip 100 may further comprises a power controller 30, which is also referred to as a power supplying device or a control device. The power controller 30 supplies an operation voltage and a control signal through the four conductive lines to the LED lighting beads of the LED lighting strip. In addition to supplying of the operation voltage, namely in addition to inclusion of a power supply circuit, the power controller 30 further comprises a processor, such as a single-chip microcomputer, for supplying a control signal to the LED lighting beads in order to control other light emission, such as regulation of color and time period of light emission. Specifically, the power controller 30 may adopt serial communication protocol to control the LED lighting beads of the LED lighting strip, and of course, other communication protocols may also be adopted. The serial communication protocol includes return-to-zero communication protocol and return-to-one communication protocol.

A first end of the first conductive line 21 is connected to a positive port of the power controller 30, and a first end of the second conductive line 22 is connected to the first end of the first conductive line 21, so as to save the power supply port of the power controller. A first end of the fourth conductive line 24 is connected to a negative port of the power controller. A first end of the third conductive line 23 is connected to a signal port of the power controller. The first end of the conductive lines is the end that is connected to the power controller 30.

In some embodiments, the LED lighting strip comprises one type or multiple types of LED module. Each type of LED module corresponds to a power supply voltage. Specifically, LED modules of different types of comprise different numbers of LED lighting beads. Since the LED lighting beads of the different numbers are all connected in series, and the corresponding power supply voltages are also different.

In some embodiments, illustratively, the strip of the LED lighting strip is provided with a cutting mark, and the cutting mark includes at least a voltage mark. The cutting mark can specifically be just a label, and the label is arranged on the conductive lines of the LED lighting strip. The voltage mark is provided to instruct a user to cut according to needs. For example, one LED lighting strip comprises multiple 12V-powered LED modules and additionally, multiple 24V-powered LED modules, and the cutting mark may be arranged between the two to allow the user to cut into two LED lighting strips.

In some embodiments, illustratively, the strip of the LED lighting strip is provided with a cutting mark, and the cutting mark is a cut notch arranged on the conductive lines of the LED lighting strip. Specifically, laser or a cutting tool may be applied to make the cut notch on the conductive lines, in order to notify the user to cut at the cut notch, with cutting means, such as scissors. For example, one LED lighting strip comprises 12V comprises multiple 12V-powered LED modules and additionally, multiple 24V-powered LED modules, so as to allow the user to cut into two LED lighting strips The above provides only specific ways of implementation for the application; however, the scope of protection that the application pursues is not limited thereto. Those having ordinary skill in the field of the art may contemplate various equivalent modifications or substitutes within the technical scope of the disclosure, and such modifications and substitutes should be considered falling with the scope of protection of the application. Thus, the scope of protection of the application is determined only by the scope of the claims.

What is claimed is:

1. A light-emitting diode (LED) lighting strip, comprising:

at least four conductive lines; and plural LED modules each comprising at least two LED lighting beads, the LED lighting beads comprising at least four pairs of leads, the LED lighting beads being electrically connected with the four conductive lines, the LED lighting beads being orderly arranged on the four conductive lines to form a strip;

wherein one conductive line of the four conductive lines is a communication conductive line, and remaining three conductive lines are power-supplying conductive lines;

on the communication conductive line, the LED lighting beads on the strip are all connected in series;

on the power-supplying conductive lines, the plural LED modules are connected in parallel to each other, and the at least two LED lighting beads of each of the LED modules are connected in series.

2. The LED lighting strip according to claim 1, wherein the LED lighting strip further comprises:

a power controller configured to supply an operation voltage and a control signal through the four conductive lines to the LED lighting beads of the LED lighting strip, the power controller adopting a serial communication protocol to control the LED lighting beads of the LED lighting strip.

3. The LED lighting strip according to claim 1, wherein the LED lighting strip comprises one type or multiple types of the LED modules, and each type of the LED modules corresponds to a power supply voltage.

4. The LED lighting strip according to claim 1, wherein the strip is provided with a cutting mark which at least comprises a voltage mark.

5. The LED lighting strip according to claim 1, wherein the at least two LED lighting beads comprise a first LED lighting bead and a second LED lighting bead; or, the at least two LED lighting beads comprise a first LED lighting bead, a second LED lighting bead, and a third LED lighting bead, wherein the third LED lighting bead is located between the first LED lighting bead and the second LED lighting bead, the first LED lighting bead serving as a leading lighting bead of the LED module, the second LED lighting bead serving as a tail lighting bead of the LED module.

6. The LED lighting strip according to claim 5, wherein external structures of the first LED lighting bead, the second LED lighting bead, and the third LED lighting bead are the same, and internal structures of the first LED lighting bead, the second LED lighting bead, and the third LED lighting bead are different;

wherein the external structure comprises an insulation housing, connecting portions of the leads, and encapsulation resin, and the internal structure comprises chip-fixing portions of the leads.

7. The LED lighting strip according to claim 5, wherein the lead comprises a connecting portion electrically connected to the conductive lines, and a chip-fixing portion configured to receive dies and a driving chip that drives the dies to emit light to arrange thereon; the four pairs of leads are respectively a first lead, a second lead, a third lead, a fourth lead, a fifth lead, a sixth lead, a seventh lead, and an eighth lead; the first lead and the second lead form a first lead pair, the third lead and the fourth lead forming a second lead pair, the fifth lead and the sixth lead forming a third lead pair, the seventh lead and the eighth lead forming a fourth lead pair; the four conductive lines comprise a first conductive line, a second conductive line, a third conductive line, and a fourth conductive line, the first conductive line being a positive line, the second conductive line being a positive line, the third conductive line being a communication conductive line, the fourth conductive line being a negative line;

wherein the first lead pair is in electrical connection with the first conductive line; the second lead pair is in electrical connection with the second conductive line; the third lead pair is in electrical connection with the third conductive line; and the fourth lead pair is in electrical connection with the fourth conductive line; or alternatively, the first lead pair is in electrical connection with the first conductive line; the second lead pair is in electrical connection with the third conductive line; the third lead pair is in electrical connection with the second conductive line; and the fourth lead pair is in electrical connection with the fourth conductive line;

wherein portions of conductive line cores of the second conductive line and the third conductive line located between the connecting portions of the third lead and the fourth lead are cut off; portions of conductive line cores of the second conductive line and the third conductive line located between the connecting portions of the fifth lead and the sixth lead are cut off.

8. The LED lighting strip according to claim 7, wherein for the first LED lighting bead:

the first lead comprises a first chip-fixing portion, the second lead comprising a second chip-fixing portion, the die being electrically connected to the first chip-fixing portion, a positive terminal of the driving chip being electrically connected to the first chip-fixing portion;

the third lead comprises a third chip-fixing portion, the fourth lead comprising a fourth chip-fixing portion, a negative terminal of the driving chip being electrically connected to the fourth chip-fixing portion; the connecting portions of the third lead and the fourth lead both are electrically connected to the second conductive line;

the fifth lead comprises a fifth chip-fixing portion, the sixth lead comprising a sixth chip-fixing portion, the fifth chip-fixing portion configured to transmit a control signal to a signal input terminal of the driving chip, the sixth chip-fixing portion being connected to a signal output terminal of the driving chip; and the seventh lead comprises a seventh chip-fixing portion, the eighth lead comprising an eighth chip-fixing portion.

9. The LED lighting strip according to claim 8, wherein the first chip-fixing portion and the second chip-fixing portion are integrally formed together as one piece; or alternatively, the first chip-fixing portion and the second chip-fixing portion are arranged at intervals, the positive terminal of the driving chip being electrically connected to the second chip-fixing portion.

10. The LED lighting strip according to claim 8, wherein the first LED lighting bead further comprises:

a first transition lead, the first transition lead comprising a chip-fixing portion, the chip-fixing portion of the first transition lead being provided with a diode thereon, an end of the diode being electrically connected to the chip-fixing portion of the first transition lead, an opposite end of the diode being electrically connected by a bonding line to the first chip-fixing portion, the chip-fixing portion of the first transition lead being also connected by another bonding line to the signal input terminal of the driving chip, the chip-fixing portion of the first transition lead being also electrically connected to the fifth chip-fixing portion.

11. The LED lighting strip according to claim 10, wherein the first LED lighting bead further comprises:

a second transition lead, the first transition lead and the second transition lead being arranged at two opposite sides of the insulation housing, a chip-fixing portion of the second transition lead and the fourth chip-fixing portion being integrally formed together as one piece.

12. The LED lighting strip according to claim 10, wherein the chip-fixing portion of the first transition lead is electrically connected by means of a capacitor to the fifth chip-fixing portion.

13. The LED lighting strip according to claim 8, wherein the first chip-fixing portion is provided with a single one or multiple ones of the dies thereon; the dies are electrically connected by bonding lines to the driving chip; the dies are electrically connected by bonding lines to the first chip-fixing portion, or alternatively, the dies are electrically connected to the first chip-fixing portion by means of bonding contact.

14. The LED lighting strip according to claim 13, wherein the first chip-fixing portion is provided with a green light chip and a red light chip arranged thereon; wherein the green light chip is electrically connected by bonding lines to the first chip-fixing portion and the driving chip; the red light chip is electrically connected by a bonding line to the driving chip and is electrically connected to the first chip-fixing portion by means of conductive silver paste.

15. The LED lighting strip according to claim 8, wherein the fourth chip-fixing portion is provided with the driving chip and the die arranged thereon; the die is electrically connected by a bonding line to the first chip-fixing portion, and the die is also electrically connected by another bonding line to the driving chip.

16. The LED lighting strip according to claim 15, wherein the die arranged on the fourth chip-fixing portion comprises a blue light chip, and the blue light chip is arranged on the fourth chip-fixing portion at a location adjacent to the first chip-fixing portion, so that the blue light chip is close to the dies arranged on the first chip-fixing portion.

17. The LED lighting strip according to claim 7, wherein for the first LED lighting bead:

the first lead comprises a first chip-fixing portion, the second lead comprising a second chip-fixing portion, the dies being electrically connected to the second chip-fixing portion, a positive terminal of the driving chip being electrically connected to the second chip-fixing portion;

the third lead comprises a third chip-fixing portion, the fourth lead comprising a fourth chip-fixing portion, the third chip-fixing portion configured to transmit a control signal to a signal input terminal of the driving chip, the fourth chip-fixing portion being connected to a signal output terminal of the driving chip;

the fifth lead comprises a fifth chip-fixing portion, the sixth lead comprising a sixth chip-fixing portion, a negative terminal of the driving chip being electrically connected to the sixth chip-fixing portion.

18. The LED lighting strip according to claim 17, wherein the first chip-fixing portion and the second chip-fixing portion are integrally formed together as one piece or are alternatively arranged at intervals, the positive terminal of the driving chip being electrically connected to the first chip-fixing portion; or the second chip-fixing portion and the fifth chip-fixing portion are integrally formed together as one piece or are alternatively arranged at intervals.

19. The LED lighting strip according to claim 17, wherein the first LED lighting bead further comprises:

a first transition lead, the first transition lead comprising a chip-fixing portion, the chip-fixing portion of the first transition lead being provided with a diode thereon, an end of the diode being electrically connected to the chip-fixing portion of the first transition lead, an opposite end of the diode being electrically connected by a bonding line to the second chip-fixing portion.

20. The LED lighting strip according to claim 19, wherein the chip-fixing portion of the first transition lead and the third chip-fixing portion are connected by a capacitor, the chip-fixing portion of the first transition lead being connected by a bonding line to a signal input terminal of the driving chip.

21. The LED lighting strip according to claim 20, wherein the chip-fixing portion of the first transition lead comprises a connecting terminal part that is extended to align with the sixth chip-fixing portion, and the signal input terminal of the driving chip is electrically connected by a bonding line to the connecting terminal part.

22. The LED lighting strip according to claim 17, wherein the second chip-fixing portion is provided with a single one or multiple ones of the dies; the dies are electrically connected by bonding lines to the driving chip; the dies are electrically connected by bonding lines to the second chip-fixing portion, or alternatively, the dies are electrically connected to the second chip-fixing portion by means of bonding contact.

23. The LED lighting strip according to claim 22, wherein the second chip-fixing portion is provided with a green light chip and a red light chip; wherein the green light chip is electrically connected by bonding lines to the second chip-fixing portion and the driving chip; the red light chip is electrically connected by a bonding line to the driving chip and is electrically connected to the second chip-fixing portion by means of conductive silver paste.

24. The LED lighting strip according to claim 22, wherein the second chip-fixing portion at least comprises a first arrangement portion and a second arrangement portion that are arranged at intervals, the first arrangement portion configured to receive the green light chip and the red light chip to arrange thereon, the second arrangement portion configured to receive a bonding line connection point to dispose thereon.

25. The LED lighting strip according to claim 17, wherein the fourth chip-fixing portion is provided with the die arranged thereon; the die is electrically connected by a bonding line to the second chip-fixing portion, and the die is electrically connected by a bonding line to the driving chip.

26. The LED lighting strip according to claim 25, wherein the die arranged on the fourth chip-fixing portion comprises a blue light chip, and the blue light chip is arranged on the fourth chip-fixing portion at a location adjacent to the second chip-fixing portion, so that the blue light chip is close to the die arranged on the second chip-fixing portion.

27. The LED lighting strip according to claim 17, wherein the sixth chip-fixing portion is provided with the driving chip arranged thereon, and an area of the sixth chip-fixing portion in which the driving chip is arranged is located among the third chip-fixing portion, the fourth chip-fixing portion, and the fifth chip-fixing portion.

28. The LED lighting strip according to claim 27, wherein the sixth chip-fixing portion comprises a first disposition portion and a second disposition portion that are arranged at intervals, the first disposition portion and the second disposition portion being connected, the first disposition portion configured to receive the driving chip to dispose thereon, the second disposition portion configured to receive a bonding line connection point to dispose thereon, a portion between the first disposition portion and the second disposition portion being a spacing area;

the fourth chip-fixing portion comprises a die disposition portion and a bonding line connection point disposition portion extending from the die disposition portion, the bonding line connection point disposition portion being extended to the spacing area.

29. The LED lighting strip according to claim 7, wherein for the second LED lighting bead:

the third lead comprises a third chip-fixing portion, the fourth lead comprising a fourth chip-fixing portion, a positive terminal of the driving chip being electrically connected to the third chip-fixing portion, the dies being electrically connected to the third chip-fixing portion;

the fifth lead comprises a fifth chip-fixing portion, the sixth lead comprising a sixth chip-fixing portion, the fifth chip-fixing portion being connected to a signal input terminal of the driving chip, the sixth chip-fixing portion being connected to a signal output terminal of the driving chip;

the seventh lead comprises a seventh chip-fixing portion, the eighth lead comprising an eighth chip-fixing portion, the eighth chip-fixing portion being electrically connected to a negative terminal of the driving chip.

30. The LED lighting strip according to claim 29, wherein the second LED lighting bead further comprises: a first transition lead and a second transition lead, a chip-fixing portion of the second transition lead and the eighth chip-fixing portion being integrally formed together as one piece.

31. The LED lighting strip according to claim 29, wherein the third chip-fixing portion or the fourth chip-fixing portion is provided with a single one or multiple ones of the dies; the dies are electrically connected by bonding lines to the driving chip; the dies are also electrically connected by bonding lines to the third chip-fixing portion, or alternatively, the dies are electrically connected to the third chip-fixing portion by means of bonding contact.

32. The LED lighting strip according to claim 31, wherein the third chip-fixing portion is provided with a green light chip and a red light chip arranged thereon, and the fourth chip-fixing portion is provided with a blue light chip arranged thereon;

wherein the green light chip is electrically connected by bonding lines to the third chip-fixing portion and the driving chip; the red light chip is electrically connected by a bonding line to the driving chip and is electrically connected to the third chip-fixing portion by means of bonding contact; the blue light chip is electrically connected by bonding lines to the driving chip and the third chip-fixing portion.

33. The LED lighting strip according to claim 31, wherein the blue light chip is arranged on the fourth chip-fixing portion at a location adjacent to the third chip-fixing portion, so that the blue light chip is close to the dies arranged on the third chip-fixing portion.

34. The LED lighting strip according to claim 29, wherein the eighth chip-fixing portion is provided with the driving chip arranged thereon, and an area of the eighth chip-fixing portion is which the driving chip is arranged extends among the third chip-fixing portion, the fourth chip-fixing portion, the fifth chip-fixing portion, and the sixth chip-fixing portion.

35. The LED lighting strip according to claim 7, wherein for the second LED lighting bead:

the third lead comprises a third chip-fixing portion, the fourth lead comprising a fourth chip-fixing portion, the third chip-fixing portion being connected to a signal input terminal of the driving chip, the fourth chip-fixing portion being connected to a signal output terminal of the driving chip;

the fifth lead comprises a fifth chip-fixing portion, the sixth lead comprising a sixth chip-fixing portion, a positive terminal of the driving chip being electrically connected to the fifth chip-fixing portion, the dies being connected to the fifth chip-fixing portion;

the eighth lead comprises an eighth chip-fixing portion, a negative terminal of the driving chip being electrically connected to the eighth chip-fixing portion.

36. The LED lighting strip according to claim 35, wherein the fifth chip-fixing portion is provided with a single one or multiple ones of the dies; the dies are electrically connected by bonding lines to the driving chip; the dies are electrically connected by bonding lines to the fifth chip-fixing portion, or alternatively, the dies are electrically connected to the fifth chip-fixing portion by means of bonding contact.

37. The LED lighting strip according to claim 36, wherein the fifth chip-fixing portion is provided with a green light chip and a red light chip; wherein the green light chip is electrically connected by bonding lines to the fifth chip-fixing portion and the driving chip; the red light chip is electrically connected by a bonding line to the driving chip and is electrically connected to the fifth chip-fixing portion by means of bonding contact.

38. The LED lighting strip according to claim 36, wherein the fifth chip-fixing portion at least comprises a third arrangement portion and a fourth arrangement portion that are arranged at intervals, the third arrangement portion configured to receive the green light chip and the red light chip to arrange thereon, the fourth arrangement portion configured to receive a bonding line connection point to dispose thereon.

39. The LED lighting strip according to claim 38, wherein the die arranged on the fourth chip-fixing portion comprises a blue light chip, and the blue light chip is arranged on the fourth chip-fixing portion at a location adjacent to the fifth chip-fixing portion, so that the blue light chip is close to the dies arranged on the fifth chip-fixing portion.

40. The LED lighting strip according to claim 35, wherein the eighth chip-fixing portion is provided with the driving chip, and an area of the eighth chip-fixing portion in which the driving chip is arranged is located between the fourth chip-fixing portion and the fifth chip-fixing portion.

41. The LED lighting strip according to claim 40, wherein the eighth chip-fixing portion comprises a third disposition portion and a fourth disposition portion that are arranged at intervals, the third disposition portion and the fourth disposition portion being connected, the third disposition portion configured to receive the driving chip to dispose thereon, the fourth disposition portion configured to receive a bonding line connection point to dispose thereon, a portion between the third disposition portion and the fourth disposition portion being a spacing area;

the fourth chip-fixing portion comprises a die disposition portion and a bonding line connection point disposition portion extending from the die disposition portion, the bonding line connection point disposition portion being extended to the spacing area.

42. The LED lighting strip according to claim 7, wherein the LED modules further comprise a third LED lighting bead, and for the third LED lighting bead:

the third lead comprises a third chip-fixing portion, the fourth lead comprising a fourth chip-fixing portion, a positive terminal of the driving chip being electrically connected to the third chip-fixing portion, a negative terminal of the driving chip being electrically connected to the fourth chip-fixing portion, the dies being electrically connected to the third chip-fixing portion;

the fifth lead comprises a fifth chip-fixing portion, the sixth lead comprising a sixth chip-fixing portion, the fifth chip-fixing portion being connected to a signal input terminal of the driving chip, the sixth chip-fixing portion being connected to a signal output terminal of the driving chip.

43. The LED lighting strip according to claim 42, wherein the third LED lighting bead further comprises a first transition lead and a second transition lead, a chip-fixing portion of the second transition lead and the fourth chip-fixing portion being integrally formed together as one piece.

44. The LED lighting strip according to claim 42, wherein the third chip-fixing portion or the fourth chip-fixing portion is provided with a single one or multiple ones of the dies; the dies are electrically connected by bonding lines to the driving chip; the dies are also electrically connected by bonding lines to the third chip-fixing portion, or alternatively, the dies are electrically connected to the third chip-fixing portion by means of bonding contact.

45. The LED lighting strip according to claim 44, wherein the third chip-fixing portion is provided with a green light chip and a red light chip, and the fourth chip-fixing portion is provided with a blue light chip;

wherein the green light chip is electrically connected by bonding lines to the third chip-fixing portion and the driving chip; the red light chip is electrically connected by a bonding line to the driving chip and is electrically connected to the third chip-fixing portion by means of bonding contact; the blue light chip is connected by bonding lines to the driving chip and the third chip-fixing portion.

46. The LED lighting strip according to claim 45, wherein the blue light chip is arranged on the fourth chip-fixing portion at a location adjacent to the third chip-fixing portion, so that the blue light chip is close to the dies arranged on the third chip-fixing portion.

47. The LED lighting strip according to claim 42, wherein the driving chip is arranged on the fourth chip-fixing portion, wherein a portion of the fourth chip-fixing portion on which the driving chip is arranged is located among the third chip-fixing portion, the fifth chip-fixing portion, and the sixth chip-fixing portion.

48. The LED lighting strip according to claim 7, wherein for the second LED lighting bead:

the third lead comprises a third chip-fixing portion, the fourth lead comprising a fourth chip-fixing portion, the third chip-fixing portion being connected to a signal input terminal of the driving chip, the fourth chip-fixing portion being connected toa signal output terminal of the driving chip;

the fifth lead comprises a fifth chip-fixing portion, the sixth lead comprising a sixth chip-fixing portion, a positive terminal of the driving chip being electrically connected to the fifth chip-fixing portion, a negative terminal of the driving chip being electrically connected to the sixth chip-fixing portion, the dies being electrically connected to the fifth chip-fixing portion; the connecting portions of the fifth lead and the sixth lead are both electrically connected to the second conductive line.

49. The LED lighting strip according to claim 48, wherein the fifth chip-fixing portion is provided with a single one or multiple ones of the dies; the dies are electrically connected by bonding lines to the driving chip; the dies are electrically connected by bonding lines to the fifth chip-fixing portion, or alternatively, the dies are electrically connected to the fifth chip-fixing portion by means of bonding contact.

50. The LED lighting strip according to claim 49, wherein the fifth chip-fixing portion is provided with a green light chip and a red light chip; wherein the green light chip is electrically connected by bonding lines to the fifth chip-fixing portion and the driving chip; the red light chip is electrically connected by a bonding line to the driving chip and is electrically connected to the fifth chip-fixing portion by means of bonding contact.

51. The LED lighting strip according to claim 50, wherein the fifth chip-fixing portion at least comprises a third arrangement portion and a fourth arrangement portion that are arranged at intervals, the third arrangement portion configured to receive the green light chip and the red light chip to arrange thereon, the fourth arrangement portion configured to receive a bonding line connection point to dispose thereon.

52. The LED lighting strip according to claim 51, wherein the die arranged on the fourth chip-fixing portion comprises a blue light chip, and the blue light chip is arranged on the fourth chip-fixing portion at a location adjacent to the fifth chip-fixing portion, so that the blue light chip is close to the dies arranged on the fifth chip-fixing portion.

53. The LED lighting strip according to claim 48, wherein the sixth chip-fixing portion is provided with the driving chip, and an area of the sixth chip-fixing portion in which the driving chip is arranged is located between the fourth chip-fixing portion and the fifth chip-fixing portion.

54. The LED lighting strip according to claim 53, wherein the sixth chip-fixing portion comprises a first disposition portion and a second disposition portion that are arranged at intervals, the first disposition portion and the second disposition portion being connected to each other, the first disposition portion configured to receive the driving chip to dispose thereon, the second disposition portion configured to receive a bonding line connection point to dispose thereon, a portion between the first disposition portion and the second disposition portion being a spacing area;

the fourth chip-fixing portion comprises a die disposition portion and a bonding line connection point disposition portion extending from the die disposition portion, the bonding line connection point disposition portion being extended to the spacing area.

* * * * *